(12) United States Patent
Sato et al.

(10) Patent No.: US 7,092,294 B2
(45) Date of Patent: Aug. 15, 2006

(54) NONVOLATILE SEMICONDUCTOR MEMORY

(75) Inventors: Atsuhiro Sato, Kanagawa (JP);
Yasuhiko Matsunaga, Kanagawa (JP);
Fumitaka Arai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/330,086

(22) Filed: Jan. 12, 2006

(65) Prior Publication Data

US 2006/0120155 A1 Jun. 8, 2006

Related U.S. Application Data

(63) Continuation of application No. 10/944,940, filed on Sep. 21, 2004, now Pat. No. 7,020,025.

(30) Foreign Application Priority Data

Sep. 22, 2003 (JP) .............................. 2003-330386

(51) Int. Cl.
*G11C 11/34* (2006.01)
(52) U.S. Cl. .............................. 365/185.27; 365/185.18
(58) Field of Classification Search ........... 365/185.27, 365/185.18
See application file for complete search history.

(56) References Cited

U.S. PATENT DOCUMENTS 6,459,612 B1   10/2002   Satoh et al.
6,567,310 B1   5/2003    Einaga et al.
6,580,644 B1   6/2003    Chung
6,801,458 B1   10/2004   Sakui et al.
6,804,150 B1   10/2004   Park et al.
6,819,592 B1*  11/2004   Noguchi et al. ....... 365/185.17
6,850,438 B1   2/2005    Lee et al.
6,894,931 B1   5/2005    Yaegashi et al.
2006/0028855 A1*  2/2006  Matsunaga et al. ......... 365/145

FOREIGN PATENT DOCUMENTS

JP   2000-228092   8/2000
JP   2002-260390   9/2002

* cited by examiner

*Primary Examiner*—Michael Tran
(74) *Attorney, Agent, or Firm*—Oblon, Spivak, McClelland, Maier & Neustadt, P.C.

(57) ABSTRACT

A semiconductor memory includes a memory cell array having a memory cell units, configured from memory cell transistors connected in a column, which have a first and a second control gate disposed on both sides of a floating gate horizontally arranged with a first end connected to a bit line via a first select-gate transistor, and a second end connected to a source line via a second select-gate transistor. The first and the second control gate of memory cell transistors arranged in the same row are connected in common to a first and a second control gate line in a row, respectively. It also includes a boosting circuit, which generates a write-in voltage, multilevel intermediate voltages, and a bit line voltage from a power source, and a row decoder supplied with the write-in voltage and the multilevel intermediate voltages to select the first and the second control gate.

7 Claims, 29 Drawing Sheets

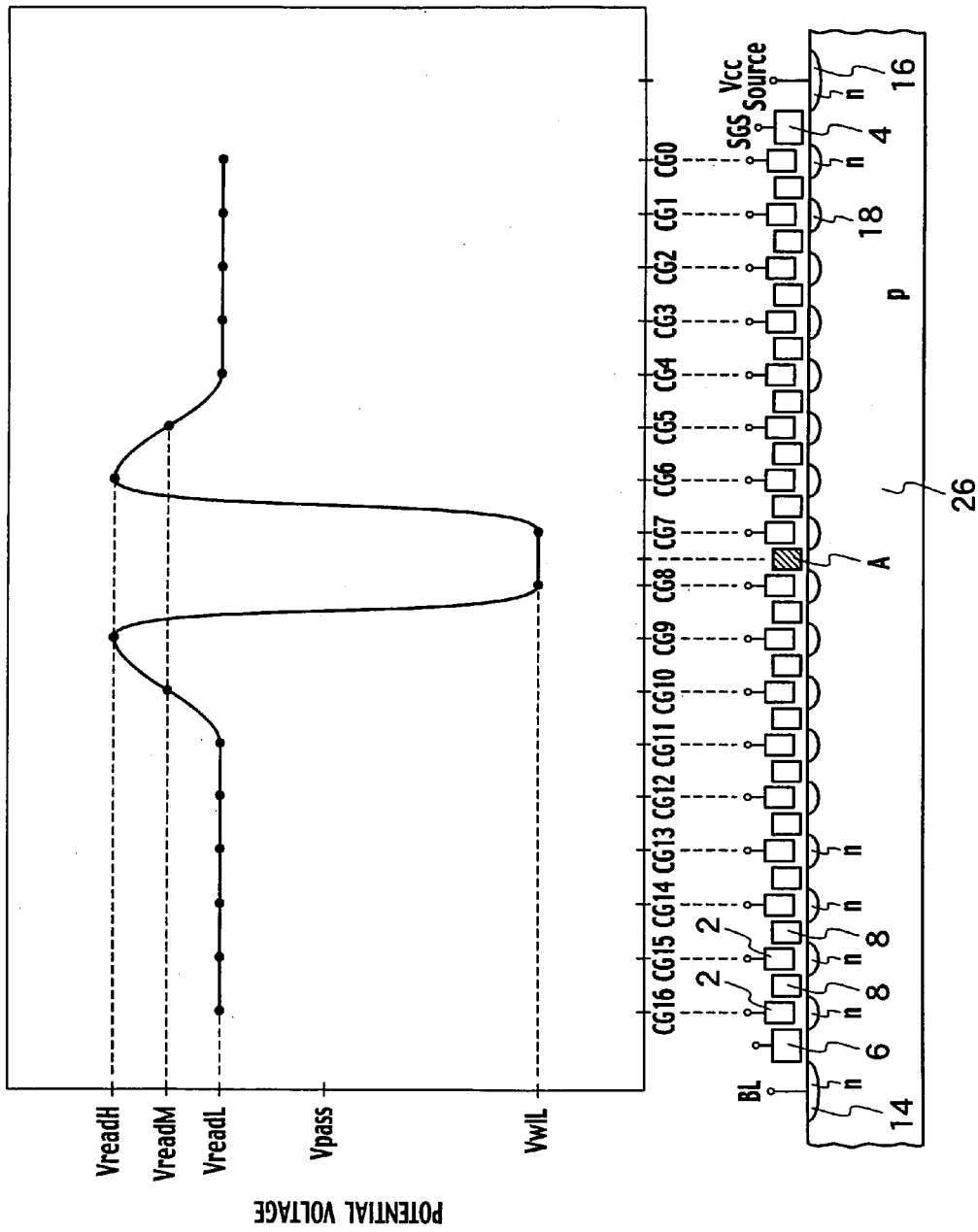

NONVOLATILE SEMICONDUCTOR MEMORY

CROSS REFERENCE TO RELATED APPLICATIONS

This application is a continuation of U.S. application Ser. No. 10/944,940 filed Sep. 21, 2004 now U.S. Pat. No. 7,020,025, and based upon and claims the benefit of priority from prior Japanese Patent applications P2003-330386 filed on Sep. 22, 2003; the entire contents of each of which are incorporated by reference herein.

BACKGROUND OF THE INVENTION

1. Field of the Invention

The present invention relates to a nonvolatile semiconductor memory with a sidewall control gate structure in which a single cell is written by applying the same high voltage pulse to two adjacent control gate lines in a cell array.

2. Description of the Related Art

Conventionally, a NAND flash EEPROM is known as an electrically erasable and highly-integrated nonvolatile semiconductor memory. A NAND flash EEPROM memory transistor, as shown in FIG. 1, has a stacked gate structure where diffusion layer regions 18, which become a source region or a drain region in a semiconductor substrate 26, are formed, and a control gate 2 and an electric charge accumulation layer, which is configured from a floating gate 8, are further stacked on the semiconductor substrate 26 via a first gate insulating film 30, which becomes a tunnel insulating film. A NAND memory cell unit is configured by connecting a plurality of memory transistors in series as shaped columns such that neighboring memory cell transistors share either a common source or a common drain region, and arranging select gate transistors at both sides of the columns of memory cell transistors. In FIG. 1, given that $C_{ono}$ denotes a capacitor between the control gate 2 and the floating gate 8, and $C_{ox}$ denotes a capacitor between the floating gate and the semiconductor substrate 26, when a control gate voltage $V_{cg}$ is applied to the control gate 2, a voltage $V_{fg}$ for the floating gate 8 is determined through capacitive coupling of $C_{ono}$ and $C_{ox}$ and is represented by the following equations:

$$V_{fg} = Cr \times (V_{cg} - V_t + V_{t0}) \quad (1)$$

$$Cr = C_{ono}/(C_{ono} + C_{ox}) \quad (2)$$

where, $V_t$ denotes a threshold voltage of memory cell transistors, and $V_{t0}$ denotes a threshold voltage (intermediate threshold voltage) when there are no electric charges in the floating gate 8.

Problems of a conventional memory cell transistor structure shown in FIG. 1 are described below. The greater the voltage $V_{fg}$ for the floating gate 8, the higher the voltage applied to the tunnel insulating film 30, and electron injection into the floating gate 8 easily occurs. It can be understood from Equation (1) that when voltage $V_{cg}$ to be applied to the control gate 2 is a constant, capacity ratio $Cr$ in Equation (2) should be large in order to increase the floating gate voltage $V_{fg}$. In other words, a greater $C_{ono}$ is needed relative to $C_{ox}$ in order to lower the write-in voltage. For example, increasing the capacitance between a booster plate and the floating gate allows development of a NAND EEPROM that is writable/erasable/readable with a low voltage (Japanese Patent Application Laid-open No. Hei 11-145429). In addition, increasing the coupling ratio of the floating gate to the control gate so as to decrease the write-in voltage allows development of a miniaturized nonvolatile memory (Japanese Patent Application Laid-open No. 2002-217318). A nonvolatile semiconductor memory using MOSFETs as memory elements, each having a floating gate on both sidewalls of the control gate and thereby improving write-in, erasure and read-out characteristics, has been developed (Japanese Patent Application Laid-open No. 2002-50703). Also, an AG-AND memory, which has an assisting gate arranged close to the floating gate, has been developed (Y. Sasago, et. al, "10-MB/s Multi-Level Programming of Gb-Scale Flash Memory Enabled by New AG-AND Cell Technology", Technical Digests of International Electron Devices Meeting, 2002 IEEE, 21.6.1, p. 952–954).

A memory cell array is configured by arranging NAND memory cell units in a matrix. NAND cell units arranged in a row are called a 'NAND cell block'. The gates of select gate transistors arranged in the same row are connected to the same select gate line, and the control gates of memory transistors arranged in the same row are connected to the same control gate line. When N memory transistors are connected in series in a NAND memory cell unit, N control gate lines are included in a single 'NAND cell block'.

The memory transistor nonvolatilely stores data defined by the charge accumulation state of the floating gate. Specifically, binary data storage is performed with, for example, higher voltages resulting from injecting electrons into a floating gate through a channel, than with a certain threshold voltage as data '0' and lower voltages resulting from discharging the electrons stored in the floating gate through the same channel as data '1'. Recently, a multilevel-valued storage method such as 4-valued storage has also been implemented by finer control of the threshold distribution.

When performing data write-in, the entire data stored in the NAND cell block is erased all at once. This is performed by setting all control gate lines (word lines) of the selected NAND cell block to a low voltage $V_{ss}$ (for example, 0V), applying a high positive voltage $V_{era}$ (erasure voltage, for example, 20V) to a p-well 26 containing the cell array, and discharging the floating gate electrons to the channel. Accordingly, all the data in the NAND cell block becomes data '1'. Not only can a NAND cell block be erased all at once, but so can an entire chip.

Writing data is performed all at once after the collective data erasure described above for a plurality of memory cell transistors connected to the selected control gate lines. The write-in unit is normally defined as one page; however recently, there are cases where a plurality of pages are allotted to a single control gate. The write-in order for the control gate lines in the NAND cell block may be an arbitrary order (random write-in) or an order in a certain single direction (sequential write-in). Sequential write-in is normally performed, in order, from the control gate line on the source side.

Applying a high positive voltage $V_{pgm}$ (a write-in voltage, for example, 20V) to the selected control gate line so as to write in control gate lines all at once allows execution of two types of simultaneous data write-in: in the case of data '0', electrons are injected from the channel to the floating gate 8 (namely, '0' write-in), and in the case of data '1', electron injection is restricted (namely, write-restricted, or '1' write-in). Implementing such control gate line collective write-in requires controlling the channel voltage for the memory cell transistor, depending on data. For example, in the case of data '0', the channel voltage is kept low, and when a write-in voltage $V_{pgm}$ is applied to the control gate 2, a corresponding large electric field is impressed on the gate insulating film 30 below the floating gate 8. On the other hand, in the case of data '1', electron injection to the floating gate 8 is restricted by boosting the channel voltage and decreasing the electric field that is impressed on the gate insulating film 30. At this time, if the boost in the channel voltage is insufficient, electron injection occurs and the threshold then fluctuates even with a '1' write-in memory transistor. This phenomenon is hereafter called 'erroneous write-in'. Implementing the write-in operation for a NAND flash EEPROM requires controlling the threshold fluctuation, due to an erroneous write-in, within the specified limits within which misoperations do not occur.

As methods for channel voltage control during write-in, a self-boosting (SB) write-in method (K. D. Suh, et. al, "A 3.3V 32 Mb NAND Flash Memory with Incremental Step Pulse Programming Scheme", IEEE JOURNAL OF SOLID-STATE CIRCUITS, VOL. 30. NO. 11, NOVEMBER 1995, p. 1149–1156), and a local self-boosting (LSB) method (Japanese Patent Application Laid-open No. Hei 8-279297) are known. In addition, an erasure area self-boosting (EASB) method has been proposed (Japanese Patent Application Laid-open No. Hei 10-283788). On the other hand, as a method of improving initial charging voltage, a channel voltage boosting method has been proposed, which increases the initial voltage by transferring a bit line voltage without decreasing below the threshold through temporarily boosting the voltage for the bit line (first end) side select gate line during initial voltage transfer (Japanese Patent Application Laid-open No. Hei 10-223866).

There are two types of stress that cause 'erroneous write-in': '$V_{pgm}$ stress' and '$V_{pass}$ stress'. The write-in restriction ('1' write-in) for unselected memory cell transistors, which are connected to a selected control gate line and to which a write-in voltage $V_{pgm}$ is applied, is performed by boosting the channel voltage for the unselected memory cell transistors through capacitive coupling with one or a plurality of unselected control gate lines. An intermediate voltage $V_{pass}$ is applied to all or a part of the unselected control gate lines for boosting the channel voltage. However, an erroneous write-in occurs if the intermediate voltage $V_{pass}$ is too small. This stress applied to the unselected memory cell transistors is called '$V_{pgm}$ stress'.

On the other hand, since the channel voltage for the unselected memory cell transistors in the NAND cell unit to which '0' write-in is to be performed is small, erroneous write-in occurs if the aforementioned intermediate voltage $V_{pass}$ is too large. This stress applied to the unselected memory cell transistors is called '$V_{pass}$ stress'.

There are two types of write-in order for the control gate lines in the NAND cell block: a random write-in method of writing in an arbitrary order regardless of control gate line location, and a sequential write-in method of writing in order from, for example, the source line SL side control gate line. Recently, however, there is a tendency to use the latter sequential write-in method. In the case of the sequential write-in method, all of the selected memory cell transistors and the unselected memory cell transistors closer to the bit line BL side are in an erased state, which greatly influences the erroneous write-in characteristics.

In order to reduce the $V_{pgm}$ stress, several channel voltage control methods have been proposed. The conventional methods have been proposed from the perspective of how to increase the efficiency in boosting the channel voltage; however, these attempts are reaching a limitation, and improving boost efficiency is becoming difficult.

In a conventional NAND flash EEPROM, the intermediate voltage $V_{pass}$, which is an intermediate voltage between a cut-off voltage $V_{cutoff}$ (=0V) and a high write-in voltage $V_{pgm}$, is applied to boost the diffusion layer regions 18 of memory cell transistors during '1' write-in. Write-in characteristics for cells to which '1' write-in is to be performed improve as the intermediate voltage $V_{pass}$ for boosting the diffusion layer regions 18 increases. However, when considering '0' write-in, since the voltage to be applied to cells other than the write-in cells in the NAND cell increases by increasing the intermediate voltage $V_{pass}$, a defect occurs where a cell to which '1' write-in has already been performed changes as if a '0' write-in was performed. Boosting the diffusion layer regions 18 necessary for '1' write-in while lowering the value of the intermediate voltage $V_{pass}$ is preferable.

SUMMARY OF THE INVENTION

An aspect of the present invention inheres in a semiconductor memory including a memory cell array having a plurality of memory cell units, each being configured from a plurality of memory cell, transistors vertically connected in series, which have a first and a second control gate disposed on both sides of a floating gate, and which are horizontally arranged with a first end connected to a bit line via a first select gate transistor. A second end is connected to a source line via a second select gate transistor. The first and the second control gate of memory cell transistors arranged in the same row are connected in common to a first and a second control gate line, respectively. A boosting circuit is provided, which generates a write-in voltage, different multilevel intermediate voltages, and a bit line voltage from a power source. A row decoder is also provided, which is supplied with the write-in voltage and the multilevel intermediate voltages to select the first and the second control gate line configured to select a first and a second select gate line connected to the respective gates of the first and the second select gate transistor.

BRIEF DESCRIPTION OF DRAWINGS

FIG. 21A illustrates a first voltage application method for a nonvolatile semiconductor memory of a twelfth embodiment of the present invention, which is used for a write-in method of writing in a single memory cell transistor A that includes the step of applying the same high voltage pulse to two adjacent control gate lines in a memory cell array so as to write in;

FIG. 21B is a cross-sectional device diagram corresponding to FIG. 21A;

FIG. 22A illustrates a second voltage application method for a nonvolatile semiconductor memory according to a thirteenth embodiment of the present invention, which is used for a write-in method of writing in a single memory cell transistor A that includes the step of applying the same high voltage pulse to two adjacent control gates in a memory cell array so as to write in;

FIG. 22B is a cross-sectional device diagram corresponding to FIG. 22A;

FIG. 23A illustrates a third voltage application method for a nonvolatile semiconductor memory according to a fourteenth embodiment of the present invention, which is used for a write-in method of writing in a single memory cell transistor A that includes the step of applying the same high voltage pulse to two adjacent control gates in a memory cell array so as to write in;

FIG. 24A illustrates a fourth voltage application method for a nonvolatile semiconductor memory according to a fifteenth embodiment of the present invention, which is used for a write-in method of writing in a single memory cell transistor A that includes the step of applying the same high voltage pulse to two adjacent control gates in a memory cell array so as to write in;

FIG. 24B is a cross-sectional device diagram corresponding to FIG. 24A;

FIG. 25A illustrates a first voltage application method for a nonvolatile semiconductor memory according to a sixteenth embodiment of the present invention, which is used for a read-out method of reading out a single memory cell transistor A that includes the step of applying the same high voltage pulse to two adjacent control gates in a memory cell array so as to read out;

FIG. 25B is a cross-sectional device diagram corresponding to FIG. 25A;

DETAILED DESCRIPTION OF THE INVENTION

Figure 1:
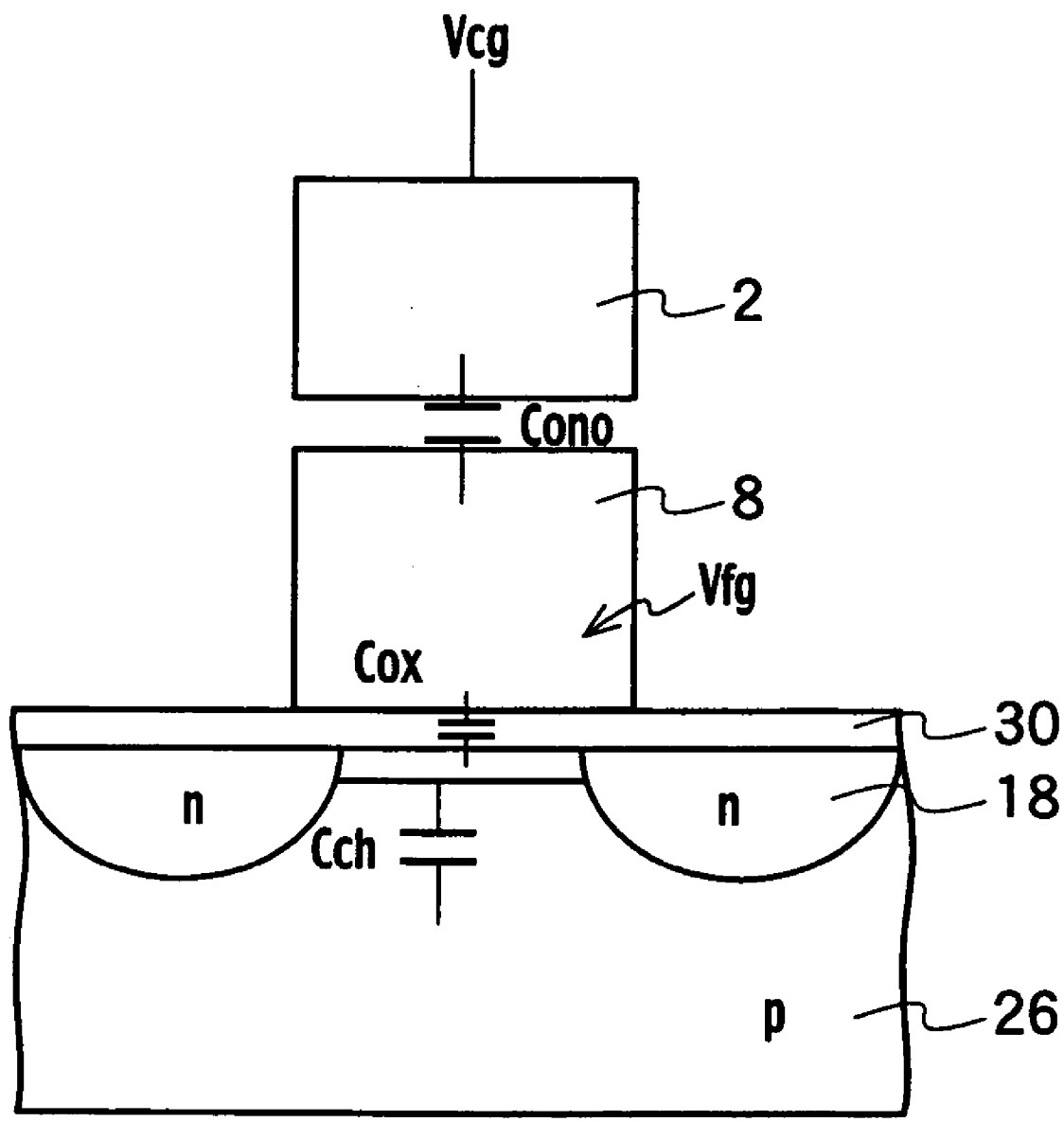
FIG. 1 is a schematic cross-sectional diagram of a memory cell transistor having a conventional stacked gate structure.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, and as is conventional in the representation of circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order to not obscure the present invention with unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

Embodiments of the present invention provide a nonvolatile semiconductor memory, which is configured from memory cell transistors having a sidewall control gate structure and can efficiently write, read, and erase by applying the same high voltage pulse to two adjacent control gate lines in a cell array when writing data in a single memory cell transistor, reading the data out from the same, or erasing the data from the same. When writing in a single memory cell transistor, usage of a NAND flash EEPROM, which is written by applying the same high voltage pulse to two adjacent control gate lines in a memory cell array, allows use of a low $V_{pass}$ voltage.

The nonvolatile semiconductor memory, in which memory cell transistors having a sidewall control gate structure configure NAND cell units, performs a write-in operation or a read-out operation by applying the same high voltage pulse to two adjacent control gates in a memory cell array, or performs a block erasure operation or a page erasure operation, and operates efficiently at a low voltage.

Embodiments of the present invention are described forthwith while referencing the drawings. The same or similar symbols are applied to the same or similar parts throughout the appended drawings. In addition, the embodiments given forthwith illustrate devices and methods for embodying the technical idea of the present invention, and that technical idea of the present invention is not limited to the following. The technical idea of the present invention may be modified within the scope of the appended claims.

FIRST EMBODIMENT

A basic structure of a nonvolatile semiconductor memory according to a first embodiment of the present invention is described.

(Basic Structure)

Figure 2:
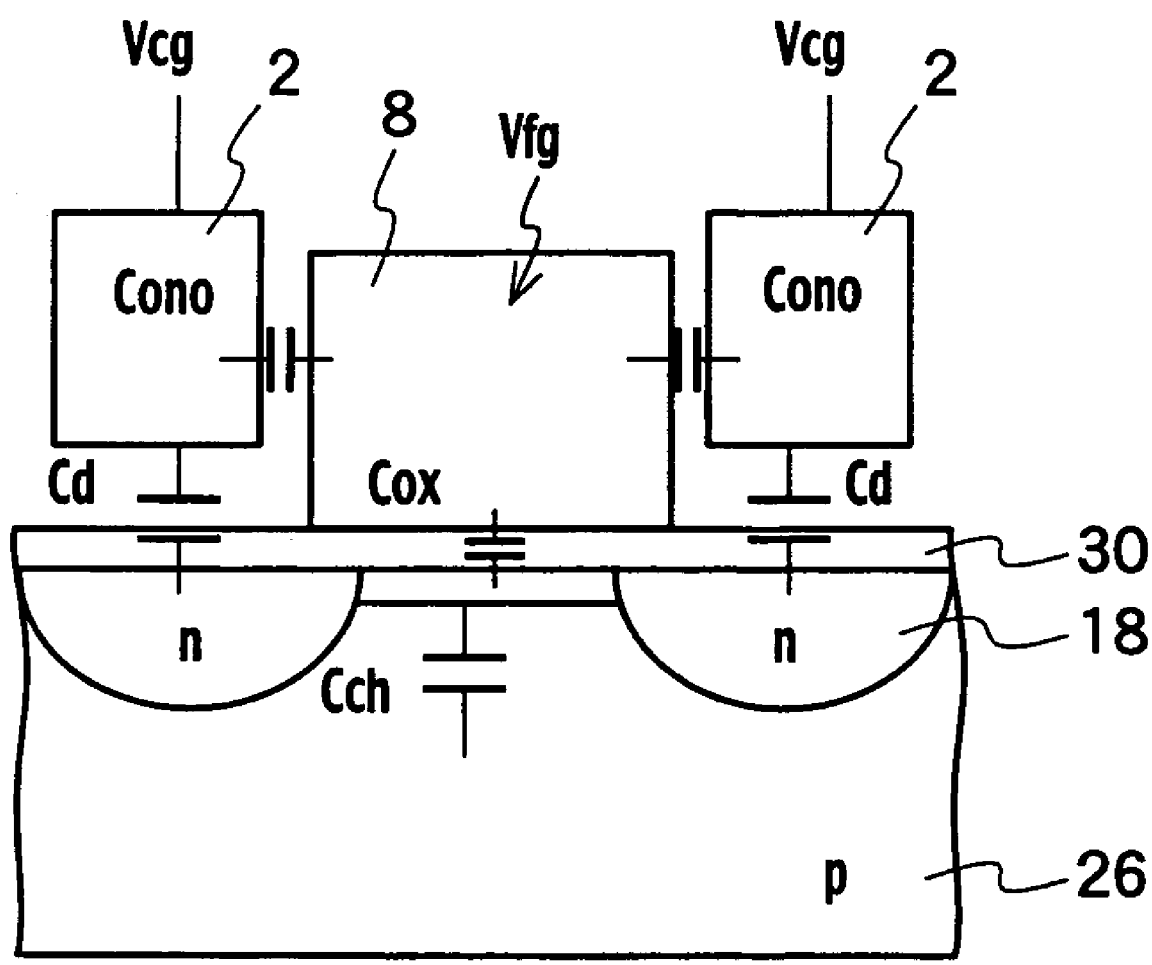
FIG. 2 shows a basic structure of a memory cell transistor of a nonvolatile semiconductor memory according to the present invention, and is a schematic cross-sectional diagram of a sidewall control structure.

The basic structure of the memory cell transistors of the nonvolatile semiconductor memory according to the first embodiment of the present invention, as shown in FIG. 2, includes diffusion layer regions 18, which become a source region or a drain region formed in a semiconductor substrate 26, a first gate insulating film 30, which is formed on the semiconductor substrate 26, a floating gate 8, which is formed on a channel region sandwiched between the diffusion layer regions 18 via the first gate insulating film 30, and first and second control gates 2, which are formed facing the diffusion layer regions 18, and adjacent to two sidewalls of the floating gate 8 via interlayer insulating films 40. The memory cell transistor shown in FIG. 2, in contrast to the 'stacked structure' shown in FIG. 1, is called a 'sidewall control gate structure' since the control gates 2 are formed at the sidewalls of the floating gate 8. The sidewall control gate structure allows reduction in the parasitic capacitance around the floating gate 8, reduction in a write-in voltage $V_{pgm}$ by increasing the capacitance between the control gates 2 and the floating gate 8, and implementation of a highly-integrated, high-speed nonvolatile semiconductor memory.

Figure 3A:
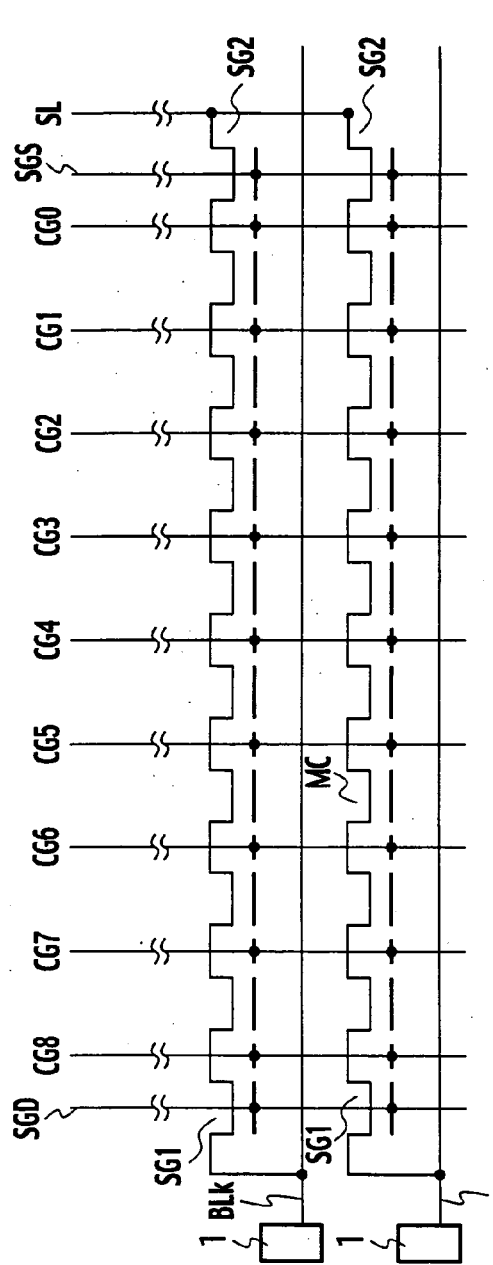
FIG. 3A is a schematic circuit diagram of a nonvolatile semiconductor memory according to a first embodiment of the present invention.
Figure 3B:
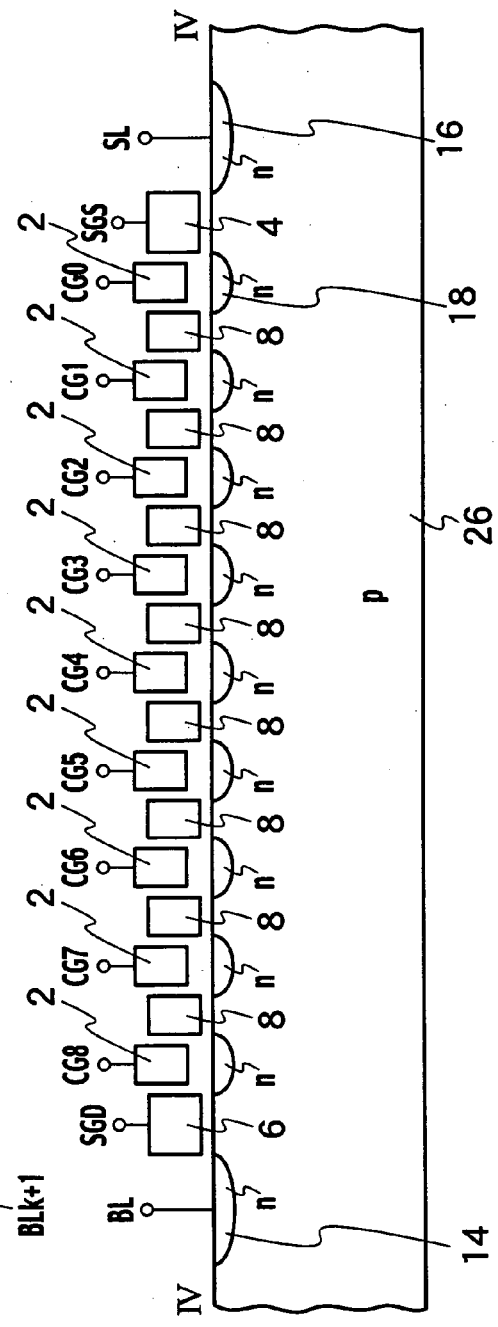
FIG. 3B is a schematic cross-sectional device diagram cut along the line IV—IV in FIG. 4B and corresponds to FIG. 3A.

The nonvolatile semiconductor memory according to the first embodiment of the present invention has circuitry and a cross-sectional device configuration as shown in FIGS. 3A and 3B. Memory cell transistors MC have a sidewall control gate structure where both sides of each floating gate (FG) 8 are sandwiched between control gates (CG) 2. Each control gate 8 is connected to a control gate line CG0 to CG8, respectively, as shown in FIG. 3A. Such memory cell transistors MC are connected in series so as to configure each NAND memory cell column. Each NAND memory cell column has a select gate transistor SG1 between a bit line BLk or BLk+1, and a single select gate line SGD connected in parallel with the control gate lines CG0 to CG8. Furthermore, a select gate transistor SG2 is disposed between such memory cell column and a source line SL, and a single select gate line SGS is connected in parallel with the control gate lines CG0 to CG8. Each memory cell column is connected to the bit line BLk or BLk+1 via the adjacent select gate transistor SG1 and is connected to control gate line CG8. Similarly, such memory cell column is connected to the source line SL via the select gate transistor SG2 that is adjacent and connected to the control gate line CG0. The select gate lines SGD and SGS are connected to the respective gates of the select gate transistors SG1 and SG2. As is apparent from FIG. 3A, two NAND memory cell columns are connected via the bit line side select gate transistors SG1 to separate bit lines BLk and BLk+1, respectively, and have bit line contacts CB for the bit lines, respectively. As is shown in FIG. 3B, the bit line BL side of each NAND memory cell column is connected to a bit line contact region 14 via the select gate line SGD connected to a select gate 6 of the bit line side select gate transistor SG1, and the source line SL side of each NAND memory cell transistor column is connected to a source line contact region 16 via the select gate line SGS connected to a select gate 4 of the source line (second end) side select gate transistor SG2. Regarding the memory cell transistor column, a configuration including such source side select gate transistor SG1 and the bit line side select gate transistor SG2 is called a 'memory cell unit'.

The structure in FIG. 3A can be called a 'NAND memory cell unit' since each memory cell transistor-column has NAND memory cell transistors connected in series. Accordingly, the circuitry of FIG. 3A has a configuration with two columns of NAND memory cell units as illustrated.

Figure 4A:
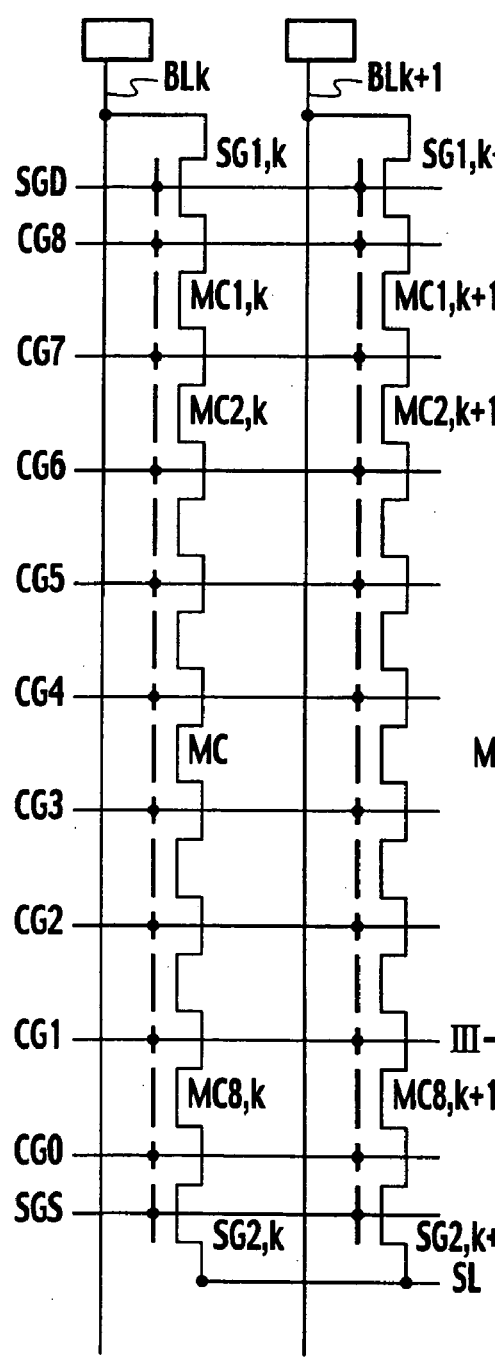
FIG. 4A is a schematic circuit diagram of the nonvolatile semiconductor memory according to the first embodiment of the present invention.
Figure 4B:
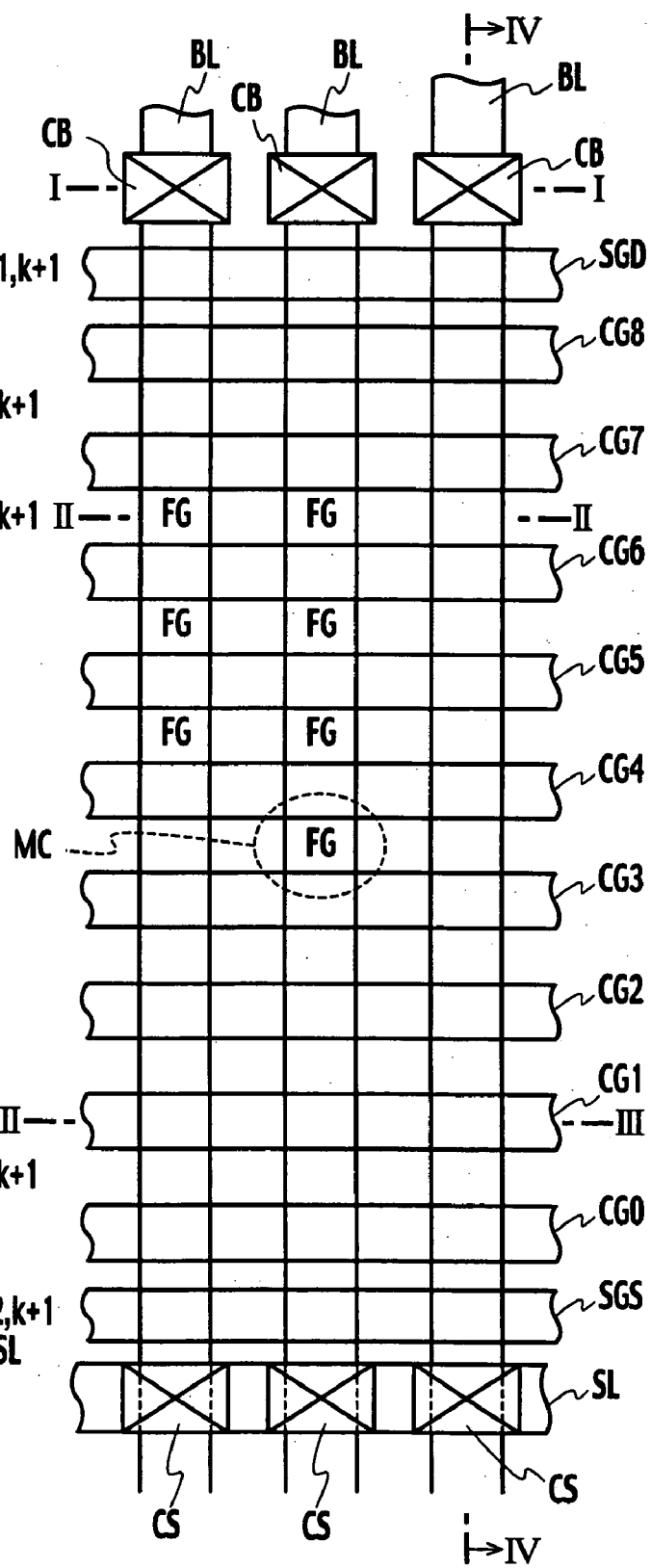
FIG. 4B is an aerial view of a schematic device pattern corresponding to FIG. 4A.

The structure in FIG. 3B corresponds to a schematic cross-sectional configuration of a single NAND memory cell unit within the circuitry of FIG. 3A, as well as representing a schematic cross-sectional configuration cut along the line IV—IV in the aerial view of a layout pattern of FIG. 4B hereafter described. N-type diffusion layer regions 18 formed in a p-well or silicon semiconductor substrate 26 are the source and the drain regions of the memory cell transistors, and the floating gates (FG) 8 are formed and arranged via the first insulating film 30 above respective channel regions, each being sandwiched between a source and a drain region.

An example with a single bit line side select gate line (SGD) and a single source side select gate line (SGS) is given with the example described above; however, the present invention is not limited thereto, and there may be two or more bit line side select gate lines. The source side select gate line is also not limited to one, but may be two or more.

Figure 5A:
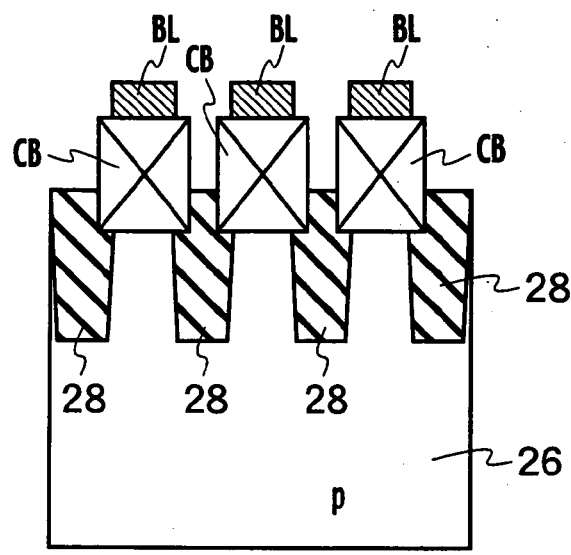
FIG. 5A is a schematic cross-sectional device diagram of the nonvolatile semiconductor memory according to the first embodiment of the present invention, and is a cross-sectional device diagram cut along the line I—I in FIG. 4B.
Figure 5B:
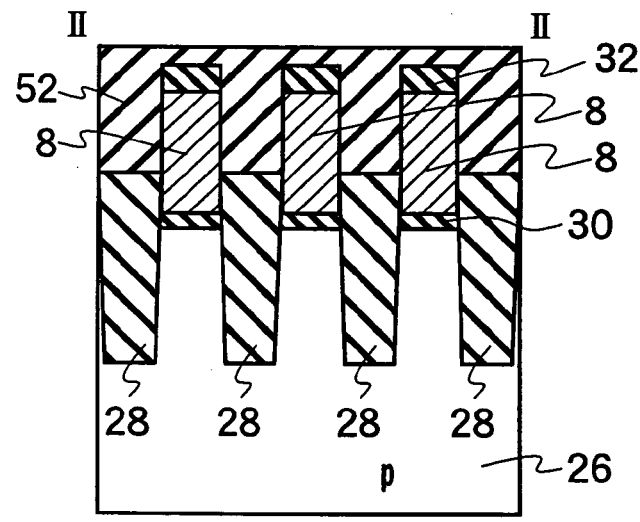
FIG. 5B is a cross-sectional device diagram cut along the line II—II in FIG. 4B.
Figure 5C:
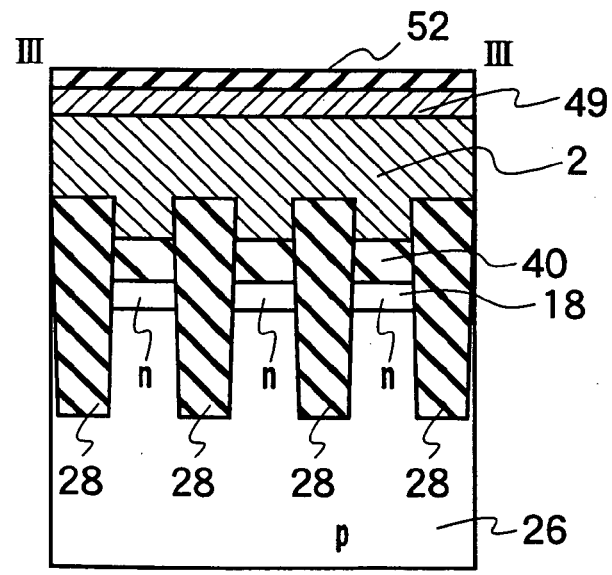
FIG. 5C is a schematic cross-sectional diagram cut along the line III—III of FIG. 4B.

FIGS. 4A and 4B are a schematic circuit diagram and an aerial view of a schematic layout pattern of the nonvolatile semiconductor memory according to the first embodiment of the present invention. FIGS. 4A and 4B are depicted as corresponding to each other with each NAND memory cell unit has a single bit line contact CB, and each NAND memory cell unit is accordingly arranged with a single bit line BLk. The device cross-sectional structures cut along the lines I—I, II—II and III—III of FIG. 4B are as shown in FIGS. 5A, 5B, and 5C, respectively. Furthermore, the device cross-sectional structure cut along the line IV—IV is as schematically shown in FIG. 3B. As is apparent from FIG. 5A, a bit line contact CB is arranged for each bit line. It should be noted that use of a circuit format in which two NAND memory cell units share a single bit line allows reduction in the number of bit line contacts CB, and provides sufficient space between the bit line contacts CB. Particularly with a minute nonvolatile semiconductor memory, the distances between contact holes are very small due to the arrangement of the bit line contacts CB, and circuitry in which two NAND memory cell units share a single bit line may be employed.

The cross-sectional structure cut along the line II—II of FIG. 4B is a cross-sectional structure of part of the floating gates (FG) 8, as is apparent from FIG. 5B. The floating gates (FG) 8 are formed on the first gate insulating film 30, which acts as a tunnel gate insulating film. Channel regions exist within the p-well 26, however, the channel regions are formed sandwiched between device isolating regions 28. A second insulating film 32 is formed on each floating gate (FG) 8. Further, a fourth insulating layer 52 covers the entirety.

The cross-sectional structure cut along the line III—III of FIG. 4B is a cross-sectional structure of part of a control gate (CG) 2, as is apparent from FIG. 5C. The control gate (CG) 2 is formed on third insulating films 40, which act as inter-gate insulating films. The n-type diffusion layer regions 18 are the source and the drain region of each memory cell transistor, and are formed sandwiched between the device isolating regions 28. A metal salicide film 49 is formed on the control gate (CG) 2, and, the fourth insulating layer 52 covers the entirety of the foregoing structure. The inter-gate insulating films 40, formed at the sidewalls of the floating gates 8 in FIG. 5C, are omitted for simplification of description. Furthermore, the source line contacts CS shown in FIG. 4B are electrically connected in common to the source line SL.

Figure 6:
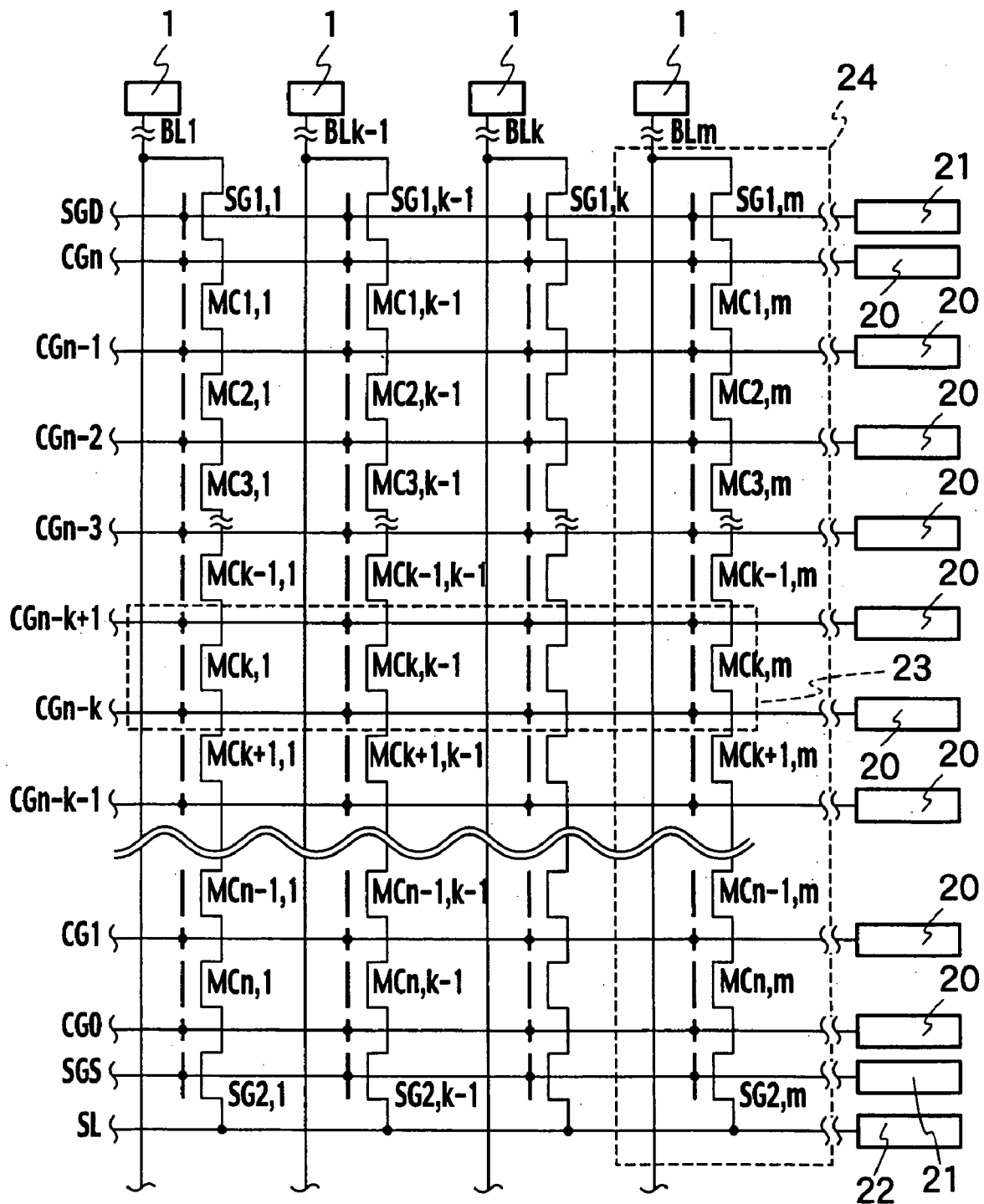
FIG. 6 is a schematic matrix circuit diagram of the nonvolatile semiconductor memory according to the first embodiment of the present invention.

A matrix circuitry of the nonvolatile semiconductor memory according to the first embodiment of the present invention, as shown in, for example, FIG. 6 is configured with horizontally arranged a plurality of NAND memory cell units 24, control gate lines CG0 to CGn, the select gate lines SGD and SGS, bit lines BL1, . . . , BLk-1, BLk, . . . , BLm, the source line SL, bit line drive circuits 1, control gate line drive circuits 20, select gate line drive circuits 21, and a source line drive circuit 22. Each of the NAND memory cell units 24 in the example of FIG. 6 includes n memory cell transistors connected in series, a single bit line side select gate transistor SG1, m that includes the select gate line SGD located adjacent to the control gate line CGn, and a single source line side select gate transistor SG2, m that includes the select gate line SGS adjacent to the control gate line CG0, and is connected to the bit line BLm and the source line SL via the above select gate transistors. Furthermore, in FIG. 6, a single row of memory cell transistors equivalent to one page in a page mode can be defined by all memory cell transistors 23, which are sandwiched between, for example, two control gate lines CGn-k+1 and CGn-k.

FIG. 6 is further described in detail. A NAND memory cell transistor column (NAND string) is configured by connecting, in series, n memory cell transistors MC1, 1 to MCn, 1. Further, at the ends of such NAND memory cell transistor column (NAND string), a bit line side select gate transistor SG1, 1 is connected on the bit line BL1 side, and a source line side select gate transistor SG2, 1 is connected on the source line side, coupling the NAND string to each of the bit line BL1 and the source line SL. The configuration including the select gate transistors SG1, 1 to SG2, 1 is a NAND memory cell unit as described above. Similarly, n memory cell transistors MC1, k-1 to MCn, k-1 are connected in series so as to configure a NAND string, and further, at the ends of this NAND string, a bit line side select gate transistor SG1, k-1 is connected on the bit line BLk-1 side, and a source line side select gate transistor SG2, k-1 is connected on the source line side, and the NAND string is coupled to the bit line BLk-1 and the source line SL. A select gate line SGS is connected in common to the gates of the source side select transistors SG2, 1, SG2, k-1, SG2, k and SG2, m, and a select gate line SGD is connected in common to the gates of the source side select transistors SG1, 1, SG1, k-1, SG1, k and SG1, m. A NAND string is selected using these select gate lines SGD and SGS. Control gate lines CGn, CGn-1, . . . , CGn-k+1, CGn-k, CGn-k-1, . . . , CG1 and CG0 are connected in common to the control gate 2, which is formed at the sidewalls of respective floating gates 8 of the n memory cell transistors MC1, 1 to MCn, 1, n memory cell transistors MC1, k-1 to MCn, k-1, n memory cell transistors MC1, k to MCn, k, and n memory cell transistors MC1, m to MCn, m. Furthermore, the bit line drive circuits 1 are connected to the bit lines BL1, . . . , BLk-1, BLk, . . . , BLm, respectively; the control gate line drive circuits 20 are connected to the control gate lines CGn, CGn-1, . . . , CGn-k+1, CGn-k, CGn-k-1, . . . , CG1 and CG0, respectively; the select gate line drive circuits 21 are connected to the select gate lines SGD and SGS, respectively; and the source line drive circuit 22 is connected to the source line SL. FIG. 6 shows four NAND strings, however, a plurality thereof may be further arranged along the extension of the bit lines and the control gate lines.

Figure 7:
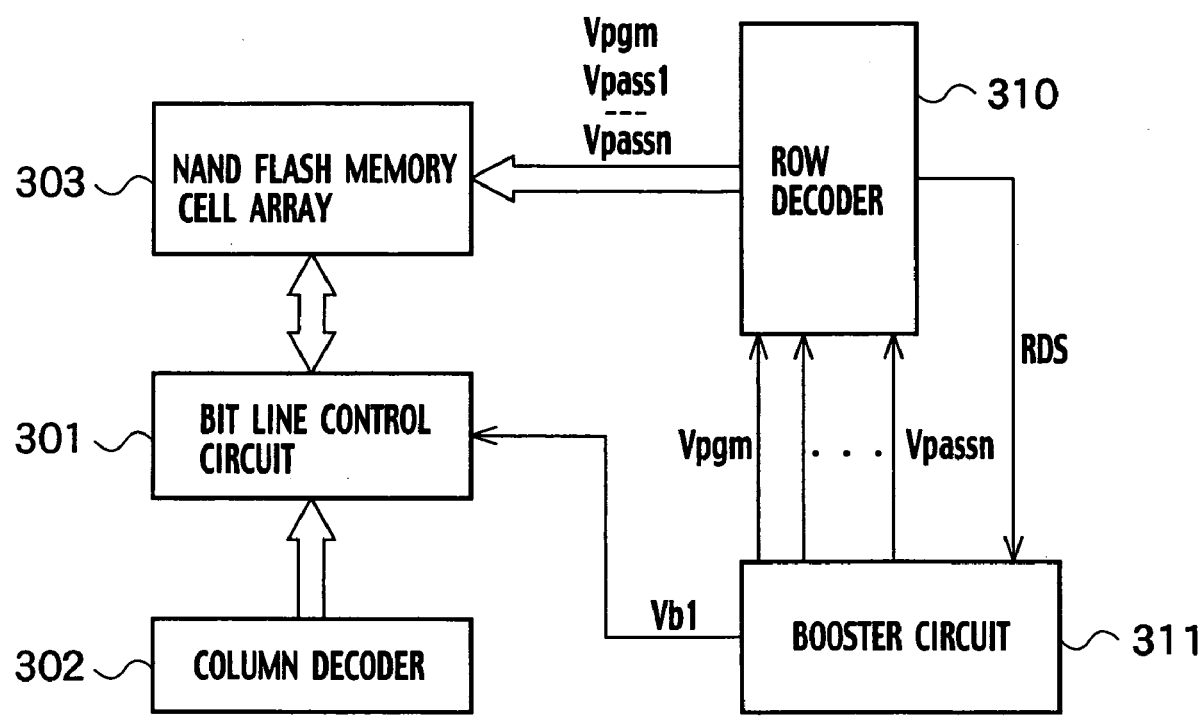
FIG. 7 is a system block diagram of the nonvolatile semiconductor memory according to the first embodiment of the present invention.

The system block structure of the nonvolatile semiconductor memory according to the first embodiment of the present invention as shown in FIG. 7 is configured with a NAND flash memory array 303, a bit line control circuit 301, a, row decoder 310, a column decoder 302, and a booster circuit 311. The nonvolatile semiconductor memory described with FIG. 6 may be applied to the NAND flash memory array 303. In other words, in the NAND flash memory cell array 303, NAND memory cell units with a sidewall control gate structure are vertically and horizontally arranged in a matrix, and the control gate lines CG0 to CGn in a row direction, the bit lines BL1, . . . , BLk−1, BLk, . . . , BLm in a column direction, the select gate lines SGD and SGS in a row direction, and the source line SL in a row direction are disposed. The bit line control circuit 301 and the row decoder 310 are connected to the NAND flash memory cell array 303. The bit line control circuit 301 latches write-in data and performs a sensing operation during read-out. The column decoder 302, which decodes a column address signal so as to select a NAND cell unit column, is connected to the bit line control circuit 301. The booster circuit 311 generates write-in voltage $V_{pgm}$, different multilevel intermediate voltages $V_{pass1}$ to $V_{passn}$, and bit line voltage $V_{bl}$ and the like from a power supply voltage. The row decoder 310 supplies control signal RDS to the booster circuit 311, and receives a write-in voltage $V_{pgm}$ and intermediate voltages $V_{pass1}$ to $V_{passn}$. It should be noted that the multilevel intermediate voltages $V_{pass1}$ to $V_{passn}$ are used in the write-in, read-out and erasure operations for the non-volatile semiconductor-memory according to the embodiments of the present invention, and are mainly voltages to be applied to the control gates CG0 to CGn, respectively. The row decoder 310 decodes a row address signal, and based on the voltage supplied from the booster circuit 311, outputs the decoded signals, such as write-in voltage $V_{pgm}$, which is used to select a memory cell transistor in the NAND flash memory cell array 303, intermediate voltages $V_{pass1}$ to $V_{passn}$, voltage $V_{sgs}$ to be applied to the select gate line SGS, voltage $V_{sgd}$ to be applied to the select gate line SGD, and voltage $V_{sl}$ to be applied to the source line SL. Accordingly, word lines and select gate lines in the NAND flash memory cell array 303 are selected. Furthermore, the bit line control circuit 301 receives the bit line voltage $V_{bl}$ from the booster circuit 311, supplying the bit line voltage $V_{bl}$ to a NAND cell unit column selected by the column decoder 302. It should be noted that only the minimum circuit configuration is shown in FIG. 7, where an address buffer, a data input/output buffer, and a timing generation circuit and the like are also necessary, however, descriptions thereof are omitted.

In the case of write-in, the booster circuit 311 generates voltages such as write-in voltage $V_{pgm}$, intermediate voltages $V_{pass1}$ to $V_{passn}$, and bit line voltage $V_{bl}$ from the power supply voltage. These voltages are applied to the control gate lines CG0 to CGn, the select gate lines SGD and SGS, and the source line SL of a selected block via the row decoder 310, so as to write in to the control gate line CG of the selected sidewall control gate memory cell transistor. Focusing on the voltage applied to the control gate line CG, a write-in voltage $V_{pgm}$ is applied to the control gate lines on both sides of the selected sidewall control gate-type memory cell transistor, and different intermediate voltages $V_{pass}$ are applied to the unselected control gate lines, thereby reducing a weak write-in stress in the unselected control gate lines due to intermediate voltage $V_{pass}$.

SECOND EMBODIMENT

An SB write-in method for a nonvolatile semiconductor memory according to a second embodiment of the present invention is described.

(SB Write-In Method)

The SB write-in method for NAND flash EEPROM with, for example, NAND cells configured by connecting eight memory cell transistors in series, each cell being written by applying the same high voltage pulse to two adjacent control gates in a cell array, is described.

Figure 8:
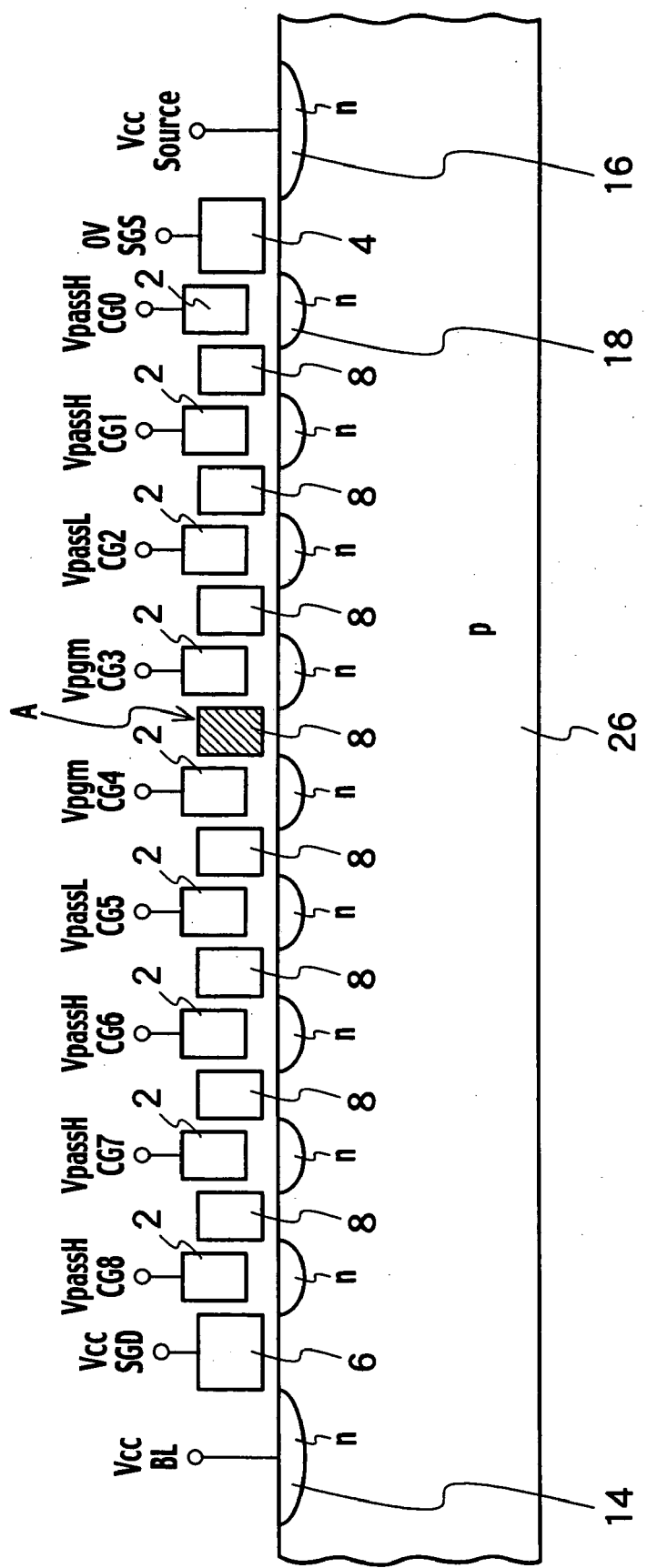
FIG. 8 is a schematic cross-sectional diagram for describing an SB write-in method for a nonvolatile semiconductor memory according to a second embodiment of the present invention.

The SB write-in method is the most typical method for channel voltage control during write-in, which includes the steps of making the entire channel regions in the NAND memory cell unit enter a floating state in the case of data '1' write-in and then boosting the channel voltages through capacitive coupling from the control gate lines. The SB method according to the second embodiment of the present invention is described in detail forthwith. FIG. 8 schematically represents a device cross-sectional structure of a single NAND string sandwiched between the bit line BL and the source line SL. FIG. 8 shows bias conditions for the SB write-in method for the nonvolatile semiconductor memory according to the second embodiment of the present invention when n=8 in FIG. 6. Namely, a bias relationship given to the control gate lines CG0, CG1, CG2, CG3, CG4, CG5, CG6, CG7, CG8 and CG9, the select gate lines SGD and SGS, the source line SL, and the bit line BL are shown in FIG. 8. A bit line contact area 14 and a source line contact area 16 are formed in the semiconductor substrate 26, and eight memory cell transistors are formed with a source and a drain region connected in series in the diffusion layer region 18. The SB write-in method, as mentioned earlier, is a method for channel voltage control during write-in, which includes the steps of making the entire channel regions in the NAND cell unit enter a floating state in the case of data '1' write-in and then boosting channel voltages $V_{ch}$ through capacitive coupling from the control gates CG. Accordingly, the channel regions during '1' write-in based on the SB method enter a floating state. In FIG. 8, the channel regions of the select gate transistors SG2 and SG1 corresponding to the select gates 4 and 6 are cut off, and the diffusion layer region 18 and the channel region of the memory cell transistor portion is electrically insulated from the bit line BL and the source line SL.

In FIG. 8, the floating gate sandwiched between the control gate line CGi and the control gate line CGj is referred to as 'FGi, j'. In addition, the number of control gate lines is not limited to nine, as shown in FIG. 8. There may be seventeen, thirty-three, sixty-five, or one-hundred twenty-nine lines, for example.

Voltages Vbl1 and Vbl2 are applied to the bit line BL in conformity with data '0' and data '1', respectively, before applying a write-in voltage $V_{pgm}$ to the control gate line CG. The value of 0V, for example, may be use as $V_{bl1}$, and 1.2 to 4.0 V, for example, may be used as $V_{bl2}$. The bit line side select gate transistor SGD must be turned on for transferring the bit line voltage $V_{bl1}$ for a '0' write-in NAND cell unit, and the bit line side select gate 6 must be made to automatically turn off during channel voltage boost for a '1' write-in NAND cell unit.

In other words, the bit line side select gate line SGD is applied a gate voltage $V_{sgd}$ satisfying $V_{th\_sgd}(0) < V_{sgd} < V_{bl2} + V_{th\_sgd}(V_{bl2})$ (where, $V_{th\_sgd}$ denotes the threshold voltage of the bit line side select gate 6, and the terms within the parenthesis denotes the back bias voltage to be applied to the source of the bit line side select gate transistor). Typically, the same value as that given to the '1' write-in bit line voltage ($V_{bl2}$ in this case) is often given to $V_{sgd}$. The source side select gate line SGS is applied a voltage $V_{sgs}$ (for example, 0V) that cuts off conduction of the source side select gate transistors SG2.1 and SG2, k−1, SG2, k and SG2, m. Subsequently, as shown in FIG. 8, the same high write-in voltage $V_{pgm}$ is applied to the control gate lines CG3 and CG4 adjacent to a memory cell transistor A by which write-in is performed, and an intermediate voltage $V_{pass}$ (for example, 10V) that is less than $V_{pgm}$ is applied to the other unselected control gate lines CG0 to CG2, and CG5 to CG8. For example, as a voltage application method in this SB write-in method, as shown in FIG. 8, a voltage $V_{passL}$ is applied to the control gate lines CG2 and CG5 adjacent to the control gate lines CG3 and CG4, respectively, a voltage $V_{passH}$ is applied to the control gate lines CG1 and CG6 adjacent to the control gate lines CG2 and CG5, respectively, to the control gate lines CG0 and CG7 adjacent to the control gate lines CG1 and CG6, respectively, and to the control gate line CG8 adjacent to the control gate line CG7.

The channel voltage for the '0' write-in NAND cell unit is fixed at $V_{bl1}$ so that a corresponding large electric field is applied to the gate insulating film of a selected memory transistor, and electrons are then injected to corresponding floating gate 8 due to the tunneling effect. Furthermore, with '1' write-in, by two select gate transistors SG1 and SG2 at both sides of the NAND cell unit being in a cut-off state, the channels and diffusion layer regions 18 of all memory transistors shown in FIG. 8 are serially connected, and thus enter a floating state. Accordingly, the voltage for the channels and the diffusion layer regions 18 is boosted to a specified channel voltage $V_{ch}$ due to capacitive coupling with the control gate lines CG, thereby allowing reduction in the electric-field applied to the first gate insulating films 30 and suppression of electron injection to the floating gates 8.

Channel voltage $V_{ch}$, during self-boosting, is considered to be represented by the following series of equations.

$$V_{ch}=V_{ch\_init}+Cr1\times(V_{pass}-V_{thbk}-V_{ch\_init})+CR2\times(V_{pgm}-V_{th}-V_{ch\_init}) \quad (3)$$

$$V_{ch\_init}=V_{sgd}-V_{th\_sgd} \quad (4)$$

$$C_t=N\cdot C_{ch}+N\cdot C_{ins} \quad (5)$$

$$Cr1=(N-1)\times C_{ins}/C_t \quad (6)$$

$$Cr2=C_{ins}/C_t \quad (7)$$

where $V_{ch\_init}$ denotes the channel voltage initial value, $V_{th}$ denotes the selected memory cell transistor threshold, $V_{thbk}$ denotes the unselected memory cell transistor threshold, Crb 1 denotes a boost ratio that multiplies $V_{pass}$, Cr2 denotes a boost ratio that multiplies $V_{pgm}$, $C_{ins}$ denotes the capacitance between a single memory transistor's control gate and the semiconductor substrate, $C_{ch}$ denotes the sum of the channel depletion layer capacitance and the diffusion layer region junction capacitance of a single memory transistor, $C_t$ denotes the total coupled capacitance to the boost region, and N denotes the number of memory cell transistors included in the NAND boost region. In addition, given that $C_{ox}$ is the capacitance between the floating gate (FG) 8 of a single memory cell transistor and the semiconductor substrate, and $C_{ono}$ is the capacitance between the control gate (CG) 2 on one side and the floating gate (FG) 8 of that single memory cell transistor, channel voltage $V_{ch}$ is represented by $C_{ins}=C_{ox}\cdot 2C_{ono}/(C_{ox}+2C_{ono})$. As the control gate voltage $V_{cg}$ rises during intermediate voltage $V_{pass}$ pulse application, the boost region (i.e., the channel and diffusion layer region of all memory transistors with the SB method) is electrically separated from the select gate transistor upon reaching $V_{thbk}+V_{ch\_init}$. The initial voltage transferred to the channel is $V_{ch\_init}$. According to Equation (3), channel voltage $V_{ch}$ is the sum of $V_{pass}$ and $V_{pgm}$ through boost ratios Cr1 and Cr2. As indicated by Equations (6) and (7), a characteristic of the SB method is that channel voltage $V_{ch}$ is virtually determined by $V_{pass}$ since Cr2 is 1/(N−1) of Cr1 and small.

During write-in, for example, the same write-in voltage $V_{pgm}$ is applied to the control gate lines CG3 and CG4 adjacent to a single floating gate 8, and the semiconductor substrate 26 is set to 0V, for example. In this state, electric charges are injected to the floating gate 8 (FG3, 4) from the semiconductor substrate 26.

The sidewall control gate structure allows reduction in the parasitic capacitance around the floating gate 8, reduction in write-in voltage $V_{pgm}$ by increasing the capacitance between the control gates 2 and the floating gate 8, and implementation of a highly-integrated, high-speed nonvolatile semiconductor memory, as described earlier. In the case of a write-in controlled state, the control gates 2 are not only coupled to the floating gate 8, but also to the diffusion layer region 18 through capacitance $C_d$. As a result, in contrast to boosting the channel potential through only capacitive coupling between the control gates 2 and the floating gate 8 with the conventional structure, capacitive coupling between the control gates 2 and the floating gate 8 and between the control gates 2 and the diffusion layer region 18 allows channel potential boost. Accordingly, even if using the same $V_{pass}$ potential as conventionally used, the channel potential may be boosted even higher. Accordingly, the channel potential during write-in control may be boosted without increasing stress due to $V_{pass}$.

The case of supplying the same voltage to two control gates 2 so as to drive a single floating gate 8, and the case of supplying different potentials to the two control gates 2 are compared.

With a memory cell transistor having the sidewall control gate structure of FIG. 2, voltage $V_{fg}$ to be applied to the floating gate 8 when applying voltage $V_{cg}$ to the control gates 2 on both sides is represented by the following equations.

$$V_{fg}=Cr\times(V_{cg}-V_t+V_{t0}) \quad (8)$$

$$Cr=2C_{ono}/(2C_{ono}+C_{ox}) \quad (9)$$

Given that $C_{ono}$:$C_{ox}$ is 5:1, a sufficiently high write-in voltage $V_{pgm}$ is applied as $V_{cg}$, memory cell transistor threshold voltage $V_t$ is 0V, and threshold voltage (intermediate threshold voltage) $V_{t0}$ when there are no electric charges in the floating gate is 0V, then voltage $V_{fg}$ may be represented by $$V_{fg}=0.75\times V_{pgm} \quad (10)$$

On the other hand, when $V_{pgm}$ is applied to only the control gate 2 on one side, and 0V is applied to the other side, and $V_{fg}$ may be represented by $$V_{fg}=0.375\times V_{pgm} \quad (11)$$

As such, the capacitive-coupling-ratio may be substantially controlled, by changing one of the potentials for two control gates.

Exemplary data write-in for the SB method utilizing the above characteristics is described while referencing FIG. 8. In FIG. 8, a voltage $V_{pgm}$ is applied to the control gate lines CG3 and CG4 on both sides of the floating gate 8 (FG3, 4) of a to-be-written memory cell transistor (hereafter referred to as 'write-in memory cell transistor') A. On the above assumption, a potential of 0.75 $V_{pgm}$ is applied to the floating gate 8 (FG3, 4) of the write-in memory cell transistor A. In addition, $V_{passL}$ (for example, 0V) is applied as a low level intermediate voltage to the control gate lines CG2 and CG5, which are adjacent to the two control gate lines CG3 and CG4 that are adjacent to the write-in memory cell transistor A. As a result, a potential of 0.375 $V_{pgm}$ is applied to the floating gates 8 (FG3, 4 and FG2, 3) of the cells adjacent to the write-in memory cell transistor A. Accordingly, the electric field stress applied to adjacent memory cell transistors due to the floating gates 8 (FG3, 4 and FG2, 3) is half that applied to adjacent cells due to the floating gate 8 (FG3, 4) of the selected cell A, thus allowing control of erroneous write-in. A specified voltage $V_{passH}$ for transferring the potential or boosting the channel potential is applied to the control gate lines CG1 and CG6 further separated from the above memory cell transistor. During actual device operation, a combination of the potentials of the control gates are appropriately made taking into consideration the write-in characteristics, channel boost characteristics, and potential transfer characteristics and the like. According to the second embodiment, by suitably choosing a combination of the potential for two control gates adjacent to a single floating gate, write-in characteristics may be improved, and erroneous write-in may be prevented.

The case of n=17 in FIG. 6, that is, the case where sixteen sidewall control gate structure memory cell transistors are connected in series, so as to configure a NAND memory cell unit, is considered. A '1' write-in is performed by the SB write-in method for sixteen NAND cells of a NAND flash EEPROM in which application of the same high voltage pulse to two adjacent control gates in a cell array allows a single memory cell transistor to be written. The boosted channel potential $V_{boost}$ in this case may be represented by $$V_{boost} = 16 C_{ch} \cdot V_{boost\_init}/(16 C_{ins} + 16 C_{ch} + 17 C_d) + (15 C_{ins} + 15 C_d) \cdot (V_{pass} - V_{thbk})/(16 C_{ins} + 16 C_{ch} + 17 C_d) + (C_{ins} + 2 C_d) \cdot (V_{pgm} - V_{thbk})/(16 C_{ins} + 16 C_{ch} + 17 C_d) \quad (12)$$

where $C_{ins}$ is represented by $$C_{ins} = C_{ox} \cdot C_r = 2 C_{ox} \cdot C_{ono}/(C_{ox} + 2 C_{ono}) \quad (13)$$

as mentioned above.

Here, $C_{ch}$ represents the capacitance between the channel and the semiconductor substrate, $V_{thbk}$ represents the threshold of a cell when viewed from the control gate, and $V_{boost\_init}$ represents the potential during initial charging of the channel. Other variables are as indicated in FIG. 2. It should be noted that Equation (12) does not consider $V_{passL}$ and $V_{passH}$ in its derivation process. Equation (12) is derived on a simple assumption that $V_{pass}$ is applied to all elements except the control gate, which has voltage $V_{pgm}$ applied thereto.

The boosted channel potential $V_{boost}$, during '1' write-in in the case where sixteen conventional stacked gate memory cell transistors shown in FIG. 1 are connected in series so as to configure a NAND memory cell unit, may be represented by $$V_{boost} = C_{ch} \cdot V_{boost\_init}/(C_{ins} + C_{ch}) + 15 C_{ins} \cdot (V_{pass} - V_{thbk})/(16 C_{ins} + 16 C_{ch}) + C_{ins} \cdot (V_{pgm} - V_{thbk})/(16 C_{ins} + 16 C_{ch}) \quad (14)$$

It should be noted that $C_{ins}$ is represented by $C_{ins} = C_{ox} \cdot C_{ono}/(C_{ox} + C_{ono})$ with the conventional cell structure.

As is apparent by comparing Equations (13) and (14), in order to obtain the same value for the boosted channel potential $V_{boost}$ when $V_{boost\_init}$ and $V_{pgm}$ are equivalent, the sidewall control gate structure applied to the nonvolatile semiconductor memory of the present invention allows a lower $V_{pass}$ value than with the stacked gate memory cell transistor structure.

For example, given that $V_{boost\_init}=1.5$ V, $V_{thbk}=-3$V, and $C_{ins}:C_{ch}:C_d=1:1:1$, $V_{pgm}=20$V, and $V_{pass}=6.25$V in order to obtain a voltage $V_{boost}$ as large as when applying $V_{pgm}=20$V and $V_{pass}=10$V with the stacked gate memory cell transistor structure. Erroneous write-in stress due to $V_{pass}$ in the conventional NAND flash EEPROM may be greatly reduced.

The case of n=32 in FIG. 6, that is, the case where thirty-two sidewall control gate structure memory cell transistors are connected in series so as to configure a NAND memory cell unit is considered. A '1' write-in is performed by the SB write-in method in thirty-two NAND cells of a NAND flash EEPROM in which application of the same high voltage pulse to two adjacent control gates in a cell array allows a single memory cell transistor to be written. The boosted channel potential $V_{boost}$ in this case may be represented by $$V_{boost} = 32 C_{ch} \cdot V_{boost\_init}/(32 C_{ins} + 32 C_{ch} + 33 C_d) + (31 C_{ins} + 31 C_d) \cdot (V_{pass} - V_{thbk})/(32 C_{ins} + 32 C_{ch} + 33 C_d) + (C_{ins} + 2 C_d) \cdot (V_{pgm} - V_{thbk})/(32 C_{ins} + 32 C_{ch} + 33 C_d) \quad (15)$$

The case of n=k in FIG. 6, that is, the case where k sidewall control gate structure memory cell transistors are connected in series so as to configure a NAND memory cell unit is considered. A '1' write-in is performed by the SB write-in method in k NAND cells of a NAND flash EEPROM in which application of the same high voltage pulse to two adjacent control gates in a cell array allows a single memory cell transistor to be written. The boosted channel potential $V_{boost}$ in this case may be represented by $$V_{boost} = k \cdot C_{ch} \cdot V_{boost\_init}/[k \cdot C_{ins} + k \cdot C_{ch} + (k+1) \cdot C_d] + (k-1) \cdot (C_{ins} + C_d) \cdot (V_{pass} - V_{thbk})/[k \cdot C_{ins} + k \cdot C_{ch} + (k+1) \cdot C_d] + (C_{ins} + 2 C_d) \cdot (V_{pgm} - V_{thbk})/[k \cdot C_{ins} + k \cdot C_{ch} + (k+1) \cdot C_d] \quad (16)$$

Equation (16) is a general equation. Since the number of memory cell transistors configuring a NAND cell unit is not limited to eight or sixteen, and may be thirty-two, sixty-three, or even one hundred twenty-eight, for example, the values of the boosted channel potential $V_{boost}$ and $V_{pass}$ may be determined with the general equation (16).

THIRD EMBODIMENT

An LSB write-in method for a nonvolatile semiconductor memory according to a third embodiment of the present invention is described.

(LSB Write-in Method)

The LSB write-in method is described with a NAND cell in which eight memory cell transistors are connected in series in a NAND flash EEPROM in which application of the same high voltage pulse to two adjacent control-gates in a cell array allows a single memory cell transistor to be written.

The LSB write-in method is a channel voltage control method of boosting the voltage by cutting off memory cell transistors on both sides of a selected memory cell transistor so as to electrically separate only the channel and diffusion layer region of the selected memory cell transistor from other memory cell transistors and then enter a floating state. The LSB method normally employs sequential write-in by which write-in is performed in order from the source line SL side control gate lines CG0, CG1, . . . . According to the LSB method, a channel voltage higher than that provided by the SB method may be achieved. Specifically, a write-in voltage $V_{pgm}$ is applied to the control gate lines CGk and CGk+1 for the selected memory cell transistor, a cut-off voltage $V_{cutoff}$, which is a low voltage (for example, 0V), is applied to the control gate lines CGk-2, CGk-1, CGk+2 and CGk+4 on both sides thereof, and an intermediate voltage $V_{pass}$ between the write-in voltage $V_{pgm}$ and the cut-off voltage $V_{cutoff}$ is applied to the other unselected control gate lines. Viewed in line with the previous Equations (3) through (7) regarding the channel voltage $V_{ch}$ during self-boosting, since the number of memory transistors to be boosted is one (N=1) with the LSB method, the boost ratio is $Cr2=C_{ins}/(C_{ch}+C_{ins})$, which is larger than that with the SB method. In addition, since the boost ratio $Cr2$ is multiplied by the write-in voltage $V_{pgm}$, the third term of Equation (3) is extremely large (the second term is zero), and thus the attained channel voltage is larger than that with the SB method.

Figure 9:
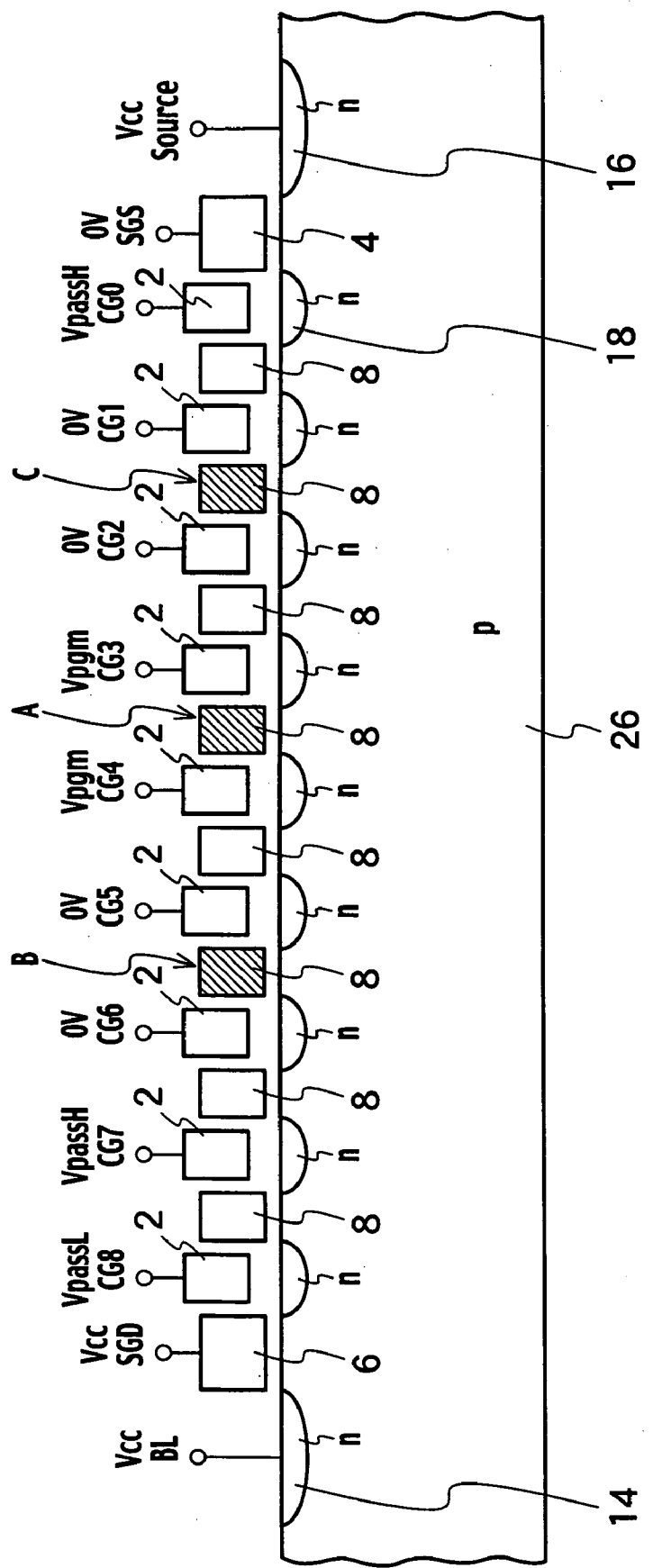
FIG. 9 is a schematic cross-sectional diagram for describing an LSB write-in method for a nonvolatile semiconductor memory according to a third embodiment of the present invention.

The LSB write-in method for sixteen NAND cells of a NAND flash EEPROM, in which application of the same high voltage pulse to two adjacent control gates in a cell array allows a single memory cell transistor to be written, is described. According to the LSB write-in method for the nonvolatile semiconductor memory of the third embodiment of the present invention, bias conditions as shown in FIG. 9 are used. In FIG. 9, a memory cell transistor B and a memory cell transistor C to be cut off conduction are disposed on both sides of the write-in memory cell transistor A. A voltage $V_{pgm}$ is applied to the control gate lines CG3 and CG4 on both sides of the floating gate 8 (FG3, 4) of the write-in memory cell transistor A. On the above assumption, a potential of 0.75 $V_{pgm}$ is applied to the floating gate 8 (FG3, 4) of the write-in memory cell transistor A. In addition, $V_{cutoff}$ (for example, 0V) is applied as a cut-off voltage to the control gate lines CG2 and CG5, which are adjacent to the two control gate lines CG3 and CG4 that are adjacent to the write-in memory cell transistor A, and the voltage $V_{cutoff}$ (for example, 0V) is also applied to the control gate lines CG1 and CG6, which are adjacent to the two-control gate lines CG2 and CG5. The conduction of the memory cell transistors B and C are cut off based on such set bias conditions. As a result, a potential of 0.375 $V_{pgm}$ is applied to the floating gates 8 (FG4, 5 and FG2, 3) of the memory cell transistors adjacent to the write-in memory cell transistor A. Accordingly, the electric field stress applied to adjacent memory cell transistors due to the floating gates 8 (FG4, 5 and FG2, 3) is half that applied to adjacent cells due to the floating gate 8 (FG3, 4) of the selected memory cell transistor A, thus allowing control of erroneous write-in. A specified $V_{passH}$ for transferring the potential or boosting the channel potential is applied to the control gate lines CG0 and CG7 further separated from the above memory cell transistor A. A specified $V_{passL}$ is applied to the control gate line CG8 even further separated therefrom. During actual device operation, an appropriate combination of the control gate potentials is used taking into consideration the write-in characteristics, channel boost characteristics, and potential transfer characteristics and the like. According to the third embodiment, by combining the potential of two control gate lines adjacent to a single floating gate, write-in characteristics may be improved, and erroneous write-in may be prevented.

FOURTH EMBODIMENT

An EASB write-in method for a nonvolatile semiconductor memory according to a fourth embodiment of the present invention is described.

(EASB Write-in Method)

The EASB write-in method for a NAND flash EEPROM with NAND cells, for example, configured from eight memory cell transistors connected in series, in which a single memory cell transistor is written by applying the same high voltage pulse to two adjacent control gates in a cell array, is described.

Figure 10:
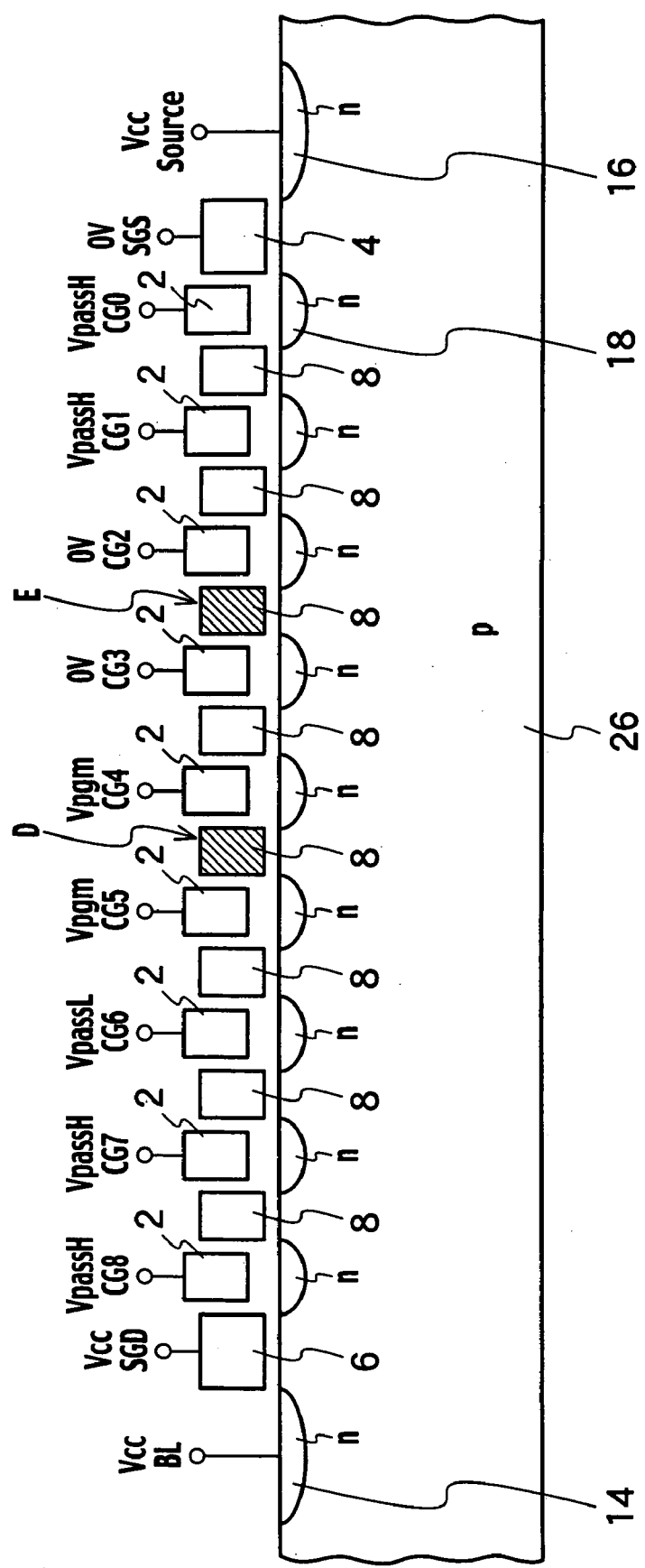
FIG. 10 is a schematic cross-sectional diagram for describing an EASB write-in method for a nonvolatile semiconductor memory according to a fourth embodiment of the present invention.

The EASB method is a channel voltage control method, which cuts off the control gate lines CGk-2 and CGk-1 for the adjacent memory transistors on the source side of the selected memory cell transistor by applying a low cut-off voltage $V_{cutoff}$, applies a write-in voltage $V_{pgm}$ to the control gate line CGk and CGk+1 for the selected memory cell transistor, and applies an intermediate voltage $V_{pass}$ to the remaining unselected control gate lines. The EASB method is assumed to employ sequential write-in by which write-in is performed in order from the aforementioned source line SL side control gate lines CG0, CG1, . . . . In this case, as shown in FIG. 10, the regions to be boosted are limited to a selected memory cell transistor D and the memory cell transistor located further on the bit line BL side thereof. A merit of the foregoing configuration is that since all memory cell transistors in the regions to be boosted for sequential write-in are in an erased state and the second term in the previous Equation (3) substantially increases, and a channel voltage higher than that achieved by the SB method may be obtained.

The EASB write-in method for a NAND flash EEPROM with eight NAND cells, in which a single memory cell transistor is written by applying the same high voltage pulse to two adjacent control gates in a cell array, is described. According to the EASB write-in method for the nonvolatile semiconductor memory according to the fourth embodiment of the present invention, bias conditions as shown in FIG. 10 are used. In FIG. 10, a to-be-cut-off memory cell transistor E that is adjacent to a write-in memory cell transistor D on the source line SL side thereof is set. A voltage $V_{pgm}$ is applied to the control gate lines CG4 and CG5 on both sides of the floating gate 8 (FG4, 5) of the write-in memory cell transistor D. On the above assumption, a potential of 0.75 $V_{pgm}$ is applied to the floating gate 8 (FG4, 5) of the write-in memory cell transistor D. In addition, a voltage $V_{cutoff}$ (for example, 0V) is applied as a cut-off voltage to the two control gate lines CG2 and CG3 of the memory cell transistor E, which is adjacent to the write-in memory cell transistor D on the source line SL side thereof. The conduction of the memory cell transistor E is cut off based on such set bias conditions. The channel potential of memory cell transistors, that are located further on the source line SL side than the memory cell transistor E, is boosted by applying a high level intermediate voltage $V_{passH}$ to the control gate lines CG1 and CG0 located further on the source line SL side than the cut off memory cell transistor E so as to supplement the cut-off conduction of memory cell transistor E. Furthermore, a low level intermediate voltage $V_{passL}$ is applied to the control gate line CG6, which is adjacent to the control gate line CG5 of the write-in memory cell transistor D.

As a result, a potential of 0.375 $V_{pgm}$ is applied to the floating gates 8 (FG3, 4 and FG5, 6) of the memory cell transistors adjacent to the write-in memory cell transistor D. Accordingly, the electric field stress applied to the adjacent memory cell transistors due to the floating gates 8 (FG3, 4 and FG5, 6) is half that applied to adjacent cells due to the floating gate 8 (FG4, 5) of the selected memory cell transistor D, allowing erroneous write-in control. A high level intermediate voltage $V_{passH}$ is applied to the control gate line CG7 further separated from the above memory cell transistor D, and a high level intermediate voltage $V_{passH}$ is also applied to the control gate line CG8 adjacent to that control gate line CG7. This structure is for potential transferring or channel potential boosting. During actual device operation, an appropriate combination of the control gate potentials is used taking into consideration the write-in characteristics, channel boost characteristics, and potential transfer characteristics and the like. According to the fourth embodiment, by combining the potential of two control gates adjacent to a single floating gate, write-in characteristics may be improved, and erroneous write-in may be prevented.

FIFTH EMBODIMENT

Another EASB write-in method for a nonvolatile semiconductor memory according to a fifth embodiment of the present invention is described.

Another EASB write-in method for a NAND flash EEPROM with NAND cells, for example, configured from eight memory cell transistors being connected in series, in which a single memory cell transistor is written by applying the same high voltage pulse to two adjacent control gates in a cell array, is described.

The LSB method and EASB method described above provide a high channel voltage by increasing the boost efficiency for the channel voltage. However, in view of boost efficiency, it is difficult to obtain results greater than with the LSB method, and a different approach is necessary for achieving an even higher channel voltage.

No matter what channel voltage control method is adopted, to begin with, initial charging is performed via the bit line side select gate transistor SG1. This initial charging is described taking the SB method as an example. To begin with, the condition before applying the intermediate voltage $V_{pass}$ and write-in voltage $V_{pgm}$ pulses is considered. In the '1' write-in NAND cell unit, $V_{bl}$ is applied to the bit line, and $V_{sgd}$ is applied to the bit line side select gate line SGD. For example, $V_{sgd}$ is the same value as $V_{bl}$. In such bias relationship, when the source side diffusion layer region voltage for the bit line side select gate transistor SG1 is at least $V_{sgd} - V_{th\_sgd}$, electrons are extracted from the channel and the diffusion layer regions 18 of erased memory transistors, which extend to the bit line side select gate transistor SG1, and discharged to the bit line BL. As a result, this channel and the diffusion layer regions 18 are positively charged. Next, the memory cell transistors in the written regions are assumed to be on during the course of raising the intermediate voltage $V_{pass}$ and write-in voltage $V_{pgm}$ pulses. The channels and diffusion layer regions 18 of all the memory cell transistors are serially-connected at this time. Accordingly, movement of electrons in all the channel regions is possible, and a portion of the electrons is discharged at this time. Since the bit line side select gate transistor SG1 is cut off conduction, when its channel voltage reaches the value: $V_{sgd} - V_{th\_sgd}$, the voltages of all channel regions and diffusion layer regions 18 are boosted through capacitive coupling with the control gate line voltage as an integrated configuration. Accordingly, transfer of the initial voltage with the SB method occurs near the point in time when $V_{pgm}$ is applied to the write-in memory cell transistor. Considering that a floating gate (FG) voltage for the memory cell transistor is $V_{fg\_init} = V_{fgth} + V_{ch\_init}$ ($V_{fgth}$ denotes the memory transistor threshold when viewed from the floating gate) at the time when $V_{pgm}$ is applied to the write-in memory cell transistor, given that the initial voltage is $V_{ch\_init}$ ($=V_{sgd} - V_{th\_sgd}$), electrical charge $Q_{ch}$ within the channel is represented by the following equation when N=16 as an example.

$$Q_{ch} = 16 C_{ox} \cdot (V_{ch\_init} - V_{fg\_init}) + 16 C_{ch} \cdot V_{ch\_init} = -16 C_{ox} \cdot V_{fgth} + 16 C_{ch} \cdot V_{ch\_init} \tag{17}$$

In other words, if the channel is charged with electrical charge $Q_{ch}$ and junction leakage currents or the like are sufficiently small, the electric charge $Q_{ch}$ may be maintained even after the above time period.

On the contrary, if the electrical charge $Q_{ch}$ within this channel can be increased prior to an intermediate voltage $V_{pass}$ and write-in voltage $V_{pgm}$ pulse application, the channel voltage can be increased in accordance with $$\Delta V_{ch} = \Delta Q_{ch} / C_t \tag{18}$$

Figure 11:
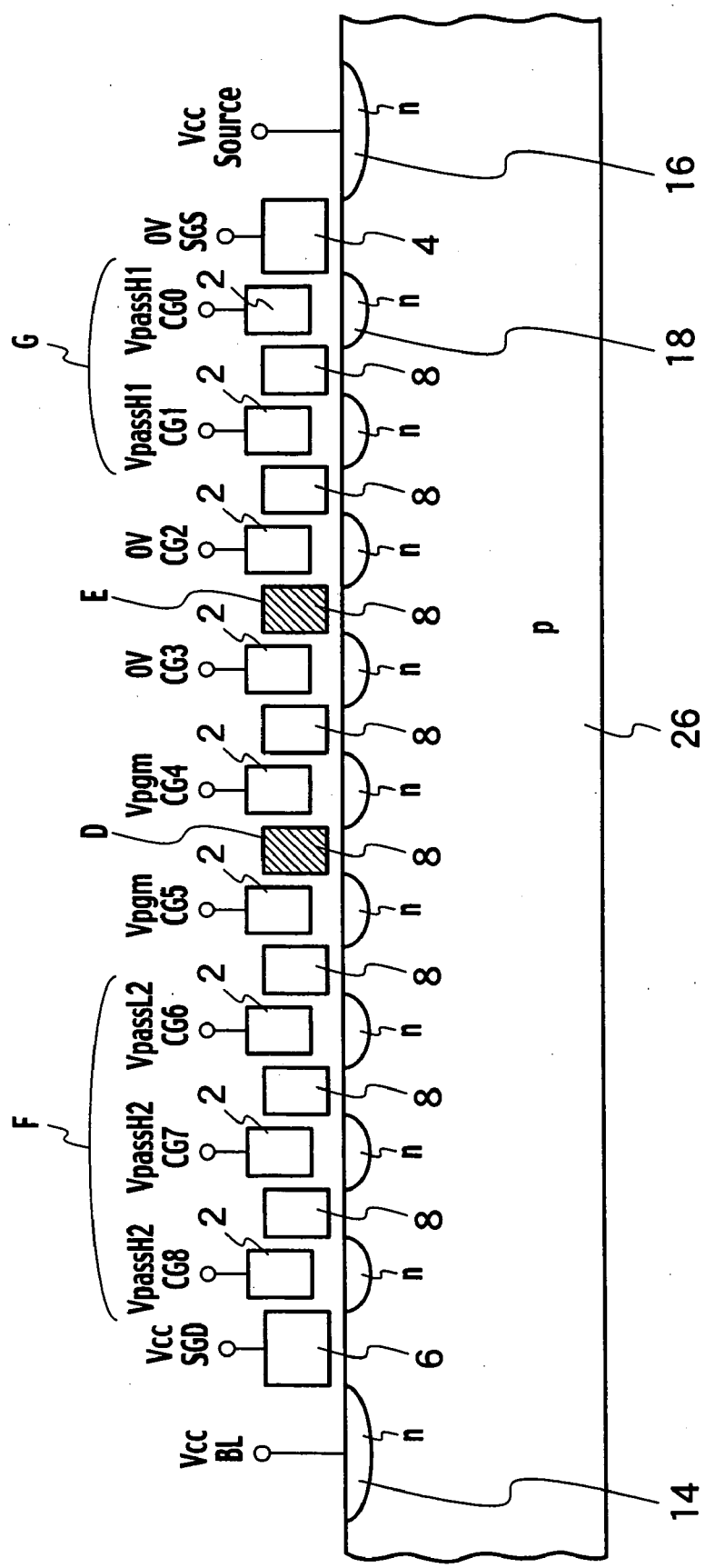
FIG. 11 is a schematic cross-sectional diagram for describing another EASB write-in method for a nonvolatile semiconductor memory according to a fifth embodiment of the present invention.

According to this EASB write-in method for the nonvolatile semiconductor memory according to the fifth embodiment of the present invention, bias conditions as shown in FIG. 11 are used. In FIG. 11, the to-be-cut-off memory cell transistor E that is adjacent to the write-in memory cell transistor D on the source line SL side thereof is set. A voltage $V_{pgm}$ is applied to the control gate lines CG4 and CG5 on both sides of the floating gate 8 (FG4, 5) of the write-in memory cell transistor D. On the above assumption, a potential of 0.75 $V_{pgm}$ is applied to the floating gate 8 (FG4, 5) of the write-in memory cell transistor D. In addition, $V_{cutoff}$ (for example, 0V) is applied as a cut-off voltage to the two control gate lines CG2 and CG3 of the memory cell transistor E, which is adjacent to the write-in memory cell transistor D on the source line SL side thereof. The conduction of the memory cell transistor E is cut off based on such bias conditions. The channel potential of memory cell transistors further located on the source line SL side than the memory cell transistor E is boosted by applying a high level intermediate voltage $V_{passH1}$ to the control gate lines CG1 and CG0 located further on the source line SL side than the cut off memory cell transistor E so as to supplement the cut-off conduction of the memory cell transistor E. Furthermore, a low level intermediate voltage $V_{passL2}$ is applied to the control gate line CG6, which is adjacent to the control gate line CG5 of the write-in memory cell transistor D.

As a result, a potential of 0.375 $V_{pgm}$ is applied to the floating gates 8 (FG3, 4 and FG5, 6) of the memory cell transistors adjacent to the write-in memory cell transistor D. Accordingly, the electric field stress applied to the adjacent memory cell transistors due to the floating gates 8 (FG3, 4 and FG5, 6) is half that applied to adjacent cells due to the floating gate 8 (FG4, 5) of the selected memory cell transistor D, thus allowing control of erroneous write-in. A high level intermediate voltage $V_{passH2}$ is applied to the control gate line CG7 further separated from the above memory cell transistor D, and is also applied to the control gate line CG8 adjacent to that control gate line CG7. This structure is for potential transferring or channel potential boosting. During actual device operation, an appropriate combination of the control gate potentials are used taking into consideration the write-in characteristics, channel boost characteristics, and potential transfer characteristics and the like. According to the fifth embodiment, by combining the potentials of two control gates adjacent to a single floating gate, write-in characteristics may be improved, and erroneous write-in may be prevented.

Applying $V_{pgm}$ to the control gate lines CG4 and CG5 of the write-in memory cell transistor D and applying 0V to the control gate lines CG2 and CG3 of the to-be-cut-off memory cell transistor E is the same as with the fourth embodiment. What differs from the fourth embodiment is the value of the voltage applied to the control gate lines other than the control gate lines CG4 and CG5 of the write-in memory cell transistor D and the control gate lines CG2 and CG3 of the to-be-cut-off memory cell transistor E. In other words, an even higher intermediate voltage $V_{passH1}$ than the high level intermediate voltage $V_{passH}$ is applied to the control gate lines that are further located on the source line SL side than the to-be-cut-off memory cell transistor E. Furthermore, an even lower intermediate voltage $V_{passL2}$ than the low level intermediate voltage $V_{passL}$ is applied to the control gate line CG6, which is adjacent to the write-in memory cell transistor D. An intermediate voltage $V_{passH2}$ set lower than the high level intermediate voltage $V_{passH}$ is applied to the control gate lines CG7 and CG8 that are further located on the bit line BL side. In other words, the magnitude relationships $V_{passH1} > V_{passH}$, $V_{passL2} < V_{passL}$, and $V_{passH2} < V_{passH}$ are achieved. For example, with sequential write-in, since memory cell transistors that are further located on the bit line BL side than the write-in memory cell transistor is always in an erased state, a relatively low intermediate voltage is applied, and a relatively high intermediate voltage is applied to the memory cell transistors that are further located on the source line SL side than the write-in memory cell transistor. Since the boosting effect for the erased memory cell transistor is great, $V_{pgm}$ stress does not create a significant problem even if the intermediate voltage is set low. Accordingly, erroneous write-in is reduced on the whole due to the reduced $V_{pass}$ stress.

SIXTH EMBODIMENT

An SB sequential write-in method for a nonvolatile semiconductor memory according to a sixth embodiment of the present invention is described.

(SB Sequential Write-in Method)

The SB sequential write-in method for a NAND flash EEPROM with NAND cells configured from, for example, eight memory cell transistors connected in series, in which a single memory cell transistor is written by applying the same high voltage pulse to two adjacent control gates in a cell array, is described. The sequential write-in method performs write-in in order from the source line SL side memory cell transistor. A write-in method that combines the sequential write-in method with the SB write-in method corresponds to the nonvolatile semiconductor memory according to the sixth embodiment of the present invention. According to the SB sequential write-in method, bias conditions as shown in FIG. 12 or FIG. 13 are used.

Figure 12:
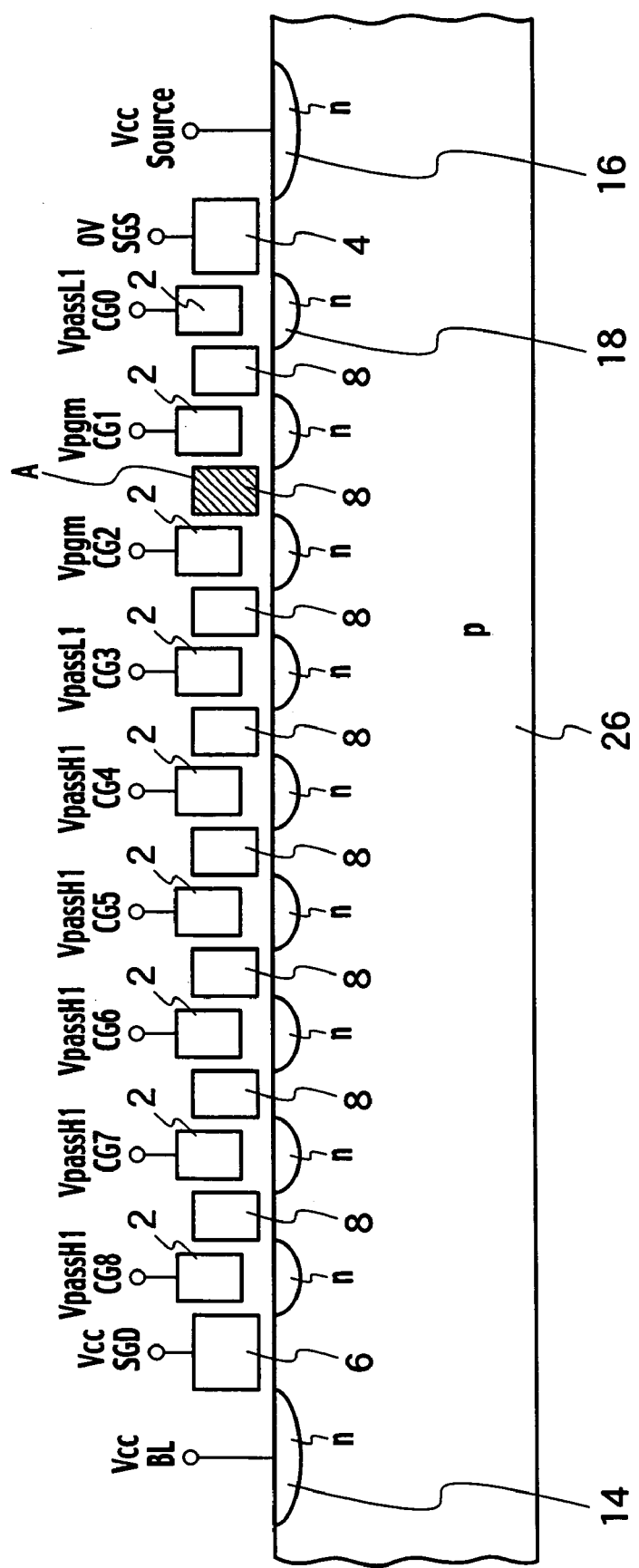
FIG. 12 is a schematic cross-sectional diagram for describing an SB sequential write-in method for a nonvolatile semiconductor memory according to a sixth embodiment of the present invention.

In FIG. 12, a voltage $V_{pgm}$ is applied to the control gate lines CG1 and CG2 on both sides of the floating gate 8 (FG1, 2) of the write-in memory cell transistor A. Based on the assumption of the above Equations (10) and (11), a potential of 0.75 $V_{pgm}$ is applied to the floating gate 8 (FG1, 2) of the write-in memory cell transistor A. In addition, $V_{passL1}$ (for example, 0V) is applied as a low level intermediate voltage to the control gate lines CG0 and CG3, which are adjacent to the two control gate lines CG1 and CG2 that are adjacent to the write-in memory cell transistor A. As a result, a potential of 0.375 $V_{pgm}$ is applied to the floating gates 8 (FG0, 1 and FG2, 3) of the cells adjacent to the write-in memory cell transistor A. Accordingly, the electric field stress applied to adjacent memory cell transistors due to the floating gates 8 (FG0, 1 and FG2, 3) is half that applied to adjacent cells due to the floating gate 8 (FG1, 2) of the selected memory cell transistor A, thus allowing control of erroneous write-in. A specified $V_{passH1}$ for transferring the potential or boosting the channel potential is applied to the control gate lines CG4 through CG8 further separated from the above memory cell transistor A. During actual device operation, an appropriate combination of the potentials of the control gates are used taking into consideration the write-in characteristics, channel boost characteristics, and potential transfer characteristics and the like. According to the sixth embodiment, by accordingly combining the potentials of two control gates adjacent to a single floating gate, write-in characteristics may be improved, and erroneous write-in may be prevented.

Figure 13:
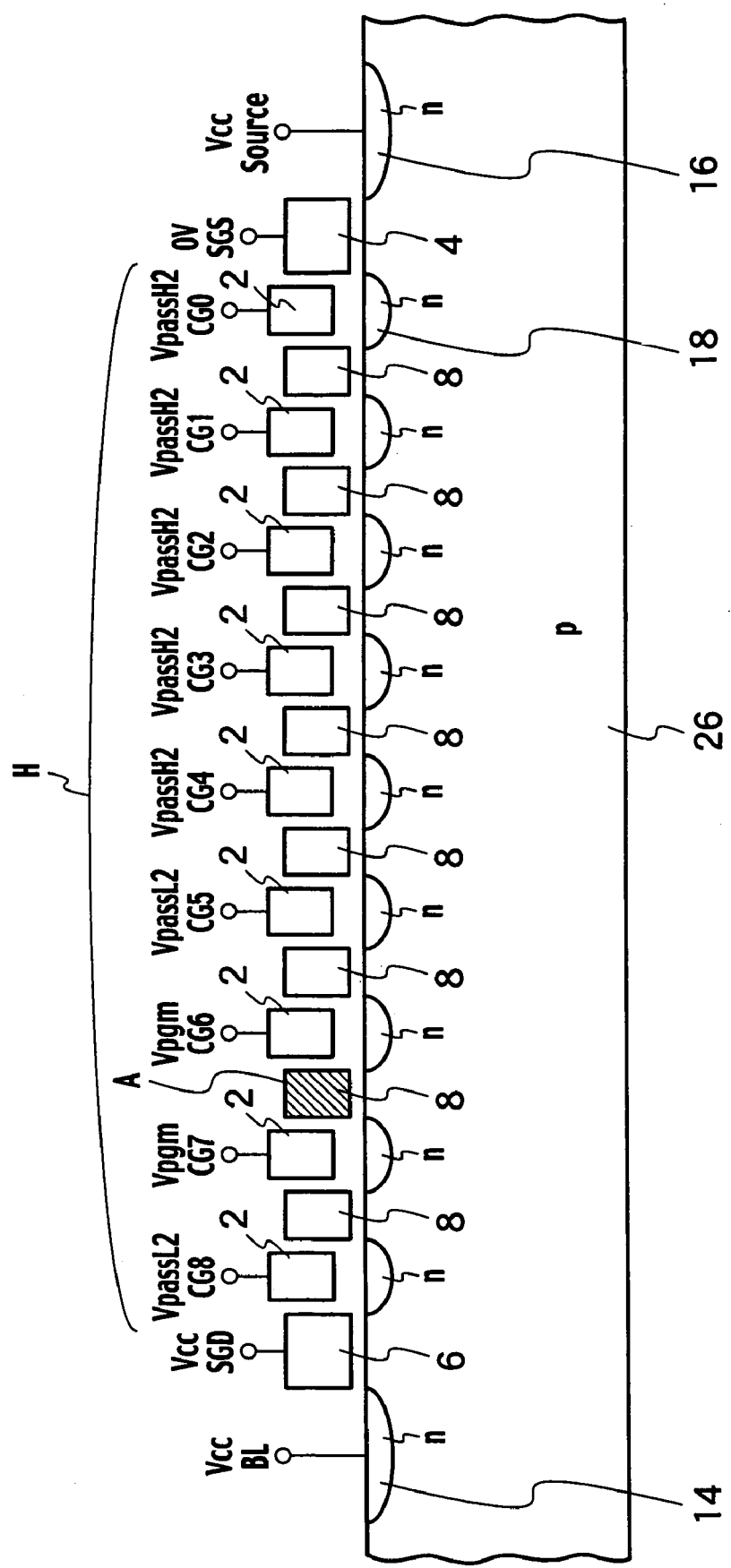
FIG. 13 is a schematic cross-sectional diagram for describing the SB sequential write-in method for the nonvolatile semiconductor memory according to the sixth embodiment of the present invention.

In FIG. 13, a voltage $V_{pgm}$ is applied to the control gate lines CG6 and CG7 on both sides of the floating gate 8 (FG6, 7) of the write-in memory cell transistor A. Based on the assumption of the above Equations (10) and (11), a potential of 0.75 $V_{pgm}$ is applied to the floating gate 8 (FG6, 7) of the write-in memory cell transistor A. In addition, $V_{passL2}$ (for example, 0V) is applied as a low level intermediate voltage to the control gate lines CG5 and CG8, which are adjacent to the two control gate lines CG6 and CG7 that are adjacent to the write-in memory cell transistor A. As a result, a potential of 0.375 $V_{pgm}$ is applied to the floating gates 8 (FG5, 6 and FG7, 8) of the cells adjacent to the write-in memory cell transistor A. Accordingly, the electric field stress applied to adjacent memory cell transistors due to the floating gates 8 (FG5, 6 and FG7, 8) is half that applied to adjacent cells due to the floating gate 8 (FG6, 7) of the selected memory cell transistor A, thus allowing control of erroneous write-in. A specified $V_{passH2}$ for transferring the potential or boosting the channel potential is applied to the control gate lines CG4 through CG0 further separated from the above memory cell transistor A. During actual device operation, an appropriate combination of the potentials of the control gates are used taking into consideration the write-in characteristics, channel boost characteristics, and potential transfer characteristics and the like. According to the sixth embodiment, by combining the potentials of two control gates adjacent to a single floating gate, write-in characteristics may be improved, and erroneous write-in may be prevented. Particularly, the intermediate voltage $V_{pass}$ is boosted based on the bias conditions shown in FIG. 13 when writing in the last 3 or 4 cells. In other words, the value of the intermediate voltage $V_{pass}$ is boosted when writing in memory cell transistors close to the bit line BL by setting $V_{passH2} > V_{passH1}$ and $V_{passL2} > V_{passL1}$.

In the SB write-in method, the channel voltage $V_{ch}$ increases enough to boost the intermediate voltage $V_{pass}$ and indicates a decreasing tendency of the $V_{pgm}$ stress characteristics along with the intermediate voltage $V_{pass}$ boost. The $V_{pass}$ stress is characterized by the tendency of the threshold voltage, increasing in proportion to $V_{pass}$. In other words, the curves for the $V_{pgm}$ stress and $V_{pass}$ stress intersect, indicating conflicting characteristics in terms of $V_{pass}$. The $V_{pass}$ value near this intersecting point may be used in order to minimize both stresses. This also means that the write-in characteristics improve as the threshold voltage is lower at this intersecting point. The SB method has been described here; however, the basic tendency is the same for the LSB method and the EASB method as well. This result indicates that the $V_{pass}$ stress characteristics tend to be the same as the SB write-in method; however, since the $V_{pgm}$ stress is smaller than that with the SB method, the erroneous write-in stress tends to decrease.

Dependency of $V_{pgm}$ stress to location within the NAND cell unit is compared to the cases of sequential write-in and random write-in. In the case of random write-in, the $V_{pgm}$ stress is constant, irrelevant to the memory cell transistor location in the NAND cell unit. In the case of sequential write-in, since the memory cell transistor further along the bit lines BL side than the select control gate line is always in an erased state, the $V_{pgm}$ stress becomes smaller the further the memory cell transistor is separated from the bit line. In order to reduce the $V_{pgm}$ stress, a high intermediate voltage is used. However, in the case of sequential write-in, a high intermediate voltage $V_{pass}$ is only necessary for some memory cell transistors from the bit line BL side. Accordingly, when writing in a control gate line separated from the bit line, the intermediate voltage $V_{pass}$ may be set low to a degree that does not significantly worsen the $V_{pgm}$ stress. In other words, this means that the $V_{pass}$ stress, which is defined by the sum when selecting all the control gate lines and writing therein, may be reduced.

When the selected control gate line is located near the bit line BL, a high voltage from the different intermediate voltages $V_{pass}$ is applied to the unselected gate lines, and when the selected control gate line is located far from the bit line BL, a low voltage from the different intermediate voltages $V_{pass}$ is applied to the unselected gate lines. This is characteristic of the SB sequential write-in method for the nonvolatile semiconductor memory according to the sixth embodiment of the present invention.

SEVENTH EMBODIMENT

Another SB write-in method for a nonvolatile semiconductor memory according to a seventh embodiment of the present invention is described.

Figure 14:
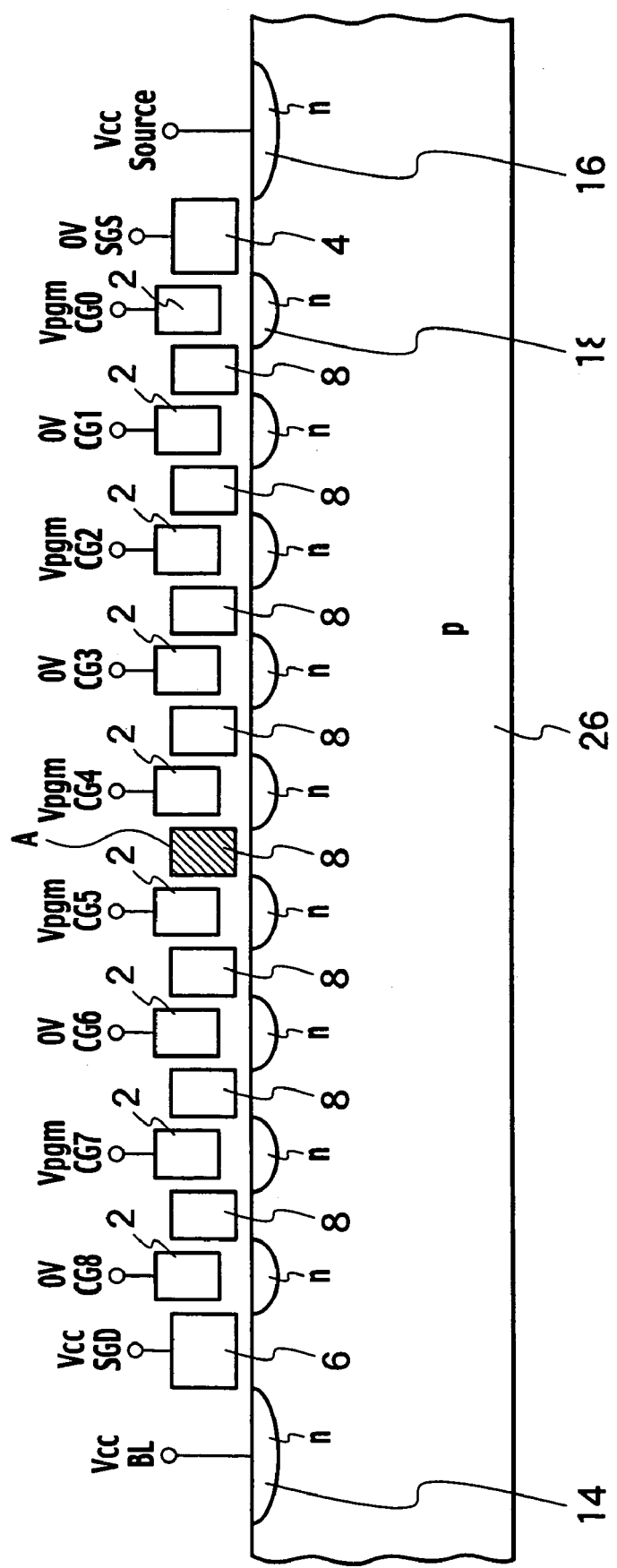
FIG. 14 is a schematic cross-sectional diagram for describing a modified example of the SB sequential write-in method for a nonvolatile semiconductor memory according to a seventh embodiment of the present invention.

Another SB write-in method for a NAND flash EEPROM with NAND cells configured from, for example, eight memory cell transistors connected in series, in which a single memory cell transistor is written by applying the same high voltage pulse to two adjacent control gates in a cell array, is described. According to the modified SB write-in method for the nonvolatile semiconductor memory of the seventh embodiment of the present invention, bias conditions as shown in FIG. 14 are used. In FIG. 14, a voltage $V_{pgm}$ is applied to the control gate lines CG4 and CG5 on both sides of the floating gate 8 (FG4, 5) of the write-in memory cell transistor. A. Based on the assumption of the above Equations (10) and (11), a potential of 0.75 $V_{pgm}$ is applied to the floating gate 8 (FG4, 5) of the write-in memory cell transistor A. In addition, $V_{passL}$ (for example, 0V) is applied as a low level intermediate voltage to the control gate lines CG3 and CG6, which are adjacent to the two control gate lines CG4 and CG5 that are adjacent to the write-in memory cell transistor A. As a result, a potential of 0.375 $V_{pgm}$ is applied to the floating gates 8 (FG3, 4 and FG5, 6) of the cells adjacent to the write-in memory cell transistor A. Accordingly, the electric field stress applied to adjacent memory cell transistors due to the floating gates 8 (FG3, 4 and FG5, 6) is half that applied to adjacent cells due to the floating gate 8 (FG4, 5) of the selected cell A, allowing control of erroneous write-in. A voltage $V_{pgm}$ is applied to the control gate lines CG2 and CG7 even further separated from the above memory cell transistor A. In addition, $V_{passL}$ (for example, 0V) is applied as a low level intermediate voltage to the control gate lines CG1 and CG8, which are adjacent to the above control gate lines CG2 and CG7. A voltage $V_{pgm}$ is applied to the control gate line CG0 adjacent to the above control gate CG1. As is apparent from the description given above, the same voltage is applied to the control gate lines that are equidistant on both sides of the write-in memory cell transistor A. Moreover, the high voltage $V_{pgm}$ and low voltage $V_{passL}$ (for example, 0V) are applied alternately. During actual device operation, an appropriate combination of the potentials of the control gates are used taking into consideration the write-in characteristics, channel boost characteristics, and potential transfer characteristics and the like. According to the seventh embodiment, by combining the potentials of two control gates adjacent to a single floating gate, write-in characteristics may be improved, and erroneous write-in may be prevented.

The seventh embodiment has been described with the SB write-in method taken as an example; however, it is also applicable to the LSB write-in method and the EASB write-in method.

EIGHTH EMBODIMENT

A read-out method for a nonvolatile semiconductor memory according to an eighth embodiment of the present invention is described.

(Read-Out Method)

The read-out method is described for a NAND flash EEPROM with NAND cells configured from, for example, eight memory cell transistors connected in series, in which a single memory cell transistor is read out by applying the same high voltage pulse to two adjacent control gates in a cell array.

Figure 15:
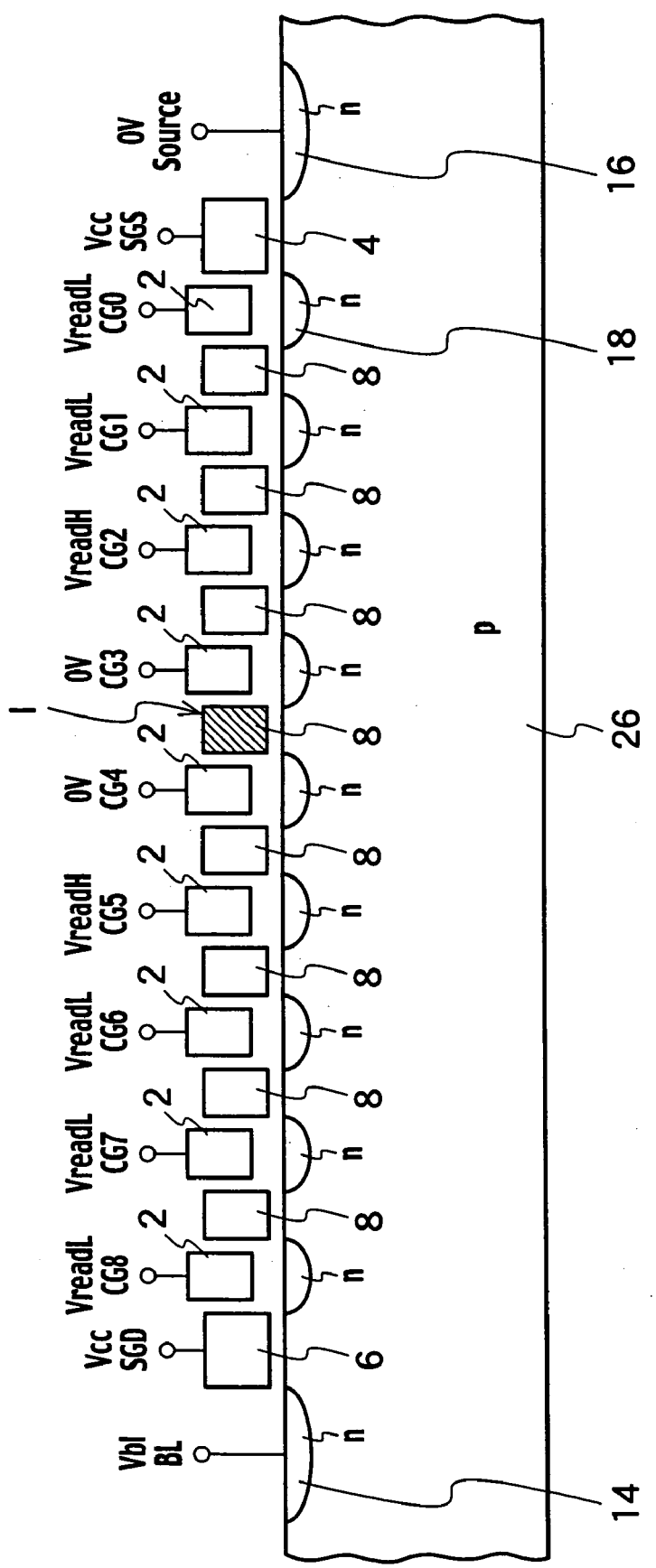
FIG. 15 is a schematic cross-sectional diagram for describing a read-out method for a nonvolatile semiconductor memory according to an eighth embodiment of the present invention.

According to the read-out method for the nonvolatile semiconductor memory of the eighth embodiment of the present invention, bias conditions as shown in FIG. 15 are used. In FIG. 15, a read-out voltage $V_{wl}$ is applied to the control gate lines CG3 and CG4, which are adjacent to the floating gate 8 (FG3, 4) of a to-be-read memory cell transistor (hereafter referred to as 'read-out memory cell transistor') I. The read-out voltage $V_{wl}$ is preferably set to an appropriate potential taking into consideration read-out characteristics, hold characteristics, and operating range of the cell transistor threshold voltage. Based on the assumption of the above Equations (10) and (11), and with the read-out voltage $V_{wl}$ is set to 0V, a potential of 0 V is applied to the floating gate 8 (FG3, 4) of the read-out memory cell transistor I. In addition, a potential $V_{readH}$ for making the cell electric current flow is applied to the control gate lines CG2 and CG5, which are adjacent to the two control gate lines CG3 and CG4 that are adjacent to the read-out memory cell transistor I. $V_{readH}$ is preferably set to an appropriate potential for determining the threshold voltage for the read-out memory cell transistor I by eliminating influence from the unselected memory cell transistors connected to the read-out memory cell transistor I. Furthermore, $V_{passL}$ is also applied to the control gate lines CG1 and CG6 adjacent to the control gate lines CG2 and CG5, respectively, the control gate lines CG0 and CG7 adjacent to the control gate lines CG1 and CG6, respectively, and the control gate line CG8 adjacent to the control gate line CG7.

With the eighth embodiment of the present invention, a determination of the threshold voltage can be made for only a read-out memory cell transistor I, when two control gate lines CG3 and CG4 disposed on both sides of the memory cell transistor I are made to have a same read-out voltage $V_{wl}$. When a different combination of potentials from the read-out voltage $V_{wl}$ is given for two control gate lines CG3 and CG4, the memory cell transistor I are made to be turned on to a conductive state, irrelevant to the stored data in the memory cell transistor I. To read out from the NAND EEPROM, the memory cell transistors other than the memory cell transistors selected in the above manner must be on. A sufficient electric charge must be supplied to the diffusion layer regions 18 in order to obtain a sufficient cell electric current. With the conventional structure, electric charges have been supplied by injecting an impurity into the diffusion layer regions 18. However, ensuring-cell electric current and degradation in the short channel effect due to the diffusion of impurities conflict with each other relative to miniaturization levels. According to the eighth embodiment of the present invention, since capacitive coupling $C_d$ exists between each control gate CG and diffusion layer region-18, inversion of the diffusion layer region 18 below the control gate CG may be supplemented by supplying the potential to the unselected control gate lines. Accordingly, electric charge may be supplied only during read-out and only in the scope of control of the control gates CG.

The thickness of the insulating film formed between the semiconductor substrate and the control gates CG, and the potential of the unselected control gates CG during read-out are set so as to meet the following conditions. In other words, thickness and potential are preferably set so as to control degradation in the short channel effect for the memory cell transistors by controlling the amount of impurity to be injected into the diffusion layer regions 18, and obtaining a desired cell electric current by applying an appropriate potential to the control gates CG during read-out.

NINTH EMBODIMENT

Another read-out method for a nonvolatile semiconductor memory according to a ninth embodiment of the present invention is described.

(Read-Out Method)

Another read-out method for a NAND flash EEPROM with NAND cells configured from, for example, eight memory cell transistors connected in series, in which a single memory cell transistor is read out by applying the same high voltage pulse to two adjacent control gates in a cell array, is described.

Figure 16:
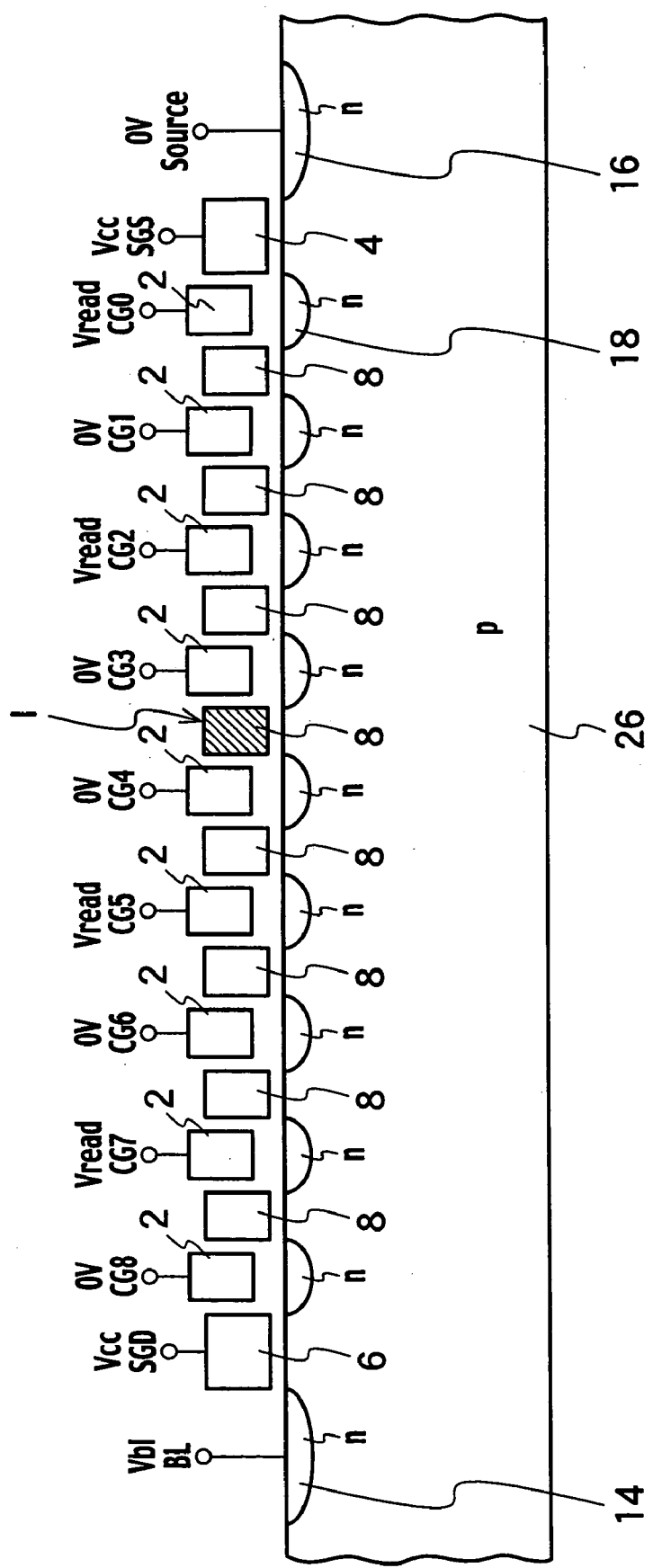
FIG. 16 is a schematic cross-sectional diagram for describing another read-out method for a nonvolatile semiconductor memory according to a ninth embodiment of the present invention.

According to the read-out method for the nonvolatile semiconductor memory of the ninth embodiment of the present invention, bias conditions as shown in FIG. 16 are used. In FIG. 16, a read-out voltage $V_{wl}$ is applied to the control gate lines CG3 and CG4, which are adjacent to the floating gate 8 (FG3, 4) of the read-out memory cell transistor I. The read-out voltage $V_{wl}$ is preferably set to an appropriate potential taking into consideration read-out characteristics, hold characteristics, and operating range of the cell transistor threshold voltage. Based on the assumption of the above Equations (10) and (11), and the read-out voltage $V_{wl}$ set to 0V, a potential of 0 V is applied to the floating gate 8 (FG3, 4) of the read-out memory cell transistor I. In addition, a potential $V_{read}$ for making the cell electric current flow is applied to the control gate lines CG2 and CG5, which are adjacent to the two control gate lines CG3 and CG4 that are adjacent to the read-out memory cell transistor I. A voltage $V_{read}$ is preferably set to an appropriate potential for determining the threshold voltage for the read-out memory cell transistor I by eliminating influence from the unselected memory cell transistors connected to the read-out memory cell transistor I. Furthermore, $V_{wl}$ (0V) is also applied to the control gate lines CG1 and CG6 adjacent to the control gate lines CG2 and CG5, respectively, $V_{readH}$ is also applied to the control gate lines CG0 and CG7 adjacent to the control gate lines CG1 and CG6, respectively, and $V_{wl}$ (0V) is also applied to the control gate line CG8 adjacent to the control gate line CG7.

With the ninth embodiment of the present invention, a determination of the threshold voltage can be made for only a read-out memory cell transistor I, when two control gate lines CG3 and CG4 disposed on both sides of the memory cell transistor I are made to have a same read-out voltage $V_{wl}$ (0V). When a different combination of potentials from the read-out voltage $V_{wl}$ (0V) is given for two control gate lines CG3 and CG4, the memory cell transistor I are made to be turned on to a conductive state, irrelevant to the stored data in the memory cell transistor I. To read out from a NAND EEPROM, the memory cell transistors other than the memory cell transistors selected in the above manner must be on. A sufficient electric charge must be supplied to the diffusion layer regions 18 in order to obtain a sufficient cell electric current. With the conventional structure, electric charges have been supplied by injecting an impurity into the diffusion layer regions 18. However, ensuring cell electric current and degradation of the short channel effect due to the diffusion of impurities conflict with each other relative to miniaturization levels. According to the ninth embodiment of the present invention, since capacitive coupling $C_d$ exists between each control gate CG and diffusion layer region 18, inversion of the diffusion layer region 18 below the control gate CG may be supplemented by supplying the potential to the unselected control gate lines. Accordingly, electric charge may be supplied only during read-out and only in the scope of control of the control gates CG.

The thickness of the insulating film formed between the semiconductor substrate and the control gates CG, and the potential of the unselected control gates CG during read-out are set so as to meet the following conditions. In other words, the thickness and potential are preferably set so as to control degradation in the short channel effect for the memory cell transistor by controlling the amount of impurity to be injected into the diffusion layer region 18, and obtaining a desired cell electric current by applying an appropriate potential to the control gates CG during read-out.

TENTH EMBODIMENT

An erasure method for a nonvolatile semiconductor memory according to a tenth embodiment of the present invention is described.

(Block Erasure Mode)

Figure 17:
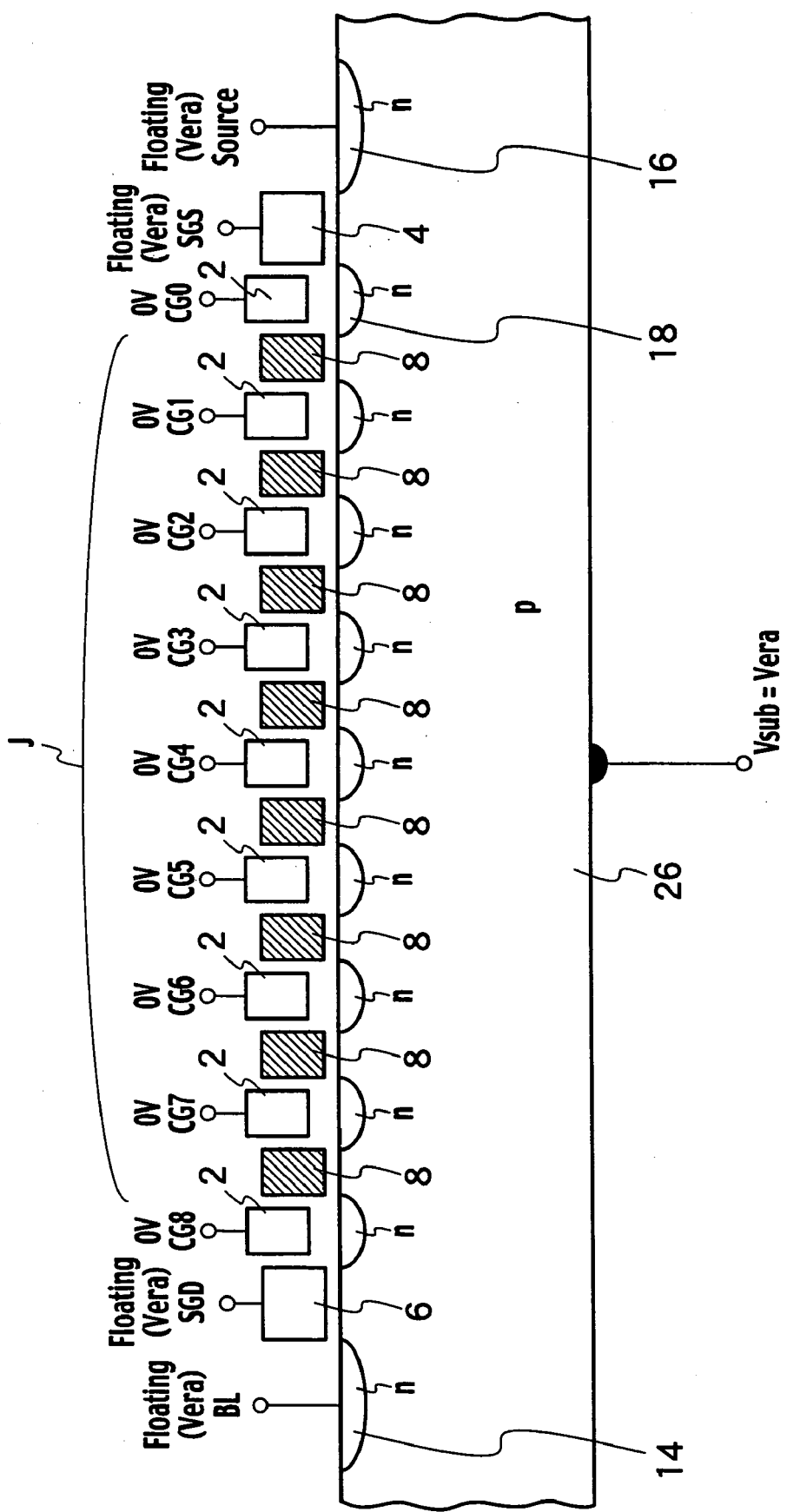
FIG. 17 is a schematic cross-sectional diagram for describing an erasure method for a selected block in a nonvolatile semiconductor memory according to a tenth embodiment of the present invention.

A block erasure method for a NAND flash EEPROM with NAND cells configured from, for example, eight memory cell transistors connected in series, in which a single memory cell transistor is written by applying the same high voltage pulse to two adjacent control gates in a cell, is described. According to the block erasure method for the nonvolatile semiconductor memory of the tenth embodiment of the present invention, bias conditions as shown in FIG. 17 for a selected block are used, and bias conditions shown in FIG. 18 for unselected blocks are used.

Figure 20A:
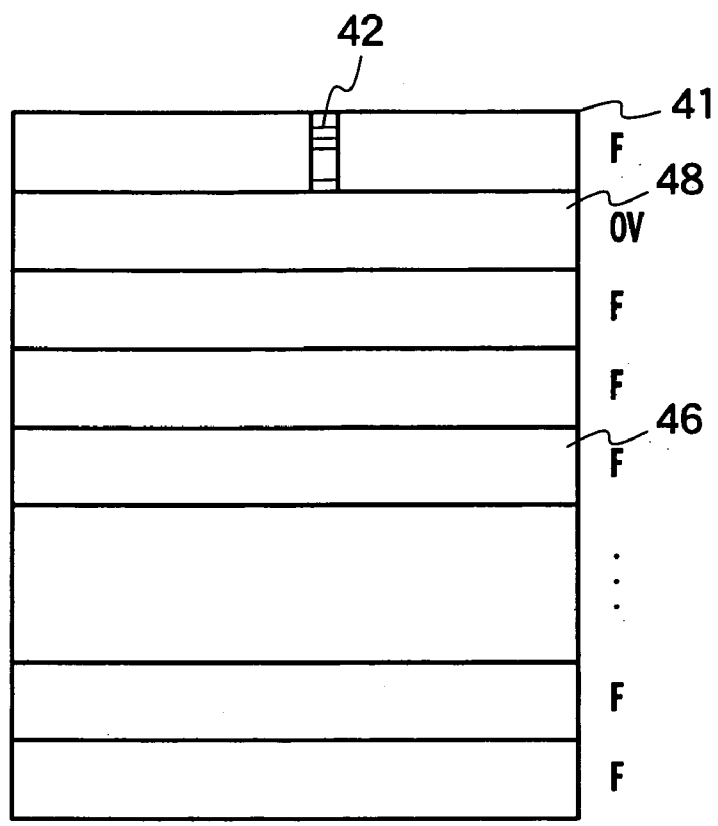
FIG. 20A is a diagram for describing a NAND column arrangement in the nonvolatile semiconductor memory according to an embodiment of the present invention.

It should be noted that a memory cell array 41 of the nonvolatile semiconductor memory of the first through the tenth embodiment of the present invention, as shown in FIG. 20A, has a block structure where NAND memory cell units 42 are horizontally arranged, sets only a selected block 48 to 0V and also sets unselected blocks 46 to a floating state, indicated by F, for block erasure.

The selected block 48, as shown in FIG. 17 to FIG. 20A, includes as to-be-erased memory cell transistor J all memory cell transistors within the NAND memory cell unit 42 from floating gate FG0, 1, which is sandwiched between the control gates CG0 and CG1, to floating gate FG7, 8, which is sandwiched between the control gates CG7 and CG8. In addition, in FIG. 17, a voltage to be applied to each control gate line CG0 to CG8 and the select gate lines SGD and SGS indicates the voltage for erasing data. When erasing data, substrate voltage $V_{sub}$ of the semiconductor substrate 26 on which the memory cell, transistors are arranged is boosted to erasure voltage $V_{era}$. Furthermore, a sufficiently low voltage, for example 0V, is supplied to the control gate lines CG1, CG2, . . . adjacent to the to-be-erased cell. Electric charges are then removed from the floating gates 8 to the boosted semiconductor substrate 26, thereby erasing data.

Figure 18:
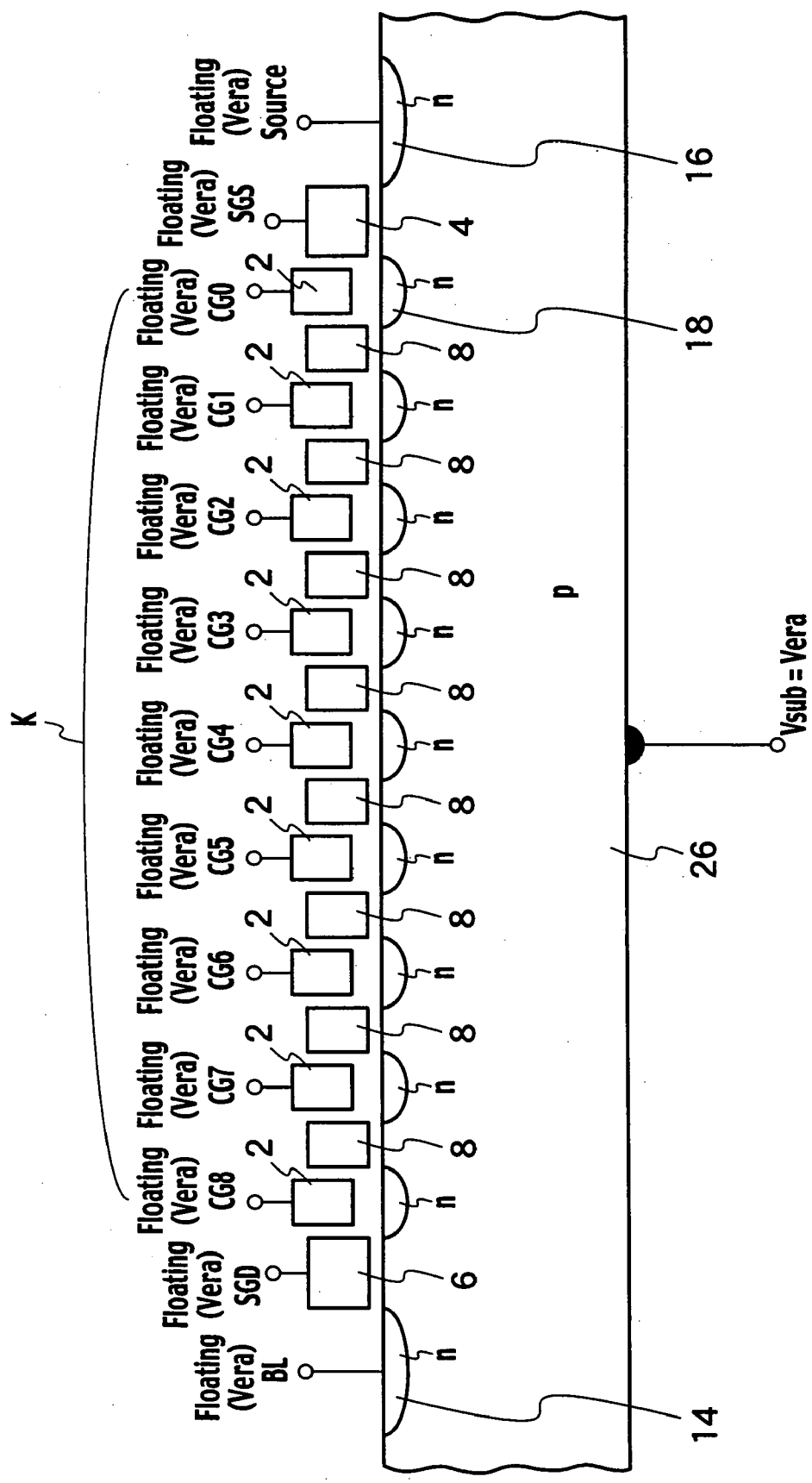
FIG. 18 is a schematic cross-sectional diagram for describing the operation of an unselected block in the nonvolatile semiconductor memory according to the tenth embodiment of the present invention.

The unselected blocks, as shown in the example of FIG. 18, includes as un-erased memory cell transistor K all memory cell transistors within a NAND memory cell unit from the floating gate FG, 1, which is sandwiched between the control gates CG0 and CG1, to the floating gate FG7, 8, which is sandwiched between the control gates CG7 and CG8. In addition, in FIG. 18, a voltage to be applied to each control gate line CG0 to CG8 and the select gate lines SGD and SGS indicates the voltage for not erasing data. When not erasing data, control gates CG of memory cell transistors not to be erased enter a floating state. By such process, the erasure voltage $V_{era}$ for the semiconductor substrate 26 is boosted to the voltage $V_{cg}$ of the control gate CG due to capacitive coupling with the semiconductor substrate 26, thereby controlling data erasure.

With the tenth embodiment of the present invention, there is no influence from potential fluctuation of the select gate lines SGS and SGD due to the sidewall control gate structure in which both side surfaces of all the memory cell transistors to have data erased are surrounded by the control gates 2. In addition, the select gate lines SGS and SGD are preferably set to appropriate gate measurements or structure such that an excessive electric field due to the capacitive coupling with the adjacent control gate lines CG0 and CG8 is not impressed on the first gate insulating films 30.

According to the tenth embodiment of the present invention, data can be reliably erased in the nonvolatile semiconductor memory having the sidewall control gate memory cell transistor structure.

ELEVENTH EMBODIMENT

Another erasure method for a nonvolatile semiconductor memory according to an eleventh embodiment of the present invention is described.

(Page Erasure Mode)

A page erasure method for a NAND flash EEPROM with NAND cells configured from, for example, eight memory cell transistors connected in series, in which a single memory cell transistor is written by applying the same high voltage pulse to two adjacent control gates in a cell array, is described.

Figure 19:
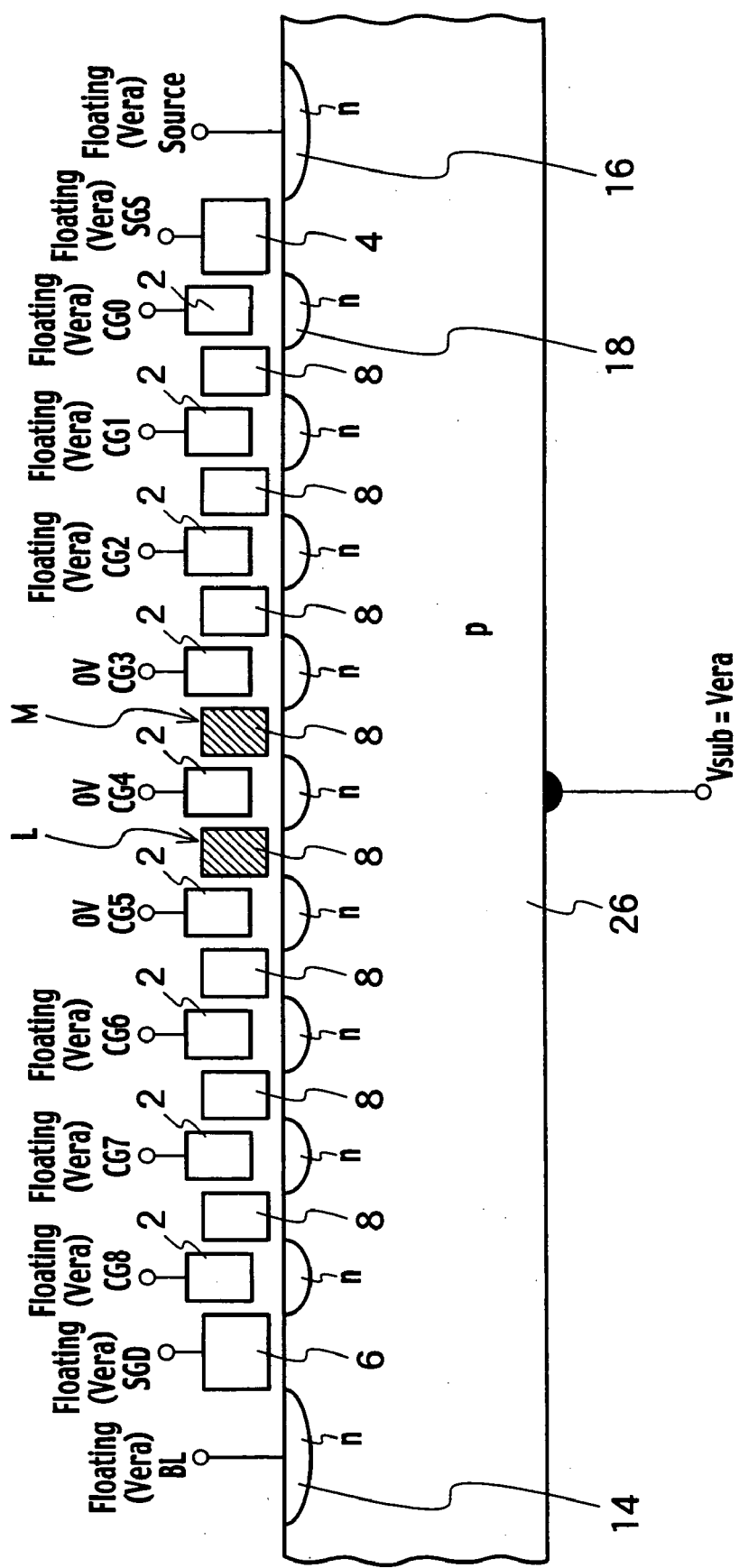
FIG. 19 is a schematic cross-sectional diagram for describing a page erasure method for a nonvolatile semiconductor memory according to an eleventh embodiment of the present invention.

According to the page erasure method for the nonvolatile semiconductor memory of the eleventh embodiment of the present invention, bias conditions shown in FIG. 19 for a selected page region 44 are used, and the same bias conditions as shown in FIG. 18, that is, a floating state for unselected blocks are used.

Figure 20B:
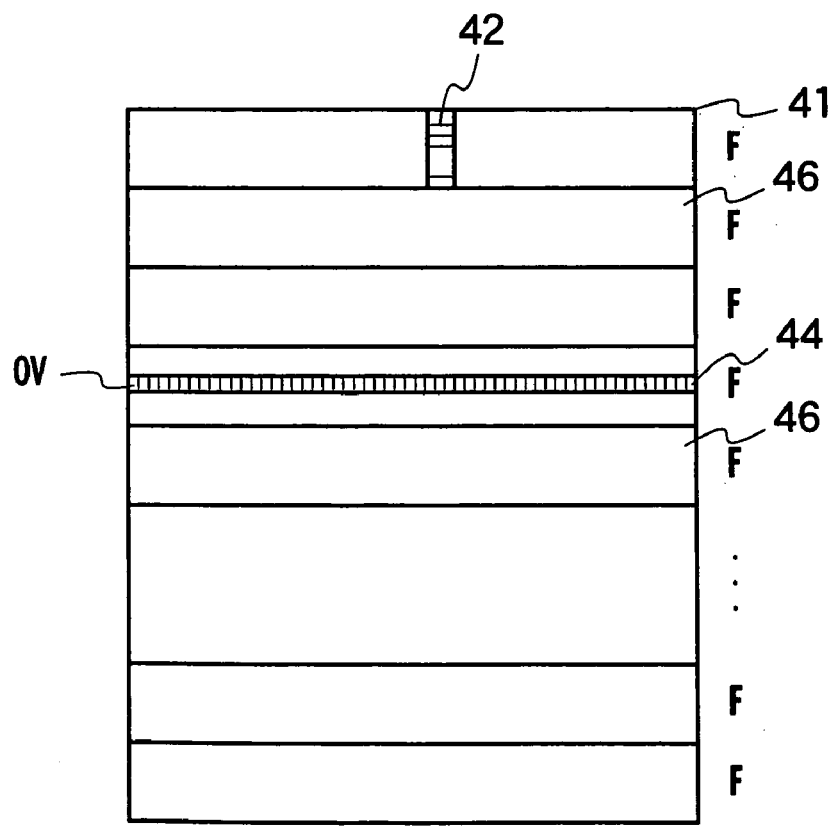
FIG. 20B is a diagram for describing the arrangement of a page region for the NAND column.

It should be noted that the memory cell array 41 of the nonvolatile semiconductor memory of the first through the tenth embodiment of the present invention, as shown in FIG. 20B, has a block structure where the NAND memory cell units 42 are horizontally arranged, wherein only two control gate lines relating to the selected page region 44 are set to 0V, and the other control gate lines and the unselected blocks 46 are set to a floating state indicated by F.

In the example given in FIG. 19, the selected page region may be considered as two pages. One page may naturally be selected. Furthermore, a plurality of pages such as two pages or four pages may be selected simultaneously. It should be noted that the control gate lines CG3, CG4 and CG5 related to such selected page, as is also apparent from the schematic diagram in FIG. 20B, are connected in common to the control gates of the memory cell transistors horizontally arranged to configure the NAND memory cell unit 42, forming the page region 44.

As is apparent from FIG. 19, the memory cell transistors of the nonvolatile semiconductor memory according to the eleventh embodiment of the present invention requires at least two control gate lines when selecting a single page since the memory cell transistor has a sidewall control gate structure.

Memory cell transistors of the floating gate 8 (FG3, 4), which is sandwiched between the control gates CG3 and CG4, and the floating gate 8 (FG4, 5) which is sandwiched between the control gates CG4 and CG5, are shown in FIG. 19 as to-be-erased memory cell transistors L and M. In addition, in FIG. 19, the relationship between the voltages to be applied to each control gate line CG3, CG4 and CG5 indicates voltages for erasing data. When erasing data, substrate voltage $V_{sub}$ for the semiconductor substrate 26 on which the memory cell transistors are arranged is boosted to erasure voltage $V_{era}$. Furthermore, a sufficiently low voltage, for example 0V, is supplied to the control gate lines CG3, CG4 and CG5 adjacent to the to-be-erased cell. Electric charges are then removed from the floating gates 8 (FG3, 4 and FG4, 5) to the boosted semiconductor substrate 26, thereby erasing data.

The unselected blocks, as shown in the example of FIG. 18, include as un-erased memory cell transistor K all memory cell transistors within a NAND memory cell unit from the floating gate FG0, 1, which is sandwiched between the control gates CG0 and CG1, to the floating gate FG7, 8, which is sandwiched between the control gates CG7 and CG8. In addition, in FIG. 18, the voltage to be applied to each control gate line CG0 to CG8 and the select gate lines SGD and SGS indicates the voltage when not erasing data. In the case of not erasing data, control gates CG of memory cell transistors not to be erased enter a floating state. By doing as such, the erasure voltage $V_{era}$ for the semiconductor substrate 26 is boosted to the control gate CG voltage $V_{cg}$ due to capacitive coupling with the semiconductor substrate 26, thereby controlling data erasure.

Since the structure of the memory cell transistors in the eleventh embodiment of the present invention is a sidewall control gate structure, the memory cell transistors corresponding to the page in which data is to be erased is not influenced from potential fluctuation of the select gate lines SGS and SGD due to an effectively shielded structure in which both side surfaces are surrounded by the control gates 2. In addition, the select gate lines SGS and SGD are preferably set to an appropriate gate size or structure such that an excessive electric field due to the capacitive coupling with the adjacent control gate lines CG0 and CG8 is not impressed on the first gate insulating films 30.

According to the eleventh embodiment of the present invention, data can be reliably erased in the nonvolatile semiconductor memory having the sidewall control gate memory cell transistor structure.

TWELFTH EMBODIMENT

A nonvolatile semiconductor memory or NAND flash EEPROM with NAND cells configured from, for example, sixteen memory cell transistors connected in series, in which a single memory cell transistor is written by applying the same high voltage pulse to two adjacent control gates in a cell array, characterized by a write-in operation method, is described.

Figures 21A, 21B:
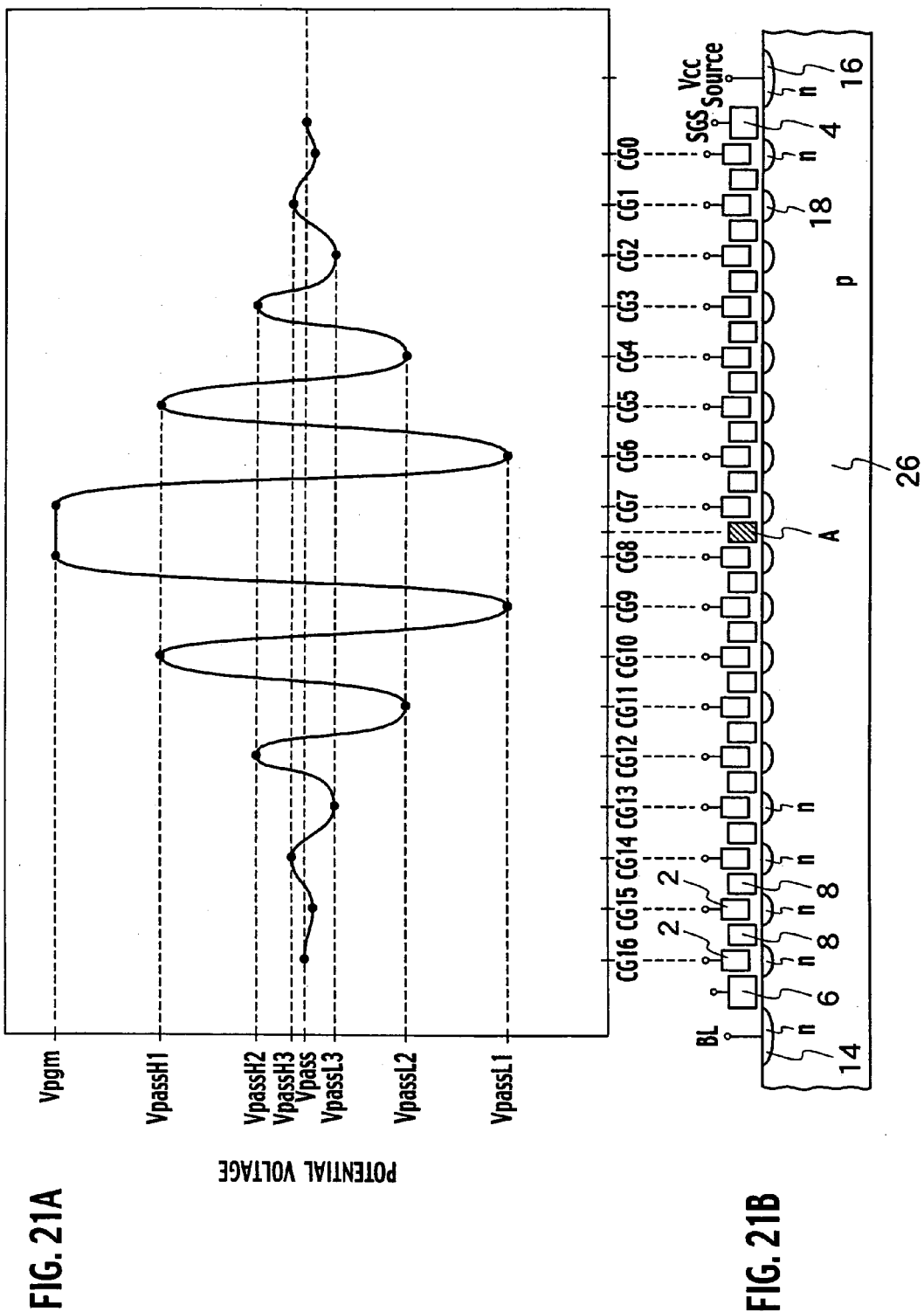

A nonvolatile semiconductor memory according to a twelfth embodiment of the present invention is characterized by voltage pulses applied to control gate lines CG0 to CG16 as shown in FIG. 21. In other words, in FIG. 21A, the vertical axis represents the potential of the pulse voltages applied to the control gate lines, and the horizontal axis shows the locations of the control gates CG. In addition, FIG. 21B shows a corresponding schematic cross-sectional device diagram.

A first voltage application method, which is used for a write-in method for a nonvolatile semiconductor memory according to the twelfth embodiment of the present invention that includes the step of applying the same high voltage pulse to two adjacent control gates in a memory cell array so as to write in a single memory cell transistor A, applies oscillating voltage pulses, as shown in FIG. 21A. In other words, a high write-in voltage $V_{pgm}$ is applied to the control gate lines CG7 and CG8 on both sides of the write-in memory cell transistor A, which corresponds to the floating gate 8 (FG7, 8). A low intermediate voltage $V_{passL1}$ is applied to the control gate lines CG6 and CG9, which are adjacent to the control gate lines CG7 and CG8. Furthermore, a high intermediate voltage $V_{passH1}$ is applied to the control gate lines CG5 and CG10, which are adjacent to the control gate lines CG6 and CG9. Furthermore, a low intermediate voltage $V_{passL2}$ higher than $V_{passL1}$ is applied to the control gate linens CG4 and CG11, which are adjacent to the control gate lines CG5 and CG10. A high intermediate voltage $V_{passH1}$ lower than $V_{passH1}$ is applied to the control gate lines CG3 and CG12, which are adjacent to the control gate lines CG4 and CG11. Furthermore, a low intermediate voltage $V_{passL3}$ higher than $V_{passL2}$ is applied to the control gate lines CG2 and CG13, which are adjacent to the control gate lines CG3 and CG12. A high intermediate voltage $V_{passH3}$ lower than $V_{passH2}$ is applied to the control gate lines CG1 and CG14, which are adjacent to the control gate lines CG2 and CG13. By applying such oscillating voltage pulses to the write-in memory cell transistor A, the same potential may be applied to the floating gates of all the unselected memory cell transistors, and a write-in operation with good erroneous write-in resistance may be performed.

An example of sixteen NAND cells having a sidewall control gate memory cell transistor structure is given in the twelfth embodiment shown in FIG. 21; however, the number of memory cell transistors connected to the NAND cell unit is not limited to sixteen, and may naturally be thirty-two, sixty-four or one hundred twenty-eight, for example. It should be noted that the application method of oscillating pulse voltages given in the twelfth embodiment may also be applied to the SB write-in method described in the second embodiment.

THIRTEENTH EMBODIMENT

A nonvolatile semiconductor memory or NAND flash EEPROM with NAND cells configured from, for example, sixteen memory cell transistors connected in series, in which a single memory cell transistor is written by applying the same high voltage pulse to two adjacent control gates in a cell array, characterized by a write-in operation method, is described.

Figures 22A, 22B:
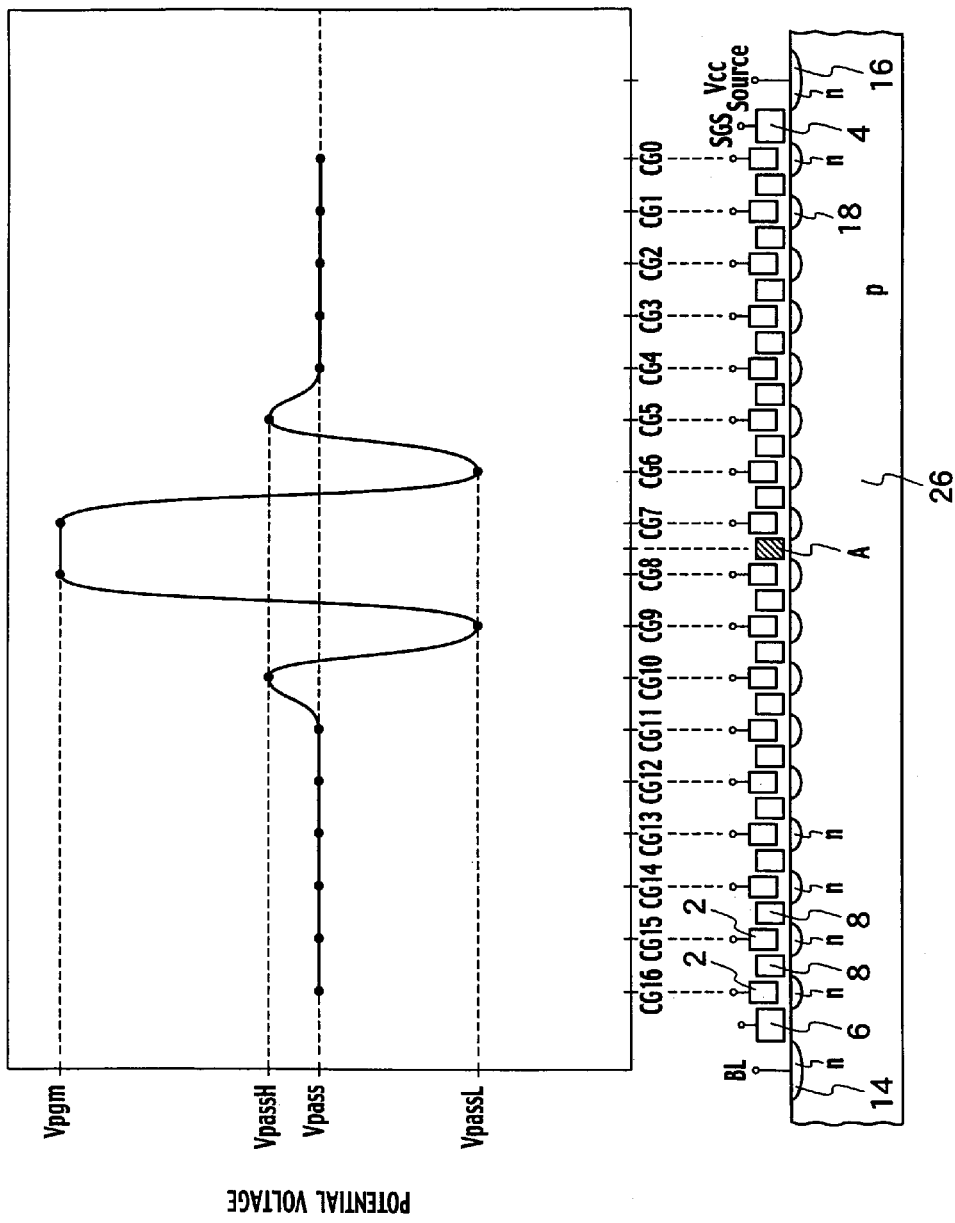

A nonvolatile semiconductor memory according to a thirteenth embodiment of the present invention is characterized by voltage pulses applied to control gate lines CG0 to CG16 as shown in FIG. 22. In other words, in FIG. 22A, the vertical axis represents the potential of the pulse voltage applied to the control gate lines, and the horizontal axis shows the locations of the control gates CG. In addition, FIG. 22B shows a corresponding schematic cross-sectional device diagram.

A second voltage application method, which is used for a write-in method for a NAND flash EEPROM according to the thirteenth embodiment of the present invention that includes the step of applying the same high voltage pulse to two adjacent control gates in a memory cell array so as to write in a single memory cell transistor A, applies oscillating voltage pulses, as shown in FIG. 22A. In other words, a high write-in voltage $V_{pgm}$ is applied to the control gate lines CG7 and CG8 on both sides of the write-in memory cell transistor A, which corresponds to the floating gate 8 (FG7, 8) A low intermediate voltage $V_{passL}$ is applied to the control gate lines CG6 and CG9, which are adjacent to the control gate lines CG7 and CG8. Furthermore, a high intermediate voltage $V_{passH}$ is applied to the control gate lines CG5 and CG10, which are adjacent to the control gate lines CG6 and CG9. Furthermore, the so-called intermediate voltage $V_{pass}$ is applied to the control gate lines CG4 and CG11, which are adjacent to the control gate lines CG5 and CG10. The difference from the twelfth embodiment is that application of oscillating pulse voltages within the range of control gate lines relatively near the write-in memory cell transistor A are suspended.

By applying several cycles or less of such oscillating voltage pulses to the write-in memory cell transistor A, the same potential may be relatively simply applied to the floating gates of all the unselected memory cell transistors, and a write-in operation with good erroneous write-in resistance may be performed.

It should be noted that the second voltage application method for oscillating pulse voltages given in the thirteenth embodiment may also be applied to the SB write-in method described in the second embodiment and the LSB write-in method described in the third embodiment.

FOURTEENTH EMBODIMENT

A nonvolatile semiconductor memory or NAND flash EEPROM with NAND cells configured from, for example, sixteen memory cell transistors connected in series, in which a single memory cell transistor is written by applying the same high voltage pulse to two adjacent control gates in a cell array, characterized by a write-in operation method, is described.

Figure 23A:
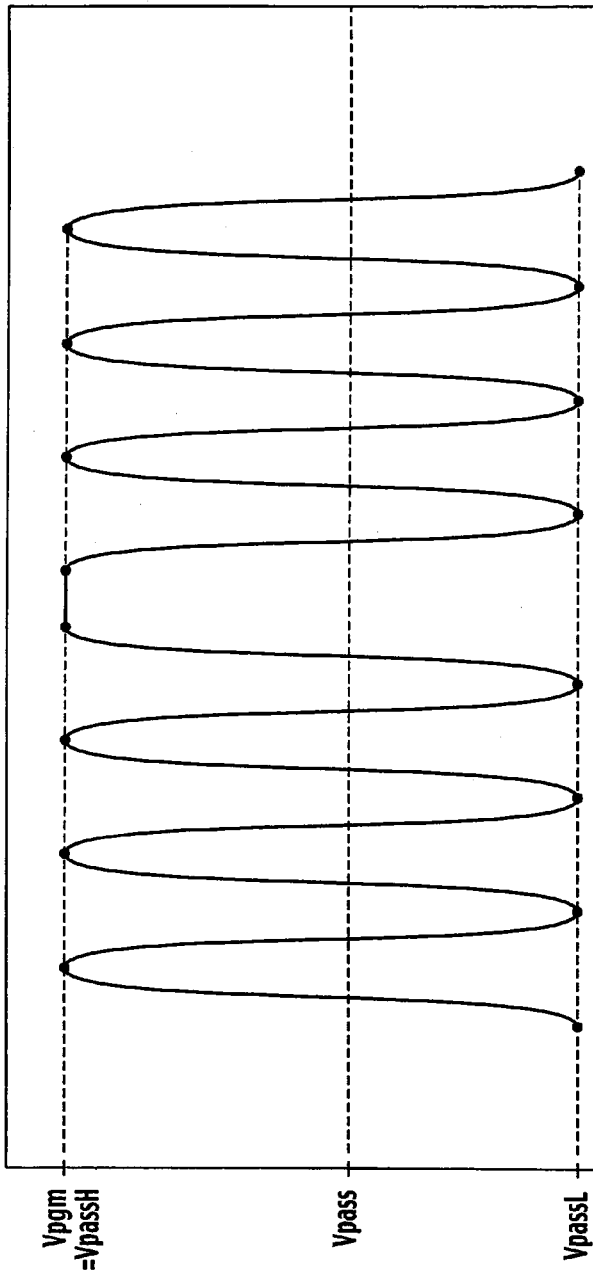
Figure 23B:
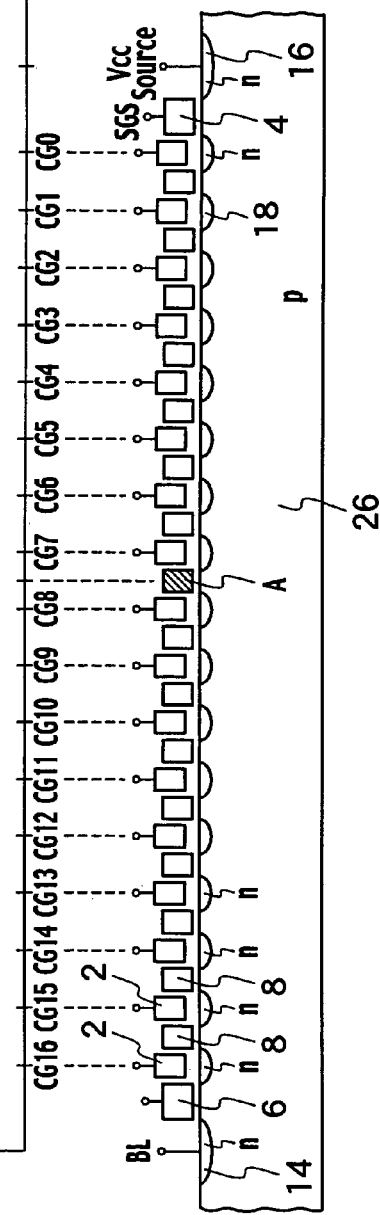
FIG. 23B is a cross-sectional device diagram corresponding to FIG. 23A.

A nonvolatile semiconductor memory according to a fourteenth embodiment of the present invention is characterized by voltage pulses applied to the control gate lines CG0 to CG16 as shown in FIG. 23. In other words, in FIG. 23A, the vertical axis represents the potential of the pulse voltage applied to the control gate lines, and the horizontal axis shows the locations of the control gates CG. In addition, FIG. 23B shows a corresponding schematic cross-sectional device diagram.

A third voltage application method used for a write-in operation for a nonvolatile semiconductor memory according to the fourteenth embodiment of the present invention includes the step of applying the same high voltage pulse to two adjacent control gates in a memory cell array so as to write in a single memory cell transistor A. The method successively applies oscillating voltage pulses, as shown in FIG. 23A. In other words, a high write-in voltage $V_{pgm}$ is applied to the control gate lines CG7 and CG8 on both sides of the write-in memory cell transistor A, which correspond to the floating gate 8 (FG7, 8). A low intermediate voltage $V_{passL}$ is applied to the control gate lines CG6 and CG9, which are adjacent to the control gate lines CG7 and CG8. Furthermore, a high intermediate voltage $V_{passH}$ equivalent to the write-in voltage $V_{pgm}$ is applied to the control gate lines CG5 and CG10, which are adjacent to the control gate lines CG6 and CG9. Furthermore, a low intermediate voltage $V_{passL}$ is applied to the control gate lines CG4 and CG11, which are adjacent to the control gate lines CG5 and CG10. Furthermore, a high intermediate voltage $V_{passH}$ is applied to the control gate lines CG3 and CG12, which are adjacent to the control gate lines CG4 and CG11. Furthermore, a low intermediate voltage $V_{passL}$ is applied to the control gate lines CG2 and CG13, which are adjacent to the control gate lines CG3 and CG12. Furthermore, a high intermediate voltage $V_{passH}$ is applied to the control gate lines CG1 and CG14, which are adjacent to the control gate lines CG2 and CG13. By applying such oscillating voltage pulses to the write-in memory cell transistor A, an effective data write-in operation may be performed.

It should be noted that the method of successively applying oscillating pulse voltages given in the fourteenth embodiment may also be applied to the SB write-in method described in the second embodiment and the modified example of the LSB write-in method described in the seventh embodiment.

FIFTEENTH EMBODIMENT

A nonvolatile semiconductor memory or NAND flash EEPROM with NAND cells configured from, for example, sixteen memory cell transistors connected in series, in which in a single memory cell transistor is written by applying the same high voltage pulse to two adjacent control gates in a cell array, characterized by a write-in operation method, is described.

Figures 24A, 24B:
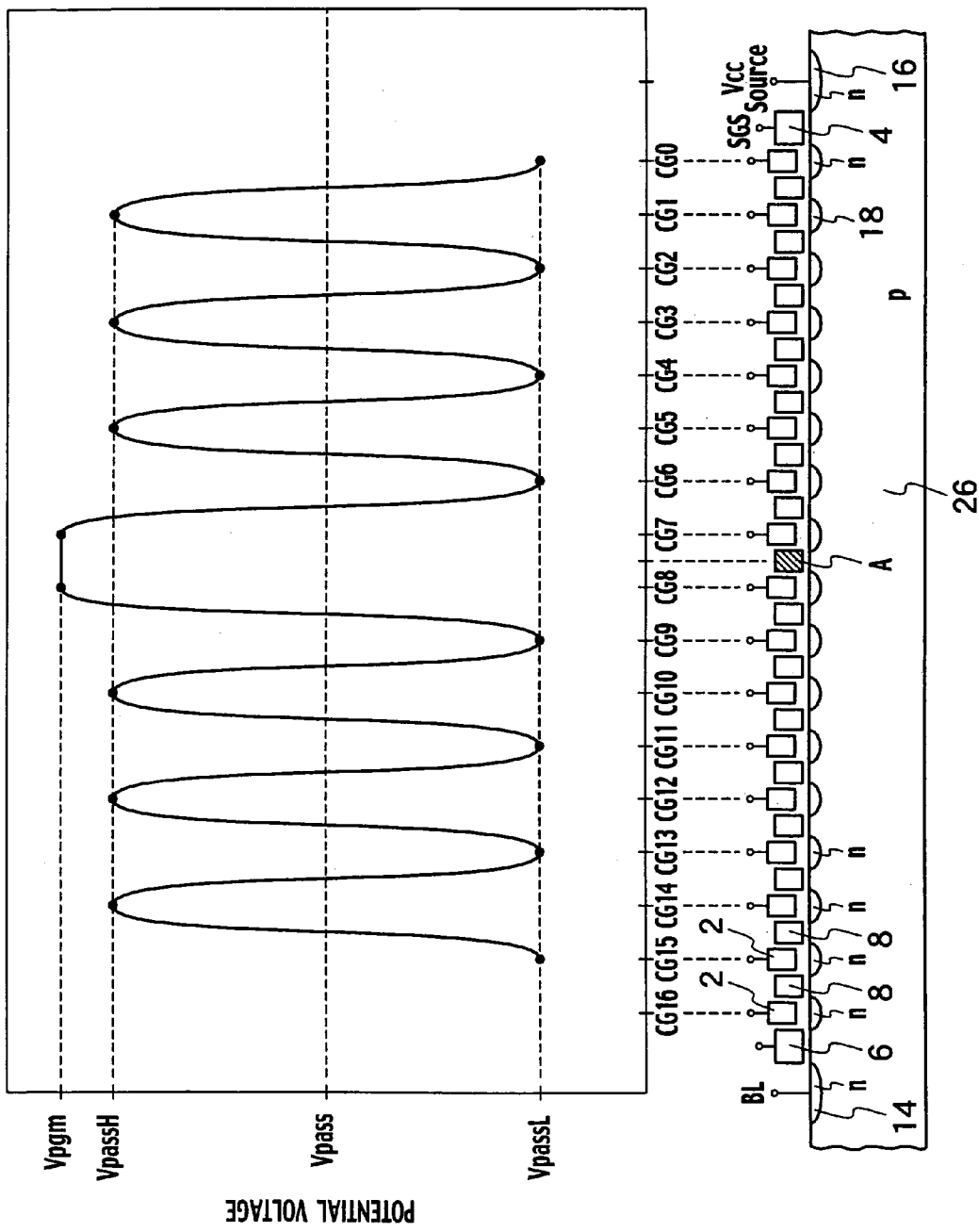

A nonvolatile semiconductor memory according to a fifteenth embodiment of the present invention a is characterized by voltage pulses applied to the control gate lines CG0 to CG16 as shown in FIG. 24. In other words, in FIG. 24A, the vertical axis represents the potential of the pulse voltage applied to the control gate lines, and the horizontal axis shows the locations of the control gates CG. In addition, FIG. 24B shows a corresponding schematic cross-sectional device diagram.

A fourth voltage application method used for a write-in operation for a nonvolatile semiconductor memory according to the fifteenth embodiment of the present invention ncludes the step of applying the same high voltage pulse to two adjacent control gates in a memory cell array so as to write in a single memory cell transistor A. The method successively applies oscillating voltage pulses, as shown in FIG. 24A. In other words, a high write-in voltage $V_{pgm}$ is applied to the control gate lines CG7 and CG8 on both sides of the write-in memory cell transistor A, which corresponds to the floating gate 8 (FG7, 8) A low intermediate voltage $V_{passL}$ is applied to the control gate lines CG6 and CG9, which are adjacent to the control gate lines CG7 and CG8. Furthermore, a high intermediate voltage $V_{passH}$ lower than the write-in voltage $V_{pgm}$ is applied to the control gate lines CG5 and CG10, which are adjacent to the control gate lines CG6 and CG9. Furthermore, a low intermediate voltage $V_{passL}$ is applied to the control gate lines CG4 and CG11, which are adjacent to the control gate lines CG5 and CG10. Furthermore, a high intermediate voltage $V_{passH}$ is applied to the control gate lines CG3 and CG12, which are adjacent to the control gate lines CG4 and CG11. Furthermore, a low intermediate voltage $V_{passL}$ is applied to the control gate lines CG2 and CG13, which are adjacent to the control gate lines CG3 and CG12. Furthermore, a high intermediate voltage $V_{passH}$ is applied to the control gate lines CG1 and CG14, which are adjacent to the control gate lines CG2 and CG13. By successively applying such oscillating voltage pulses to the write-in memory cell transistor A, the same potential may be applied to the floating gates of all the unselected memory cell transistors, and a write-in operation with good erroneous write-in resistance may be performed.

It should be noted that the method for successively applying oscillating pulse voltages given in the fifteenth embodiment may also be applied to the SB write-in method described in the second embodiment and the modified example of the LSB write-in method described in the seventh embodiment.

SIXTEENTH EMBODIMENT

A nonvolatile semiconductor memory or NAND flash EEPROM with NAND cells configured from, for example, sixteen memory cell transistors connected in series, in which a single memory cell transistor is read out by applying the same high voltage pulse to two adjacent control gates in a cell array, characterized by a read-out operation method, is described.

A nonvolatile semiconductor memory according to a sixteenth embodiment of the present invention is characterized by voltage pulses applied to the control gate lines CG0 to CG16 as shown in FIG. 25. In other words, in FIG. 25A, the vertical axis represents the potential of the pulse voltage applied to the control gate lines, and the horizontal axis shows the locations of the control gates CG. In addition, FIG. 25B shows a corresponding schematic cross-sectional device diagram.

A first voltage application method, which is used for a read-out operation method for a nonvolatile semiconductor memory according to the sixteenth embodiment of the present invention includes the step of applying the same high voltage pulse to two adjacent control gates in a memory cell array so as to read out from a single memory cell transistor A. The method applies approximately one cycle of oscillating voltage pulses, as shown in FIG. 25A. In other words, a low voltage $V_{wiL}$ is applied to the control gate lines CG7 and CG8 on both sides of a read-out memory cell transistor A, which corresponds to the floating gate 8 (FG7, 8) A high level read-out voltage $V_{readH}$ is applied to the control gate lines CG6 and CG9, which are adjacent to the control gate lines CG7 and CG8. Furthermore, an intermediate read-out voltage $V_{readM}$ is applied to the control gate lines CG5 and CG10, which are adjacent to the control gate lines CG6 and CG9. Furthermore, a low read-out voltage $V_{readL}$ is applied to the control gate lines CG4 and CG11, which are adjacent to the control gate lines CG5 and CG10. Furthermore, a low read-out voltage $V_{readL}$ is applied to the control gate lines CG4 to CG0 and CG11 to CG16. A characteristic of the sixteenth embodiment is that application of read-out pulse voltages is suspended within the range of control gate lines relatively near the read-out memory cell transistor A corresponding to approximately one cycle of oscillations. By applying approximately one cycle of such oscillating read-out voltage pulses to the read-out memory cell transistor A, the same potential may be applied to the floating gates of all the unselected memory cell transistors, thereby reducing in the read-out voltage. As a result, a read-out operation with good erroneous write-in resistance due to the read-out voltage may be performed.

It should be noted that the first voltage application method for oscillating pulse voltages given in the sixteenth embodiment may also be applied to the read-out methods described in the eighth and the ninth embodiment.

SEVENTEENTH EMBODIMENT

A nonvolatile semiconductor memory or NAND flash EEPROM with NAND cells configured from, for example, sixteen memory cell transistors connected in series, in which a single memory cell transistor is read by applying the same high voltage pulse to two adjacent control gates in a cell array, characterized by a read-out operation method, is described.

Figures 26A, 26B:
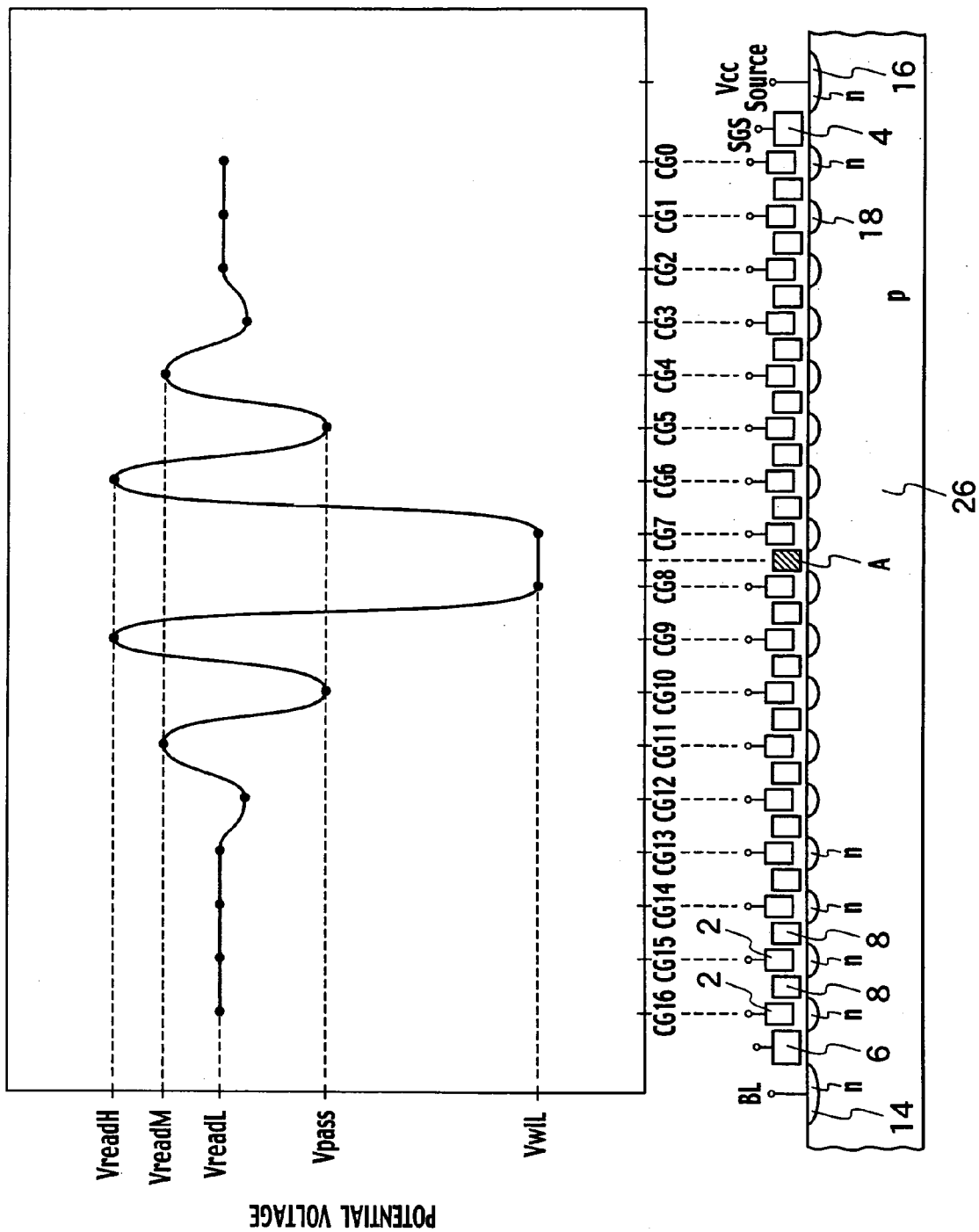
FIG. 26A illustrates a second voltage application method for a nonvolatile semiconductor memory according to a seventeenth embodiment of the present invention, which is used for a read-out method of reading out a single memory cell transistor A that includes the step of applying the same high voltage pulse to two adjacent control gate lines in a memory cell array so as to read out.
FIG. 26B is a cross-sectional device diagram corresponding to FIG. 26A.

A nonvolatile semiconductor memory according to a seventeenth embodiment of the present invention is characterized by voltage pulses applied to the control gate lines CG0 to CG16 as shown in FIG. 26. In other words, in FIG. 26A, the vertical axis represents the potential of the pulse voltage applied to the control gate lines, and the horizontal axis shows the locations of the control gates CG. In addition, FIG. 26B shows a corresponding schematic cross-sectional device diagram.

A second voltage application method, which is used for a read-out operation method for a nonvolatile semiconductor memory according to the seventeenth embodiment of the present invention includes the step of applying the same high voltage pulse to two adjacent control gates in a memory cell array so as to read out from a single memory cell transistor A. The method applies several cycles of oscillating voltage pulses, as shown in FIG. 26A. In other words, a low voltage $V_{wlL}$ is applied to the control gate lines CG7 and CG8 on both sides of a read-out memory cell transistor A, which corresponds to the floating gate 8 (FG7, 8). A high level read-out voltage $V_{readH}$ is applied to the control gate lines CG6 and CG9, which are adjacent to the control gate lines CG7 and CG8. Furthermore, the so-called intermediate voltage $V_{pass}$ is applied to the control gate lines CG5 and CG10, which are adjacent to the control gate lines CG6 and CG9. Furthermore, an intermediate read-out voltage $V_{readM}$ is applied to the control gate lines CG4 and CG11, which are adjacent to the control gate lines CG5 and CG10. A read-out voltage higher than intermediate voltage $V_{pass}$ and lower than $V_{readL}$ is applied to the control gate lines CG3 and CG12, which are adjacent to the control gate lines CG4 and CG11. Furthermore, a low read-out voltage $V_{readL}$ is applied to the control gate lines CG2 and CG13, which are adjacent to the control gate lines CG3 and CG12. Furthermore, a low read-out voltage $V_{readL}$ is applied to the control gate lines CG1 to CG0 and CG14 to CG15.

A characteristic of the seventeenth embodiment is that application of read-out pulse voltages is suspended within the range of control gate lines relatively near the read-out memory cell transistor A corresponding to several cycles of oscillations. By applying approximately several cycles of such oscillating read-out voltage pulses to the read-out memory cell transistor A, an effective data read-out operation may be performed relatively simply.

It should be noted that the second voltage application method for oscillating pulse voltages given in the seventeenth embodiment may also be applied to the read-out methods described in the eighth and the ninth embodiment.

EIGHTEENTH EMBODIMENT

A nonvolatile semiconductor memory or NAND flash EEPROM with NAND cells configured from, for example, sixteen memory cell transistors connected in series, in which a single memory cell transistor is read by applying the same high voltage pulse to two adjacent control gates in a cell array, characterized by a read-out operation method, is described.

Figures 27A, 27B:
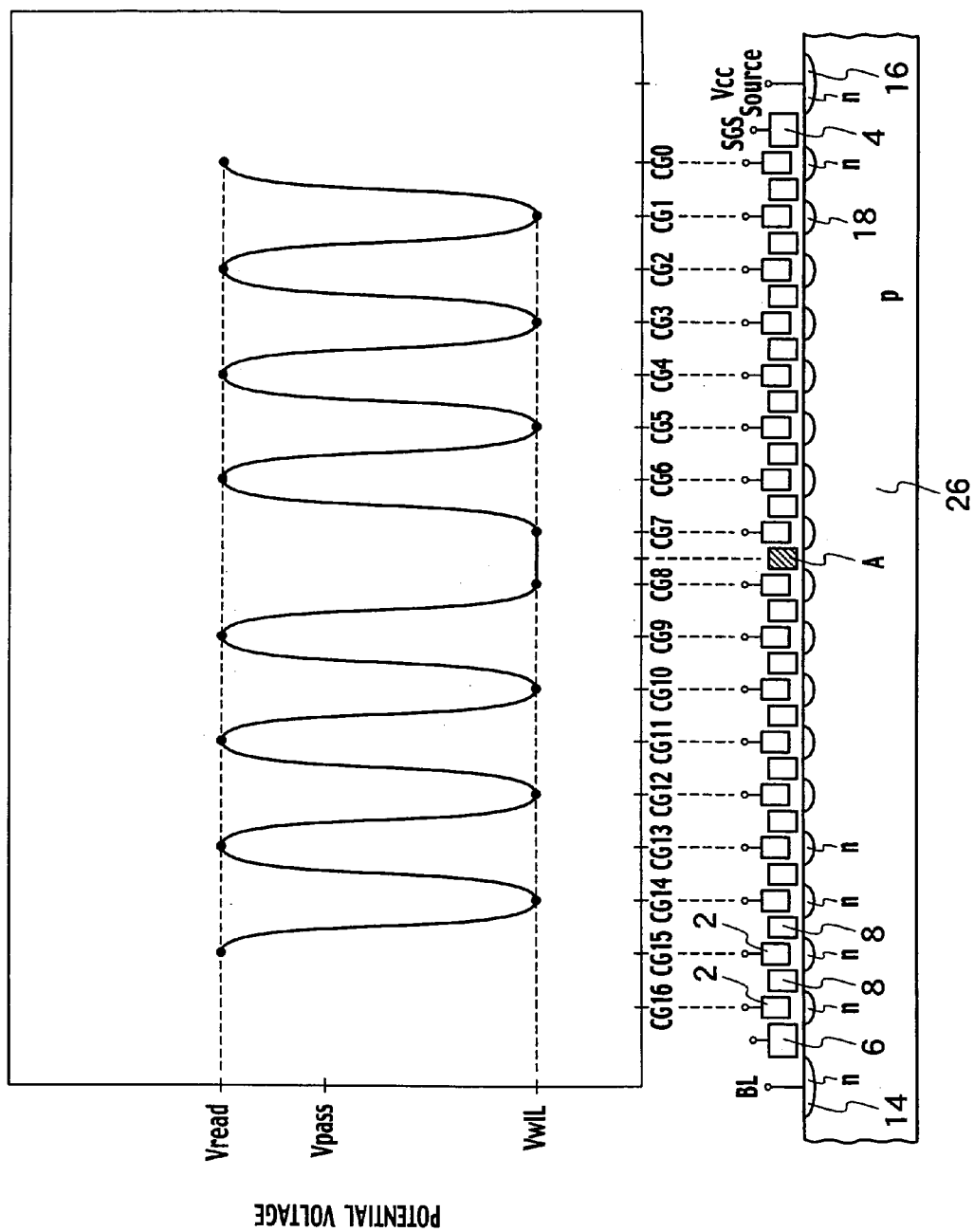
FIG. 27A illustrates a third voltage application method for a nonvolatile semiconductor memory according to an eighteenth embodiment of the present invention, which is used for a read-out method of reading out a single memory cell transistor A that includes the step of applying the same high voltage pulse to two adjacent control gates in a memory cell array so as to read out.
FIG. 27B is a cross-sectional device diagram corresponding to FIG. 27A.

A nonvolatile semiconductor memory according to an eighteenth embodiment of the present invention is characterized by voltage pulses applied to the control gate lines CG0 to CG16 as shown in FIG. 27. In other words, in FIG. 27A, the vertical axis represents the potential of the pulse voltage applied to the control gate lines, and the horizontal axis shows the locations of the control gates CG. In addition, FIG. 27B shows a corresponding schematic cross-sectional device diagram.

A third voltage application method used for a read-out operation for a nonvolatile semiconductor memory according to the eighteenth embodiment of the present invention includes the step of applying the same high voltage pulse to two adjacent control gates in a memory cell array so as to read out from a single memory cell transistor A. The method successively applies oscillating voltage pulses, as shown in FIG. 27A. In other words, a low read-out voltage $V_{wlL}$ is applied to the control gate lines CG7 and CG8 on both sides of the read-out memory cell transistor A, which corresponds to the floating gate 8 (FG7, 8). A read-out voltage $V_{read}$ higher than intermediate voltage $V_{pass}$ is applied to the control gate lines CG6 and CG9, which are adjacent to the control gate lines CG7 and CG8. Furthermore, a low read-out voltage $V_{wlL}$ is applied to the control gate lines CG5 and CG10, which are adjacent to the control gate lines CG6 and CG9. Furthermore, read-out voltage $V_{read}$ is applied to the control gate lines CG4 and CG11, which are adjacent to the control gate lines CG5 and CG10. Furthermore, a low read-out voltage $V_{wlL}$ is applied to the control gate lines CG3 and CG12, which are adjacent to the control gate lines CG4 and CG11. Furthermore, read-out voltage $V_{read}$ is applied to the control gate lines CG2 and CG13, which are adjacent to the control gate lines CG3 and CG12. Furthermore, a low read-out voltage $V_{wlL}$ is applied to the control gate lines CG1 and CG14, which are adjacent to the control gate lines CG2 and CG13. Furthermore, read-out voltage $V_{read}$ is applied to the control gate lines CG0 and CG15, which are adjacent to the control gate lines CG1 and CG14.

By successively applying such oscillating voltage pulses to the read-out memory cell transistor A, an effective data read-out operation may be performed. It should be noted that the third voltage application method for oscillating pulse voltages given in the eighteenth embodiment may also be applied to the read-out methods described in the eighth and the ninth embodiment.

NINETEENTH EMBODIMENT

A nonvolatile semiconductor memory or NAND flash EEPROM with NAND cells configured from, for example, sixteen memory cell transistors connected in series, in which a single memory cell transistor is written by applying the same high voltage pulse to two adjacent control gates in a cell array, characterized by a write-in operation method, is described.

Figures 28A, 28B, 28C:
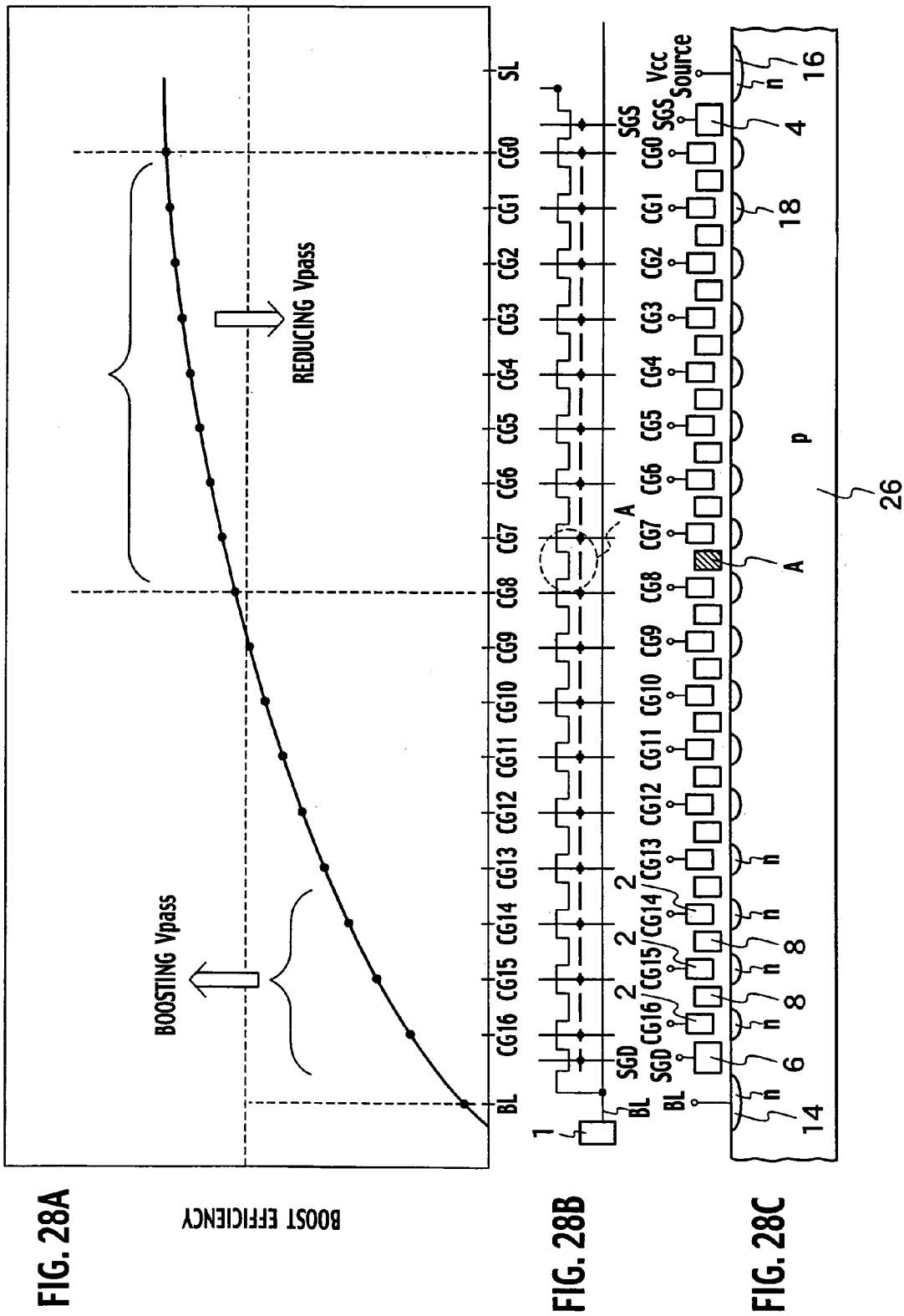
FIG. 28A illustrates boost efficiency of a write-in method that includes the step of sequentially writing in a single memory cell transistor A in a nonvolatile semiconductor memory according to a nineteenth embodiment of the present invention.
FIG. 28B is a circuit diagram corresponding to FIG. 28A.
FIG. 28C is a schematic cross-sectional device diagram corresponding to FIG. 28A.

The nonvolatile semiconductor memory according to the nineteenth embodiment of the present invention is characterized by improved boosting efficiency in the SB sequential write-in method of the sixth embodiment shown in FIG. 12S and FIG. 13. In other words, in the case of implementing the SB sequential write-in method using sixteen NAND cells, the relationship between such boosting efficiency and the locations of the control gate lines CG0 to CG16 are represented as shown in FIG. 28A. FIG. 28B is a circuit diagram of a 16 NAND cell structure of sidewall control gate-type memory cell transistors corresponding to FIG. 28A, and FIG. 28C is a schematic cross-sectional device diagram corresponding to FIG. 28A and FIG. 28B. Boosting the intermediate voltage $V_{pass}$ when writing in memory cell transistors near the bit line BL side, and reducing the intermediate voltage $V_{pass}$ when writing in memory cell transistors near the source line SL side allows an approximately constant boosting efficiency to be maintained.

TWENTIETH EMBODIMENT

Figure 29:
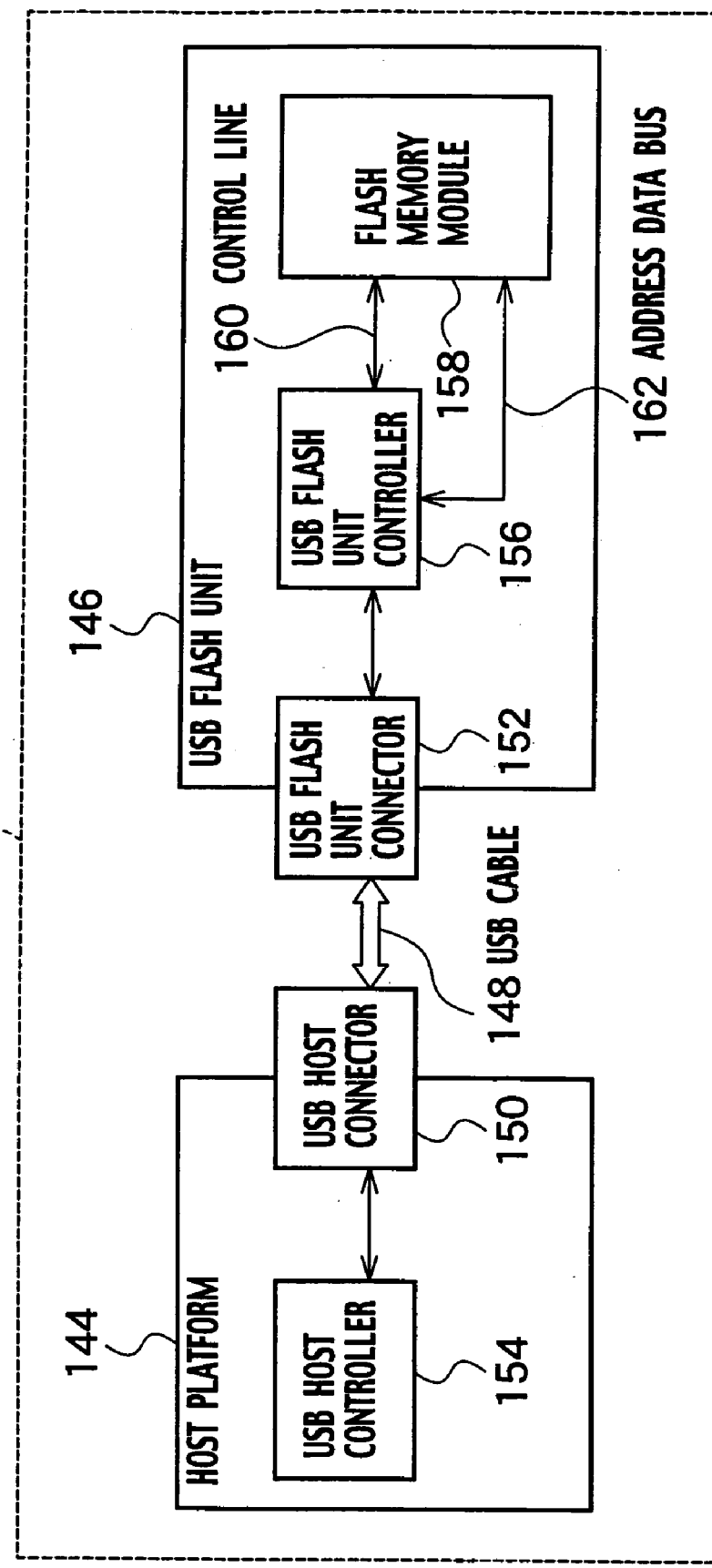
FIG. 29 illustrates an application example of the nonvolatile semiconductor memory according to the first to the nineteenth embodiment of the present invention, and is a twentieth embodiment of the present invention.

FIG. 29 illustrates an application example of a nonvolatile semiconductor memory according to the first to nineteenth embodiments of the present invention as a twentieth embodiment of the present invention. FIG. 29 is a schematic diagram of principal elements of a flash memory and system according to the present invention. As shown in the drawing, a flash memory system 142 is configured with a host platform 144 and a universal serial bus (USB) flash unit 146.

The host platform 144 is connected to the USB flash unit 146 according to the present invention via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 includes a USB flash unit controller 156, which controls other elements in the USB flash unit 146 as well as controls the interface to the USB bus of the USB flash unit 146; the USB flash unit connector 152; and at least one flash memory module 158 configured with the nonvolatile semiconductor memory according to the first to nineteenth embodiments of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer called an end point, which stores transfer data. The host platform 144 recognizes changes in the physical and electrical states such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet through the USB cable 148. If the USB flash unit 146 is a unit including the end point that has received this request packet, this request is accepted by the USB flash unit controller 156.

Next, the USB flash unit controller 156 performs various operations such as read-in, write-in or erasure of data from or to the flash memory module 158. In addition, the controller supports basic USB functions such as acquiring a USB address and the like. The USB flash unit controller 156 controls the flash memory module 158 via either a control line 160, which is used to control output from the flash memory module 158, or, for example, other various signals such as /CE, a read-out signal or a write-in signal. Furthermore, the flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the result and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148 described above.

The present invention is described according to embodiments, however, it should not be perceived that descriptions forming a part of this disclosure and drawings are intended to limit the spirit and scope of the present invention. Various alternative embodiments, working examples, and operational techniques will become apparent from this disclosure for those skilled in the art. Accordingly, the technical scope of the present invention is determined only by specified features of the invention according to the following claims that can be regarded appropriate from the above-mentioned descriptions.

In addition, the embodiments of the present invention can be modified and implemented in various ways as long as not deviating from the scope of the present invention. It should be noted that each of the above embodiments can be implemented in respective combinations. In this manner, the present invention naturally includes various embodiments not described herein.

According to the present invention, the nonvolatile semiconductor memory, which performs a write-in operation or a read-out operation by applying the same high voltage pulse to two adjacent control gates in a memory cell array, or performs a block erasure operation or a page erasure operation, achieves low power consumption due to decreasing the $V_{pass}$ potential, as well as high speed and high integration-due to employing a NAND EEPROM with a sidewall control gate structure. As a result, wide industrial applicability can exist not only for a memory card and IC card, but for a vehicle system, a hard disk driver, a portable phone, high-speed network modem equipment, and the like.

OTHER EMBODIMENTS

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A semiconductor memory comprising:
a memory cell array having a plurality of memory cell transistor units, each of the units being configured from a plurality of memory cell transistors vertically connected in series, which have a first and a second control gate disposed on both sides of a floating gate, and which are horizontally arranged with a first end connected to a bit line via a first select gate transistor, and a second end connected to a source line via a second select gate transistor, wherein the first and the second control gates of the memory cell transistors arranged in the same row are connected in common to a first and a second control gate line, respectively;
a boosting circuit configured to generate a write-in voltage, different multilevel intermediate voltages, and a bit line voltage from a power source; and
a row decoder supplied with the write-in voltage and the multilevel intermediate voltages to select the first and the second control gate lines and configured to select a first and a second select gate line connected to the respective gates of the first and the second select gate transistors;
wherein,
the row decoder applies a low level read-out voltage to first control gate lines adjacent to a read-out memory cell transistor.

2. The semiconductor memory of claim 1, wherein,
the row decoder applies a high level read-out voltage to second control gate lines adjacent to the first control gate lines, and further applies a low level read-out voltage to third control gate lines adjacent to the second control gate lines.

3. The semiconductor memory of claim 2, wherein,
the row decoder further applies a read-out voltage equivalent to the low level read-out voltage to control gate lines located further on the second end side than the second end side control gate line of the third control gate lines, and further on the first end side than the first end side control gate line of the third control gate lines.

4. The semiconductor memory of claim 1, wherein,
the row decoder applies a low level read out voltage to the first control gate lines of the read-out memory cell transistor, applies a read-out voltage to the second control gate lines adjacent to the first control gate lines, applies a voltage equivalent to the low level read out voltage to third control gate lines further adjacent to the second control gate lines, applies a voltage equivalent to the read-out voltage to fourth control gate lines further adjacent to the third control gate lines, and alternately applies the voltage equivalent to the read-out voltage and the low level voltage on control gate lines that are equi-distant on both sides of the read-out memory cell transistor.

5. A semiconductor memory comprising:
a memory cell array having a plurality of memory cell transistor units, each of the units being configured from a plurality of memory cell transistors vertically connected in series, which have a first and a second control gate disposed on both sides of a floating gate, and which are horizontally arranged with a first end connected to a bit line via a first select gate transistor, and a second end connected to a source line via a second select gate transistor; wherein the first and the second control gates of the memory cell transistors arranged in the same row are connected in common to a first and a second control gate line, respectively;
a boosting circuit configured to generate a write-in voltage, different multilevel intermediate voltages, and a bit line voltage from a power source; and
a row decoder supplied with the write-in voltage and the multilevel intermediate voltages to select the first and the second control gate lines and configured to select a first and a second select gate line connected to respective gates of the first and the second select gate transistors;
wherein,
the row decoder applies a read-out voltage to first control gate lines of a read-out memory cell transistor, applies a higher level read-out voltage than a read-out voltage to second control gate lines adjacent to the first control gate lines, and applies oscillating voltage pulses on control gate lines that are equi-distant on both sides of the read-out memory cell transistor.

6. A semiconductor memory comprising:
a memory cell array having a plurality of memory cell transistor units, each of the units being configured from a plurality of memory cell transistors vertically connected in series, which have a first and a second control gate disposed on both sides of a floating gate, and which are horizontally arranged with a first end connected to a bit line via a first select gate transistor, and a second end connected to a source line via a second select gate transistor, wherein the first and the second control gates of the memory cell transistors arranged in the same row are connected in common to a first and a second control gate line, respectively;
a boosting circuit configured to generate a write-in voltage, different multilevel intermediate voltages, and a bit line voltage from a power source; and
a row decoder supplied with the write-in voltage and the multilevel intermediate voltages to select the first and the second control gate lines and configured to select a first and a second select gate line connected to respective gates of the first and the second select gate transistors;
wherein,
the row decoder applies a read-out voltage to first control gate lines of a read-out memory cell transistor, applies a higher level read-out voltage than a read-out voltage to second control gate lines adjacent to the first control gate lines, and applies oscillating voltage pulses on control gate lines that are equi-distant on both sides of the read-out memory cell transistor.

7. A semiconductor memory comprising:
a memory cell array having a plurality of memory cell transistor units, each of the units being configured from a plurality of memory cell transistors vertically connected in series, which have a first and a second control gate disposed on both sides of a floating gate, and which are horizontally arranged with a first end connected to a bit line via a first select gate transistor, and a second end connected to a source line via a second select gate transistor, wherein the first and the second control gates of the memory cell transistors arranged in the same row are connected in common to a first and a second control gate line, respectively;

a boosting circuit configured to generate a write-in voltage, different multilevel intermediate voltages, and a bit line voltage from a power source; and a row decoder supplied with the write-in voltage and the multilevel intermediate voltages to select the first and the second control gate lines and configured to select a first and a second select gate line connected to respective gates of the first and the second select gate transistors;

wherein, the row decoder applies a voltage from among the plurality of different intermediate voltages to the unselected control gate lines when the location of a selected control gate line is adjacent the bit line, and applies a low voltage from among a plurality of different intermediate voltages to the unselected control gate lines when the location of a selected control gate line is remote from the bit line.

* * * * *